United States Patent
Or-Bach et al.

(10) Patent No.: US 9,892,972 B2
(45) Date of Patent: Feb. 13, 2018

(54) 3D SEMICONDUCTOR DEVICE AND STRUCTURE

(71) Applicant: Monolithic 3D Inc., San Jose, CA (US)

(72) Inventors: Zvi Or-Bach, San Jose, CA (US); Deepak C. Sekar, San Jose, CA (US); Brian Cronquist, San Jose, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

(21) Appl. No.: 15/201,430

(22) Filed: Jul. 2, 2016

(65) Prior Publication Data

US 2017/0092541 A1 Mar. 30, 2017

Related U.S. Application Data

(63) Continuation-in-part of application No. 14/626,563, filed on Feb. 19, 2015, now Pat. No. 9,385,088, which
(Continued)

(51) Int. Cl.
| | |
|---|---|
| *H01L 21/822* | (2006.01) |
| *H01L 45/00* | (2006.01) |
| *H01L 27/115* | (2017.01) |
| *H01L 27/06* | (2006.01) |
| *H01L 27/088* | (2006.01) |

(Continued)

(52) U.S. Cl.
CPC .... *H01L 21/8221* (2013.01); *H01L 21/76254* (2013.01); *H01L 23/367* (2013.01); *H01L 27/0688* (2013.01); *H01L 27/0886* (2013.01); *H01L 27/10802* (2013.01); *H01L 27/10844* (2013.01); *H01L 27/1108* (2013.01); *H01L 27/11524* (2013.01); *H01L 27/11551* (2013.01); *H01L 27/226* (2013.01); *H01L 27/249* (2013.01); *H01L 27/2436* (2013.01); *H01L 27/2481* (2013.01); *H01L 45/04* (2013.01); *H01L 45/16* (2013.01); *H01L 27/085* (2013.01);
(Continued)

(58) Field of Classification Search
None
See application file for complete search history.

(56) References Cited

U.S. PATENT DOCUMENTS

| | | | | |
|---|---|---|---|---|
| 6,429,484 B1 * | 8/2002 | Yu | ....................... | H01L 21/8221 |
| | | | | 257/347 |
| 7,112,815 B2 * | 9/2006 | Prall | ..................... | G11C 16/04 |
| | | | | 257/2 |

(Continued)

OTHER PUBLICATIONS

Shino, Tomoaki, et. al., "Floating Body RAM Technology and Its Scalability to 32nm Node and Beyond." 2006 International Electron Devices Meeting (2006).*
(Continued)

*Primary Examiner* — Joseph Schoenholtz
(74) *Attorney, Agent, or Firm* — Tran & Associates

(57) ABSTRACT

A 3D semiconductor device including: a first structure including first single crystal transistors; a second structure including second single crystal transistors, the second structure overlaying the first single crystal transistors, where at least one of the second single crystal transistors is at least partially self-aligned to at least one of the first single crystal transistors; and at least one thermal conducting path from at least one of the first single crystal transistors and second single crystal transistors to an external surface of the device.

20 Claims, 75 Drawing Sheets

Related U.S. Application Data is a continuation of application No. 14/017,266, filed on Sep. 3, 2013, now abandoned, which is a continuation of application No. 13/099,010, filed on May 2, 2011, now Pat. No. 8,581,349, which is a continuation-in-part of application No. 12/951,913, filed on Nov. 22, 2010, now Pat. No. 8,536,023, which is a continuation-in-part of application No. 12/904,119, filed on Oct. 13, 2010, now Pat. No. 8,476,145, application No. 15/201,430, filed on Jul. 2, 2016, which is a continuation-in-part of application No. 13/016,313, filed on Jan. 28, 2011, now Pat. No. 8,362,482, which is a continuation-in-part of application No. 12/970,602, filed on Dec. 16, 2010, now Pat. No. 9,711,407, which is a continuation-in-part of application No. 12/949,617, filed on Nov. 18, 2010, now Pat. No. 8,745,533, which is a continuation-in-part of application No. 12/900,379, filed on Oct. 7, 2010, now Pat. No. 8,395,191, which is a continuation-in-part of application No. 12/847,911, filed on Jul. 30, 2010, now Pat. No. 7,960,242, which is a continuation-in-part of application No. 12/792,673, filed on Jun. 2, 2010, now Pat. No. 7,964,916, which is a continuation-in-part of application No. 12/706,520, filed on Feb. 16, 2010, now abandoned, which is a continuation-in-part of application No. 12/577,532, filed on Oct. 12, 2009, now abandoned.

(51) Int. Cl.

| | | |
|---|---|---|
| *H01L 27/24* | (2006.01) | |
| *H01L 27/11* | (2006.01) | |
| *H01L 27/108* | (2006.01) | |
| *H01L 23/367* | (2006.01) | |
| *H01L 27/22* | (2006.01) | |
| *H01L 21/762* | (2006.01) | |
| *H01L 27/11524* | (2017.01) | |
| *H01L 27/11551* | (2017.01) | |
| *H01L 27/085* | (2006.01) | |
| *H01L 27/092* | (2006.01) | |

(52) U.S. Cl.
CPC ........ *H01L 27/092* (2013.01); *H01L 45/1226* (2013.01); *H01L 45/146* (2013.01); *H01L 2224/16225* (2013.01); *H01L 2224/32225* (2013.01); *H01L 2224/73204* (2013.01); *H01L 2924/15311* (2013.01)

(56) References Cited

U.S. PATENT DOCUMENTS

| | | | | |
|---|---|---|---|---|
| 7,312,487 | B2* | 12/2007 | Alam | H01L 21/2007 257/278 |
| 7,463,502 | B2* | 12/2008 | Stipe | G11C 7/18 257/296 |
| 8,674,470 | B1* | 3/2014 | Or-Bach | H01L 24/25 257/499 |
| 8,928,119 | B2* | 1/2015 | Leedy | H01L 21/76898 257/419 |
| 9,136,153 | B2* | 9/2015 | Or-Bach | H01L 21/6835 |
| 9,252,134 | B2* | 2/2016 | Or-Bach | H01L 24/25 |
| 9,385,058 | B1* | 7/2016 | Or-Bach | H01L 23/49827 |
| 2004/0262635 | A1* | 12/2004 | Lee | B82Y 10/00 257/199 |
| 2007/0211535 | A1* | 9/2007 | Kim | H01L 27/1052 365/185.21 |
| 2009/0026541 | A1* | 1/2009 | Chung | H01L 21/84 257/347 |
| 2009/0294822 | A1* | 12/2009 | Batude | H01L 27/11 257/314 |
| 2009/0325343 | A1* | 12/2009 | Lee | H01L 21/2007 438/107 |
| 2010/0224876 | A1* | 9/2010 | Zhu | H01L 21/76898 257/52 |
| 2010/0225002 | A1* | 9/2010 | Law | H01L 21/76898 257/774 |
| 2011/0111560 | A1* | 5/2011 | Purushothaman | H01L 21/76898 438/109 |
| 2012/0193785 | A1* | 8/2012 | Lin | H01L 21/76229 257/737 |
| 2013/0344655 | A1* | 12/2013 | Ohba | H01L 23/3114 438/109 |
| 2014/0342502 | A1* | 11/2014 | Ma | H01L 21/76898 438/107 |
| 2015/0008589 | A1* | 1/2015 | Suzuki | H01L 23/481 257/774 |

OTHER PUBLICATIONS

Moon, Dong-Il, Sung-Jin Choi, Jee-Yeon Kim, Seung-Won Ko, Moon-Seok Kim, Jae-Sub Oh, Gi-Sung Lee, Min-Ho Kang, Young-Su Kim, Jeoung-Woo Kim, and Yang-Kyu Choi. "Highly Endurable Floating Body Cell Memory: Vertical Biristor." 2012 International Electron Devices Meeting (2012).*

* cited by examiner

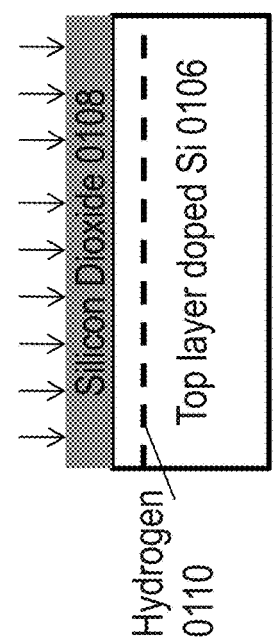

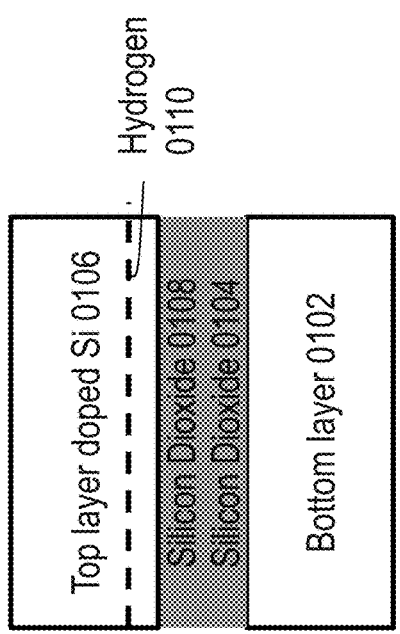
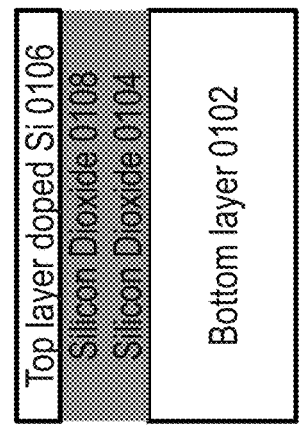

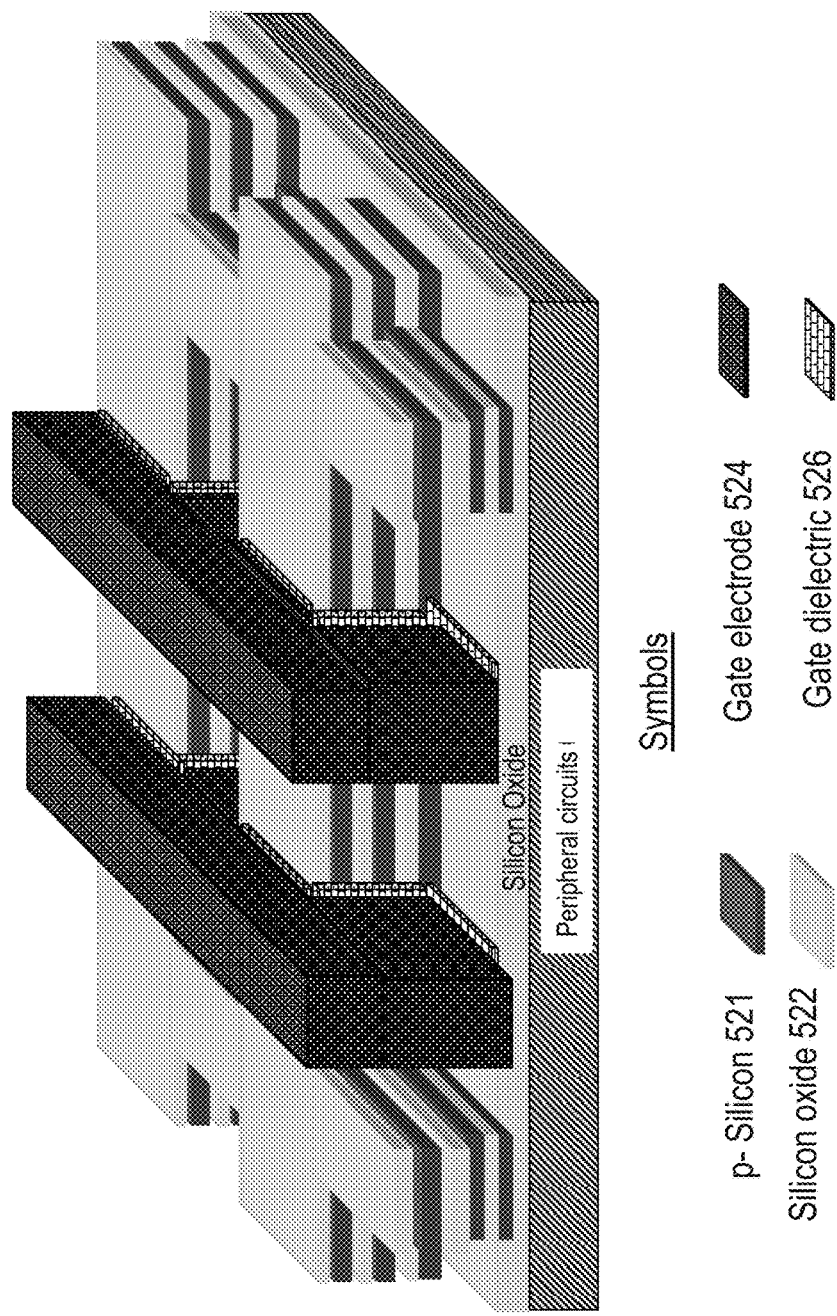

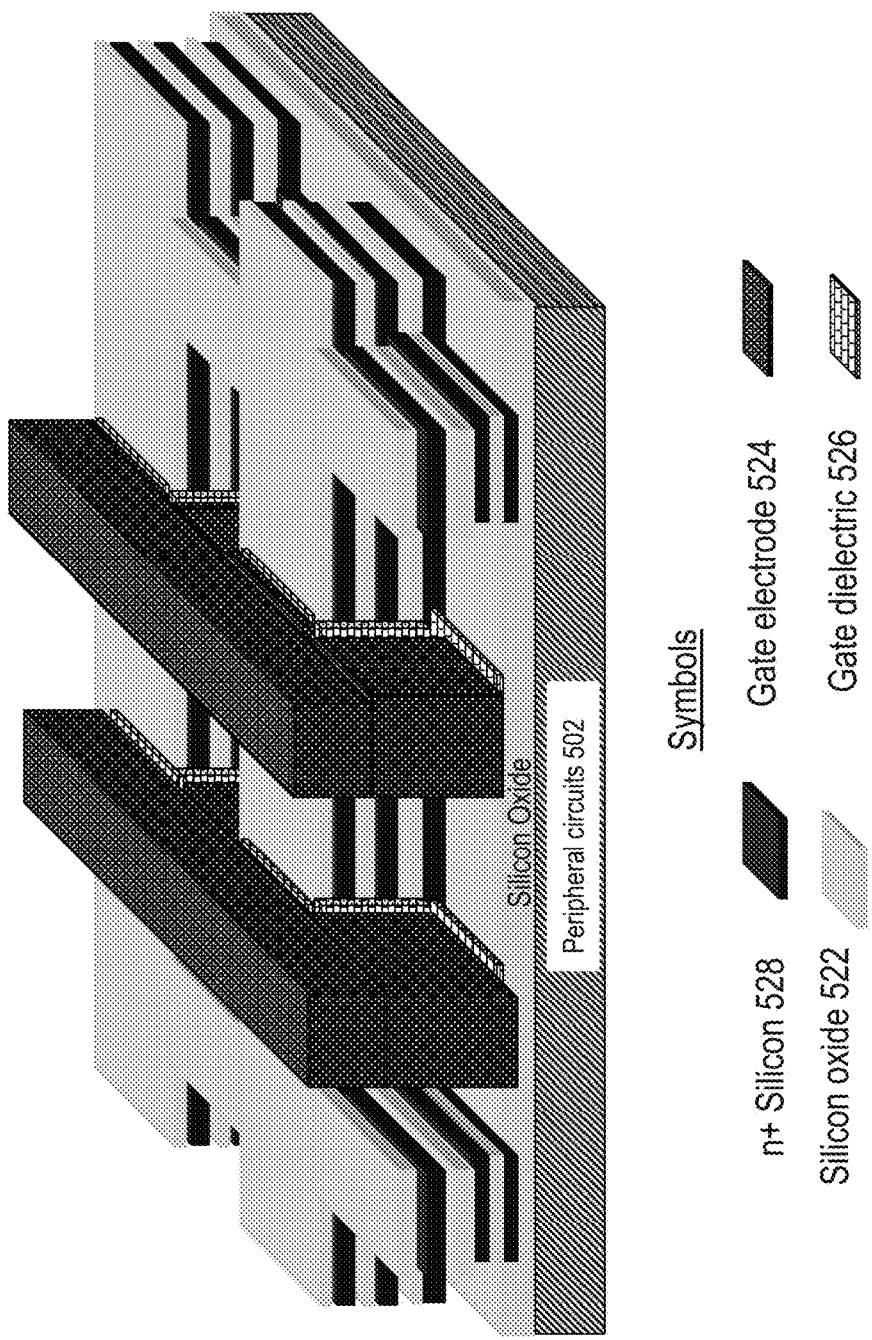

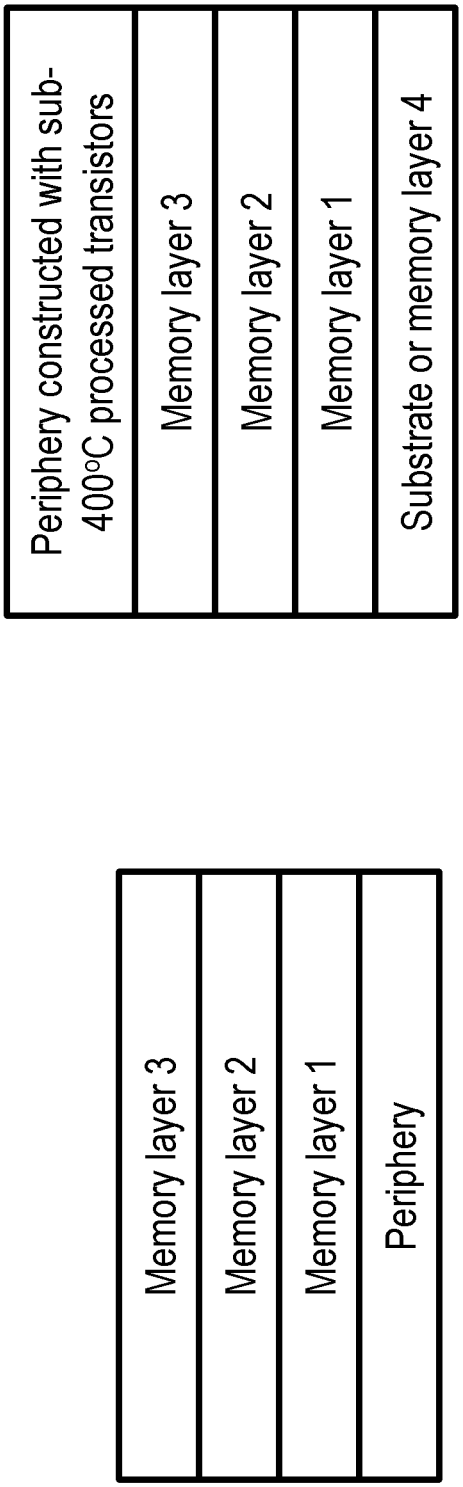

3D SEMICONDUCTOR DEVICE AND STRUCTURE

This application is a continuation in part of U.S. patent application Ser. No. 14/626,563 filed on Feb. 19, 2015, which is a continuation of U.S. patent application Ser. No. 14/017,266 filed on Sep. 3, 2013, which is a continuation of U.S. patent application Ser. No. 13/099,010 filed on May 2, 2011, now U.S. Pat. No. 8,581,349 issued on Nov. 12, 2013, which is a continuation-in-part of U.S. patent application Ser. No. 12/951,913 filed on Nov. 22, 2010, now U.S. Pat. No. 8,536,023 issued on Sep. 17, 2013, which is a continuation-in part of U.S. patent application Ser. No. 12/904,119 filed on Oct. 13, 2010, now U.S. Pat. No. 8,476,145 issued on Jul. 2, 2013, the entire contents all the above references are incorporated herein by reference.

In addition, this application is a continuation-in part of U.S. patent application Ser. No. 13/016,313 filed on Jan. 28, 2011, now U.S. Pat. No. 8,362,482 issued on Jan. 29, 2013, which is a continuation-in part of U.S. patent application Ser. No. 12/970,602 filed on Dec. 16, 2010, which is a continuation-in part of U.S. patent application Ser. No. 12/949,617 filed on Nov. 18, 2010, now U.S. Pat. No. 8,754,533 issued on Jun. 17, 2014, which is a continuation-in part of U.S. patent application Ser. No. 12/900,379 filed on Oct. 7, 2010, now U.S. Pat. No. 8,395,191 issued on Mar. 12, 2013, which is a continuation-in part of U.S. patent application Ser. No. 12/847,911 filed on Jul. 30, 2010, now U.S. Pat. No. 7,960,242 issued on Jun. 14, 2011, which is a continuation-in part of U.S. patent application Ser. No. 12/792,673 filed on Jun. 2, 2010, now U.S. Pat. No. 7,964,916 issued on Jun. 21, 2011, which is a continuation-in part of U.S. patent application Ser. No. 12/706,520 filed on Feb. 16, 2010, which is a continuation-in part of U.S. patent application Ser. No. 12/577,532 filed on Oct. 12, 2009, the entire contents of all the above references are incorporated herein by reference.

BACKGROUND OF THE INVENTION

Field of the Invention

This invention describes applications of monolithic 3D integration to semiconductor chips performing logic and memory functions.

Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

3D stacking of semiconductor chips is one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer is constructed using Temperatures higher than 700° C., it can damage the Bottom Wiring Layer.

Due to the above mentioned problem with forming transistor layers above wiring layers at temperatures lower than 400° C., the semiconductor industry has largely explored alternative architectures for 3D stacking. In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer is large and the number of these Contacts is small. In fact, prototypes of 3D stacked chips today utilize as few as 10,000 connections between two layers, compared to billions of connections within a layer. This low connectivity between layers is because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs is not easy. This places a restriction on lateral dimensions of TSVs, which in turn impacts TSV density and contact density to another stacked layer. Therefore, connectivity between two wafers is limited.

It is highly desirable to circumvent these issues and build 3D stacked semiconductor chips with a high-density of connections between layers. To achieve this goal, it is sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

There are many techniques to construct 3D stacked integrated circuits or chips including: Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in in U.S. Pat. Nos. 8,273,610, 8,557,632, 8,298, 875, 8,642,416, 8,362,482, 8,378,715, 8,379,458, 8,450,804, 8,574,929, 8,581,349, 8,669,778, 8,687,399, 8,742,476, 8,674,470, 8,803,206, 8,902,663, 8,994,404, 9,023,688, 9,029,173, 9,030,858, 9,117,749, 9,142,553, 9,219,005; US patent publication 2011/0092030; and pending U.S. patent application Ser. Nos. 13/731,108, 13/803,437, 62/042,229, 61/932,617, 14/607,077, 14/642,724, 62/139,636, 62/149, 651, and 62/198,126. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753, 913, 8,823,122, 9,197,804, and U.S. patent application Ser. No. 14/461,539. The entire contents of the foregoing patents, publications, and applications are incorporated herein by reference U.S. Pat. No. 7,052,941 from Sang-Yun Lee ("S-Y Lee") describes methods to construct vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it is difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, et al. ("Topol"). A process flow is utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors is produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration", International Electron Devices Meeting, 2009 by A. Hubert, et al ("Hubert"). However, the approach described by Hubert has some challenges including the use of difficult-to-manufacture nanowire transistors, higher defect densities due to formation of Si and SiGe layers atop each other, high temperature processing for long times, and difficult manufacturing.

It is clear based on the background art mentioned above that invention of novel technologies for 3D stacked chips will be useful.

SUMMARY

In one aspect, a 3D semiconductor device comprising: a first structure comprising first single crystal transistors; a second structure comprising second single crystal transistors, said second structure overlaying said first single crystal transistors, wherein at least one of said second single crystal transistors is at least partially self-aligned to at least one of said first single crystal transistors; and at least one thermal conducting path from at least one of said first single crystal transistors and second single crystal transistors to an external surface of said device.

In another aspect, a 3D semiconductor device comprising: a first structure comprising first single crystal transistors; a second structure comprising second single crystal transistors, said second structure overlaying said first single crystal transistors, wherein at least one of said second single crystal transistors is at least partially self-aligned to at least one of said first single crystal transistors; and a third structure comprising third single crystal transistors, said third structure overlaying said second single crystal transistors, wherein a plurality of said third single crystal transistors form a logic circuit.

In another aspect, a 3D semiconductor device comprising: a first structure comprising first single crystal transistors; a second structure comprising second single crystal transistors, said second structure overlaying said first single crystal transistors, wherein at least one of said second single crystal transistors is at least partially self-aligned to at least one of said first single crystal transistors; and a single crystal memory control line, said single crystal memory control line is embedded in said second structure.

BRIEF DESCRIPTION OF THE DRAWINGS

Various embodiments of the invention will be understood and appreciated more fully from the following detailed description, taken in conjunction with the drawings in which:

FIGS. 1A-1E depict a layer transfer flow using ion-cut in which a top layer of doped Si is layer transferred atop a generic bottom layer;

FIGS. 5A-5K show a zero-mask per layer 3D floating body DRAM;

FIGS. 6A-6J show a zero-mask per layer 3D resistive memory with a junction-less transistor;

FIGS. 7A-7K show an alternative zero-mask per layer 3D resistive memory;

Figs. 11 A-11B show periphery on top of memory layers.

DETAILED DESCRIPTION

Figure 2:
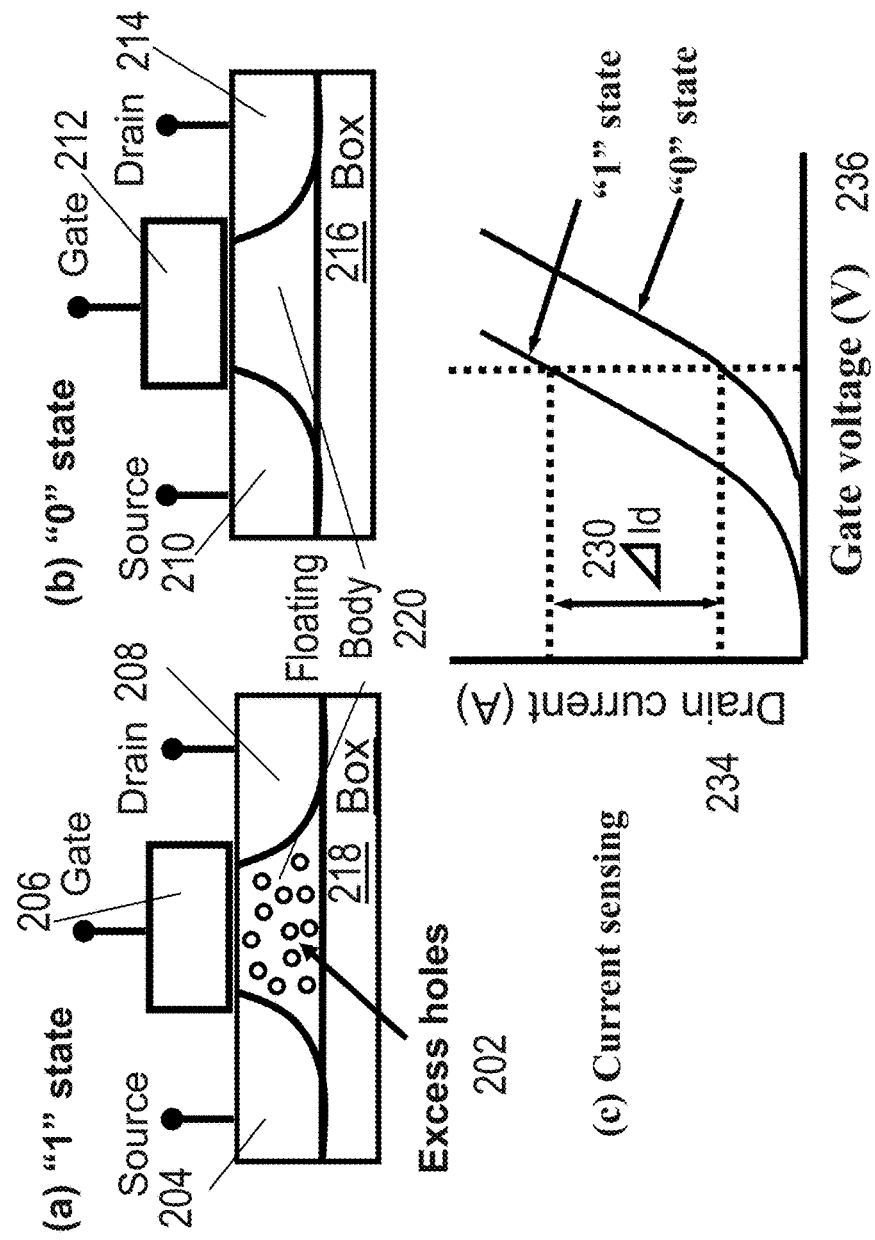
FIG. 2 shows a floating-body DRAM as described in prior art.

Embodiments of the present invention are now described with reference to the appended Figures, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

The thinner the transferred layer, the smaller the thru layer via diameter obtainable, due to the limitations of manufacturable via aspect ratios. Thus, the transferred layer may be, for example, less than 2 microns thick, less than 1 micron thick, less than 0.4 microns thick, less than 200 nm thick, or less than 100 nm thick. The thickness of the layer or layers transferred according to some embodiments of the present invention may be designed as such to match and enable the best obtainable lithographic resolution capability of the manufacturing process employed to create the thru layer vias or any other structures on the transferred layer or layers. As the transferred layers are thin, on the order of 200 nm or less in thickness, the TLVs (thru layer vias) may be easily manufactured as a normal metal to metal via may be, and said TLV may have state of the art diameters such as nanometers or tens of nanometers, for example, 200 nm.

The term via in the use herein may be defined as "an opening in the dielectric layer(s) through which a riser passes, or in which the walls are made conductive; an area that provides an electrical pathway [connection path] from one metal layer to the metal layer above or below," as in the SEMATECH dictionary. The term through silicon via (TSV) in the use herein may be defined as an opening in a silicon layer(s) through which an electrically conductive riser passes, and in which the walls are made isolative from the silicon layer; a riser that provides an electrical pathway [connection path] from one metal layer to the metal layer above or below. The term through layer via (TLV) in the use herein may be defined as an opening in a layer transferred layer(s) through which an electrically conductive riser passes, wherein the riser may pass through at least one isolating region, for example, a shallow trench isolation (STI) region in the transferred layer, may typically have a riser diameter of less than 200 nm, a riser that provides an electrical pathway [connection path] from one metal layer to the metal layer above or below. In some cases, a TLV may additionally pass thru an electrically conductive layer, and the walls may be made isolative from the conductive layer.

In many of the embodiments of the present invention, the layer or layers transferred may be of mono-crystalline silicon, and after layer transfer, further processing, such as, for example, plasma/RIE or wet etching, may be done on the layer or layers that may create islands or mesas of the transferred layer or layers of mono-crystalline silicon, the crystal orientation of which has not changed. Thus, a mono-crystalline layer or layers of a certain specific crystal orientation may be layer transferred and then processed whereby the resultant islands or mesas of mono-crystalline silicon have the same crystal specific orientation as the layer or layers before the processing.

There are a few alternative methods to construct the top transistors precisely aligned to the underlying pre-fabricated layers such as pre-processed wafer or layer 808 (such as found in at least incorporated reference U.S. Pat. Nos. 8,362,482 and 8,273,610 in at least FIG. 8), utilizing "SmartCut" layer transfer and not exceeding the temperature limit, typically approximately 400° C., of the underlying pre-fabricated structure, which may include low melting temperature metals or other construction materials such as, for example, aluminum or copper. As the layer transfer is less than 200 nm thick, then the transistors defined on it could be aligned precisely to the top metal layer of the pre-processed wafer or layer 808 as may be needed and those transistors have less than 40 nm misalignment as well as thru layer via, or layer to layer metal connection, diameters of less than 50 nm. The thinner the transferred layer, the smaller the thru layer via diameter obtainable, due to the limitations of manufacturable via aspect ratios. Thus, the transferred layer may be, for example, less than 2 microns thick, less than 1 micron thick, less than 0.4 microns thick, less than 200 nm thick, or less than 100 nm thick.

This section of the document describes a technology to construct single-crystal silicon transistors atop wiring layers with less than 400° C. processing temperatures. This allows construction of 3D stacked semiconductor chips with high density of connections between different layers, because the top-level transistors are formed well-aligned to bottom-level wiring and transistor layers. Since the top-level transistor layers are very thin (preferably less than 200 nm), alignment can be done through these thin silicon and oxide layers to features in the bottom-level.

Note that the terms smart-cut, smart-cleave and nano-cleave are used interchangeably with the term ion-cut in this document. Gate dielectrics can be grown or deposited above silicon at less than 400° C. using a Chemical Vapor Deposition (CVD) process, an Atomic Layer Deposition (ALD) process or a plasma-enhanced thermal oxidation process. Gate electrodes can be deposited using CVD or ALD at sub-400° C. temperatures as well. The only part of the transistor that requires temperatures greater than 400° C. for processing is the source-drain regions, which receive ion implantation which needs to be activated.

FIGS. 1A-E describes an ion-cut flow for layer transferring a single crystal silicon layer atop any generic bottom layer 0102. The bottom layer 0102 can be a single crystal silicon layer. Alternatively, it can be a wafer having transistors with wiring layers above it. This process of ion-cut based layer transfer may include several steps, as described in the following sequence:

Step (A): A silicon dioxide layer 0104 is deposited above the generic bottom layer 0102. FIG. 1A illustrates the structure after Step (A) is completed.

Step (B): The top layer of doped or undoped silicon 0106 to be transferred atop the bottom layer is processed and an oxide layer 0108 is deposited or grown above it. FIG. 1B illustrates the structure after Step (B) is completed.

Step (C): Hydrogen is implanted into the top layer silicon 0106 with the peak at a certain depth to create the hydrogen plane 0110. Alternatively, another atomic species such as helium or boron can be implanted or co-implanted. FIG. 1C illustrates the structure after Step (C) is completed.

Step (D): The top layer wafer shown after Step (C) is flipped and bonded atop the bottom layer wafer using oxide-to-oxide bonding. FIG. 1D illustrates the structure after Step (D) is completed.

Step (E): A cleave operation is performed at the hydrogen plane 0110 using an anneal. Alternatively, a sideways mechanical force may be used. Further details of this cleave process are described in "Frontiers of silicon-on-insulator," J. Appl. Phys. 93, 4955-4978 (2003) by G. K. Celler and S. Cristoloveanu ("Celler") and "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen"). Following this, a Chemical-Mechanical-Polish (CMP) is done. FIG. 1E illustrates the structure after Step (E) is completed.

This Section describes novel monolithic 3D Dynamic Random Access Memories (DRAMs). Some embodiments of this invention may involve floating body DRAM. Background information on floating body DRAM and its operation is given in "Floating Body RAM Technology and its Scalability to 32 nm Node and Beyond," *Electron Devices Meeting*, 2006. *IEDM '06. International*, vol., no., pp. 1-4, 11-13 Dec. 2006 by T. Shino, N. Kusunoki, T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC '08, July 2009, Pages 676-683, ISSN 0038-1101, DOI: 10.1016/j.sse.2009.03.010 by Takeshi Hamamoto, Takashi Ohsawa, et al., "New Generation of Z-RAM," *Electron Devices Meeting, 2007. IEDM 2007. IEEE International*, vol., no., pp. 925-928, 10-12 Dec. 2007 by Okhonin, S.; Nagoga, M.; Carman, E, et al. The above publications are incorporated herein by reference.

FIG. 2 describes fundamental operation of a prior art floating body DRAM. For storing a '1' bit, holes 202 are present in the floating body 220 and change the threshold voltage of the cell, as shown in FIG. 2(a). The '0' bit corresponds to no charge being stored in the floating body, as shown in FIG. 2(b). The difference in threshold voltage between FIG. 2(a) and FIG. 2(b) may give rise to a change in drain current of the transistor at a particular gate voltage, as described in FIG. 2(c). This current differential can be sensed by a sense amplifier to differentiate between '0' and '1' states.

FIGS. 3A-H describe a process flow to construct a horizontally-oriented monolithic 3D DRAM. Two masks are utilized on a "per-memory-layer" basis for the monolithic 3D DRAM concept shown in FIG. 3A-H, while other masks are shared between all constructed memory layers. The process flow may include several steps in the following sequence.

Figure 3B:
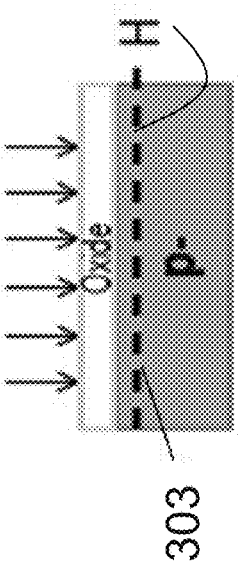
FIGS. 3A-3H show a two-mask per layer 3D floating body DRAM.
Figure 3D:
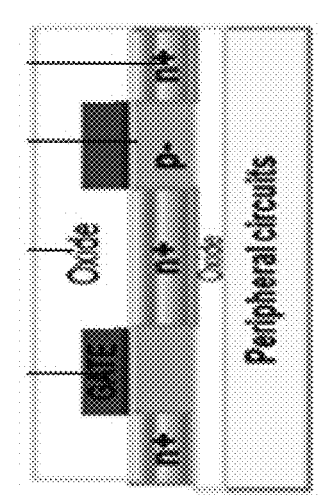
Figure 3A:
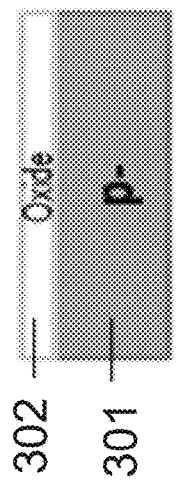

Step (A): A p– Silicon wafer 301 is taken and an oxide layer 302 is grown or deposited above it. FIG. 3A illustrates the structure after Step (A).

Step (B): Hydrogen is implanted into the p– silicon wafer 301 at a certain depth denoted by 303. FIG. 3B illustrates the structure after Step (B).

Figure 3C:
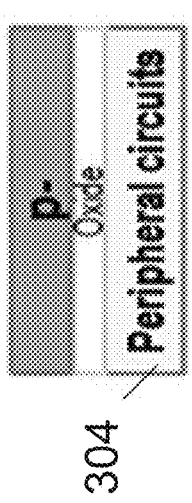

Step (C): The wafer after Step (B) is flipped and bonded onto a wafer having peripheral circuits 304 covered with oxide. This bonding process occurs using oxide-to-oxide bonding. The stack is then cleaved at the hydrogen implant plane 303 using either an anneal or a sideways mechanical force. A chemical mechanical polish (CMP) process is then conducted. Note that peripheral circuits 304 are such that they can withstand an additional rapid-thermal-anneal (RTA) and still remain operational, and preferably retain good performance. For this purpose, the peripheral circuits 304 may be such that they have not had their RTA for activating dopants or they have had a weak RTA for activating dopants. Also, peripheral circuits 304 utilize a refractory metal such as tungsten that can withstand temperatures greater than approximately 400° C. FIG. 3C illustrates the structure after Step (C).

Step (D): The transferred layer of p– silicon after Step (C) is then processed to form isolation regions using a STI process. Following, gate regions 305 are deposited and patterned, following which source-drain regions 308 are implanted using a self-aligned process. An inter-level dielectric (ILD) constructed of oxide (silicon dioxide) 306 is then constructed. Note that no RTA is done to activate dopants in this layer of partially-depleted SOI (PD-SOI) transistors. Alternatively, transistors could be of fully-depleted SOI type. FIG. 3D illustrates the structure after Step (D).

Figure 3F:
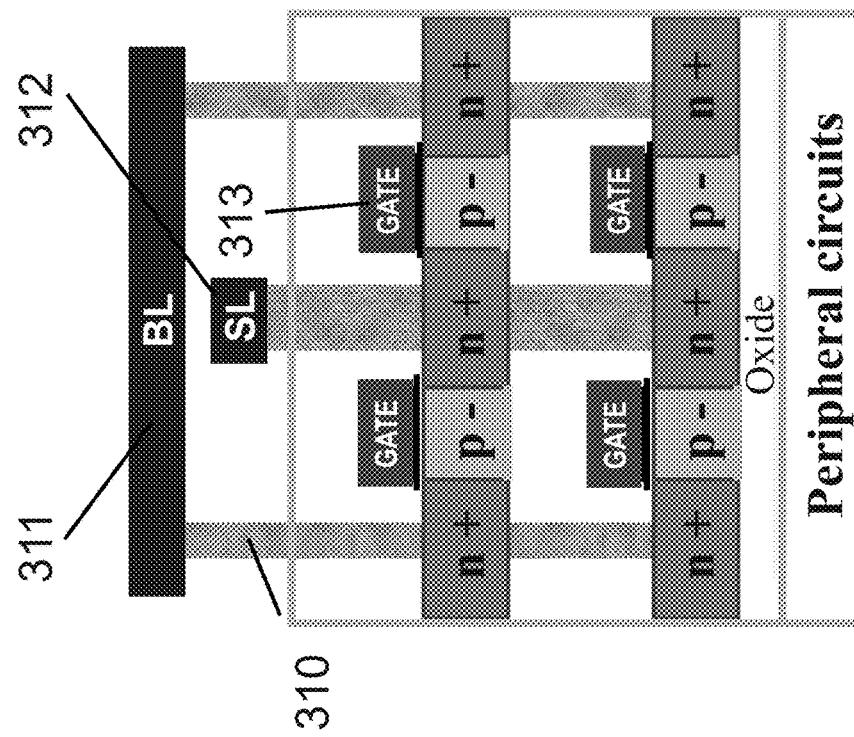
Figure 3E:
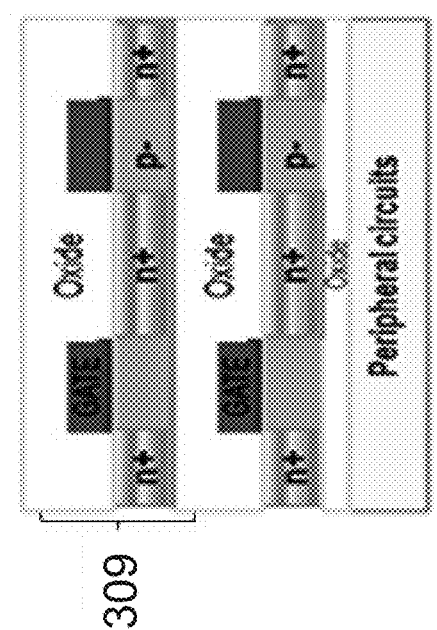

Step (E): Using steps similar to Step (A)-Step (D), another layer of memory 309 is constructed. After all the desired memory layers are constructed, a RTA is conducted to activate dopants in all layers of memory (and potentially also the periphery). FIG. 3E illustrates the structure after Step (E).

Figure 3H:
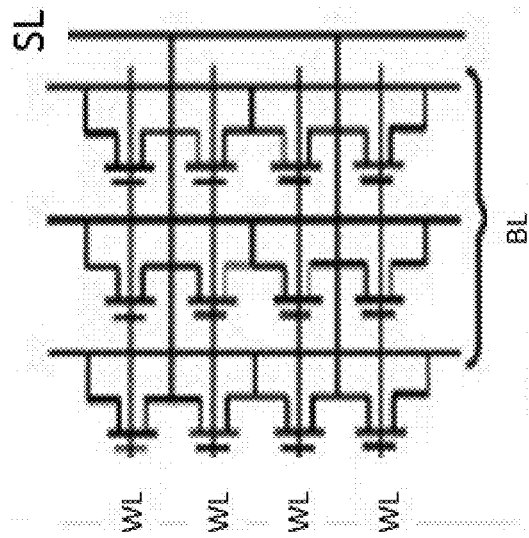
Figure 3G:
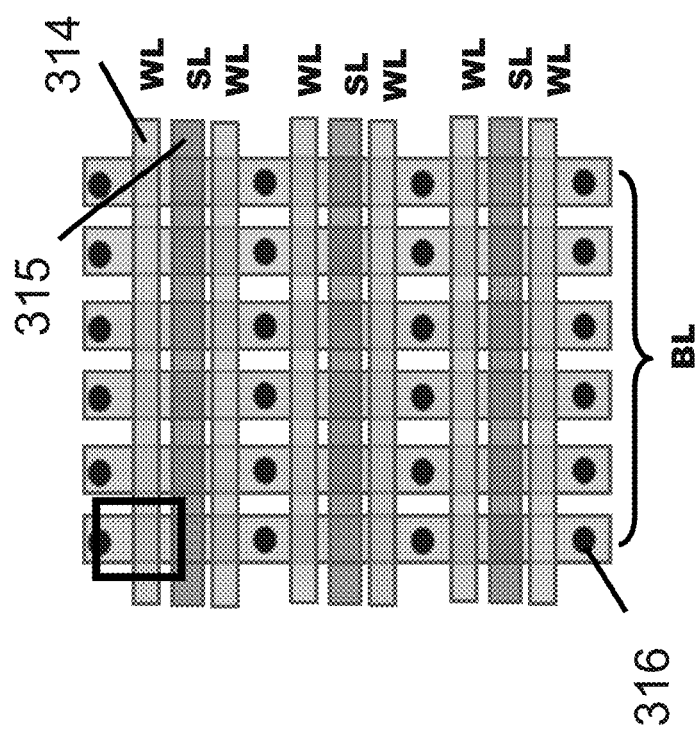

Step (F): Contact plugs 310 are made to source and drain regions of different layers of memory. Bit-line (BL) wiring 311 and Source-line (SL) wiring 312 are connected to contact plugs 310. Gate regions 313 of memory layers are connected together to form word-line (WL) wiring. FIG. 3F illustrates the structure after Step (F). FIG. 3G and FIG. 3H describe array organization of the floating-body DRAM. BLs 316 in a direction substantially perpendicular to the directions of SLs 315 and WLs 314.

FIGS. 4A-M describe an alternative process flow to construct a horizontally-oriented monolithic 3D DRAM. This monolithic 3D DRAM utilizes the floating body effect and double-gate transistors. One mask is utilized on a "per-memory-layer" basis for the monolithic 3D DRAM concept shown in FIG. 4A-M, while other masks are shared between different layers. The process flow may include several steps that occur in the following sequence.

Figure 4A:
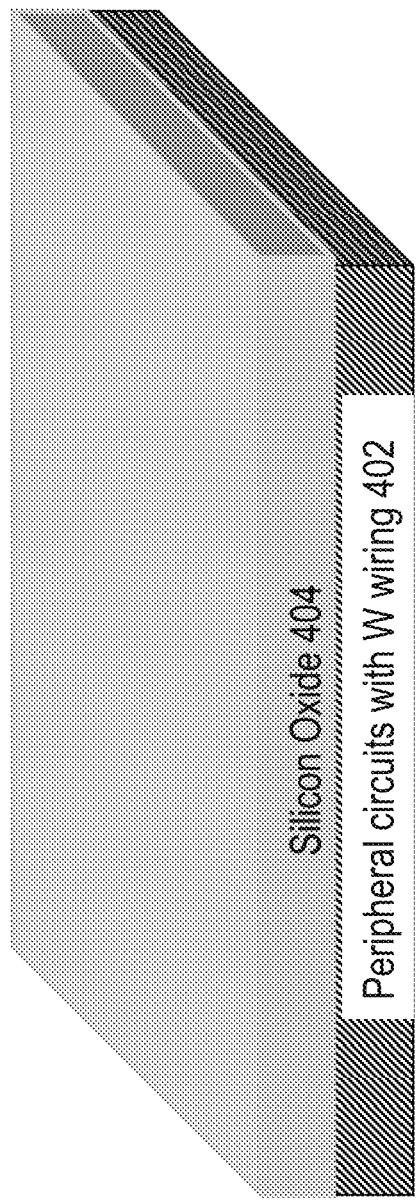
FIGS. 4A-4M show a one-mask per layer 3D floating body DRAM.

Step (A): Peripheral circuits 402 with tungsten wiring are first constructed and above this oxide layer 404 is deposited. FIG. 4A illustrates the structure after Step (A).

Figure 4B:
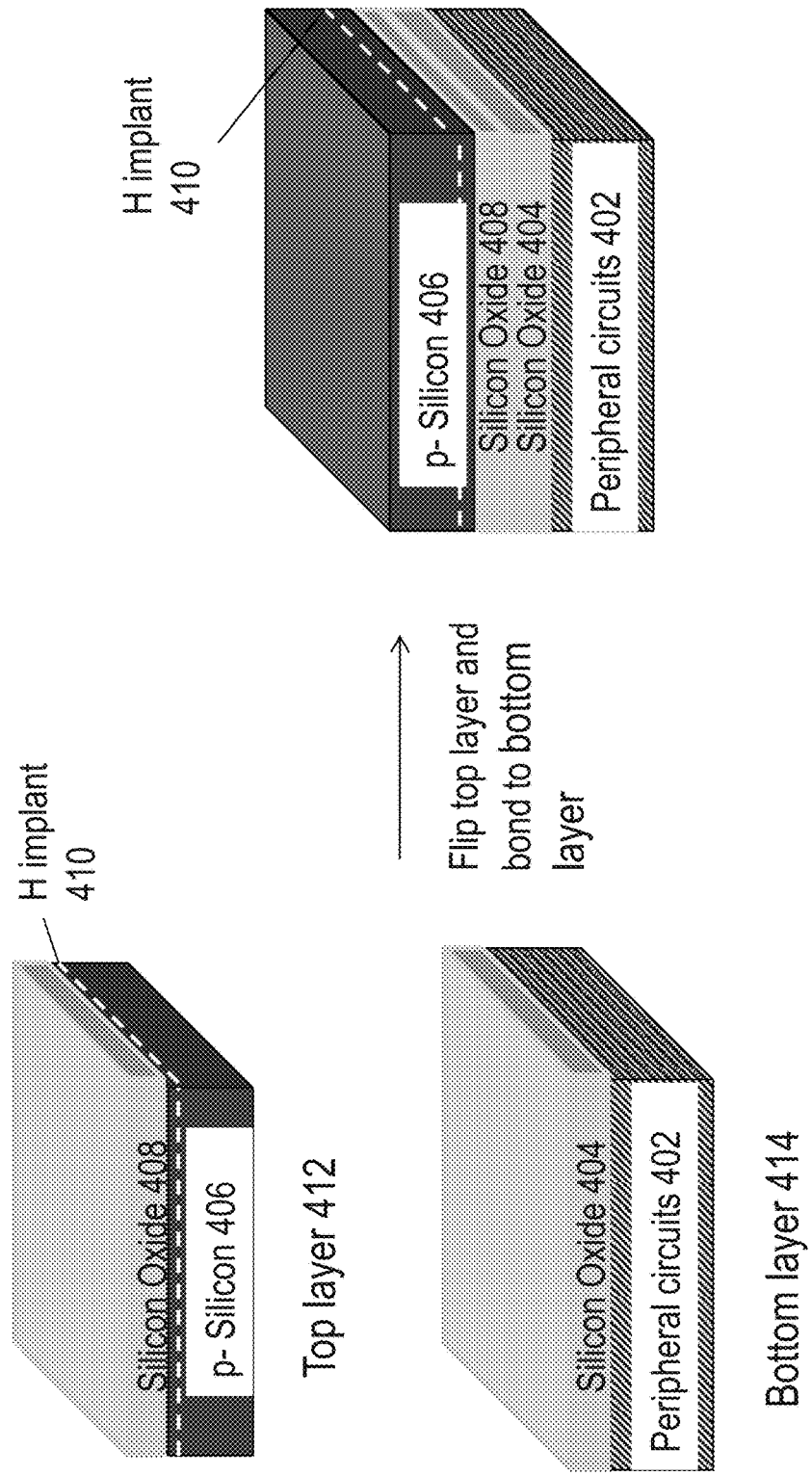

Step (B): FIG. 4B shows a drawing illustration after Step (B). A p– Silicon wafer 406 has an oxide layer 408 grown or deposited above it. Following this, hydrogen is implanted into the p– Silicon wafer at a certain depth indicated by 410. Alternatively, some other atomic species such as Helium could be (co-)implanted. This hydrogen implanted p– Silicon wafer 406 forms the top layer 412. The bottom layer 414 may include the peripheral circuits 402 with oxide layer 404. The top layer 412 is flipped and bonded to the bottom layer 414 using oxide-to-oxide bonding.

Figure 4C:
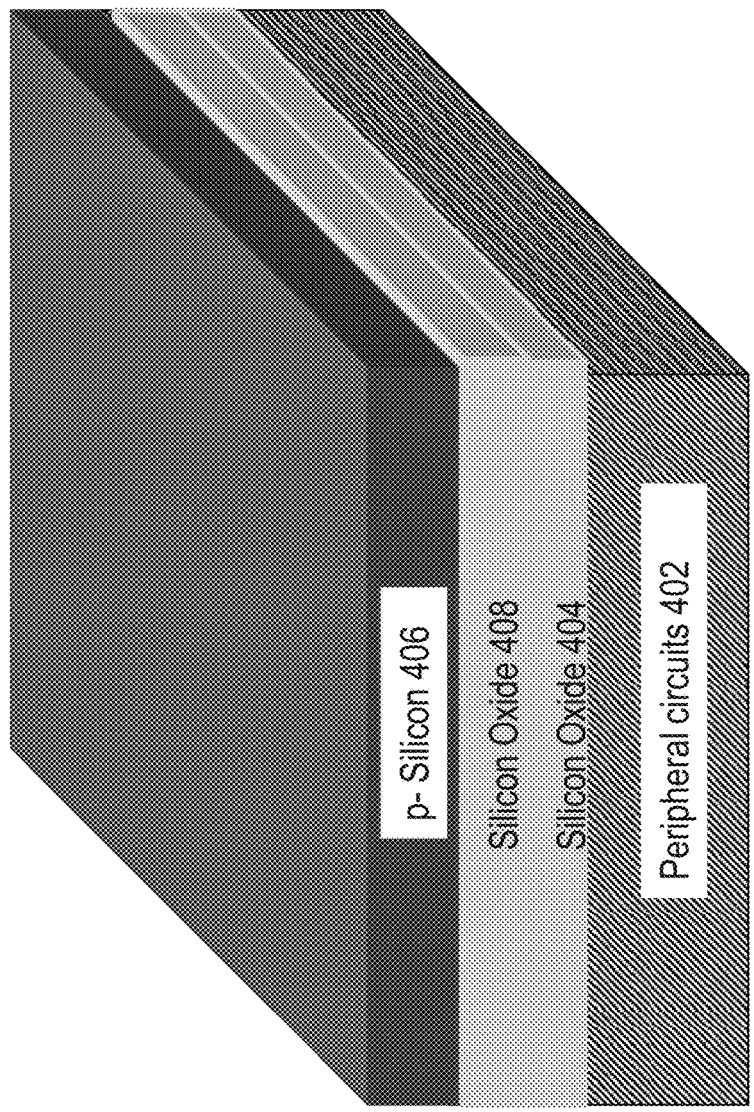

Step (C): FIG. 4C illustrates the structure after Step (C). The stack of top and bottom wafers after Step (B) is cleaved at the hydrogen plane 410 using either a anneal or a sideways mechanical force or other means. A CMP process is then conducted. At the end of this step, a single-crystal p– Si layer exists atop the peripheral circuits, and this has been achieved using layer-transfer techniques.

Figure 4D:
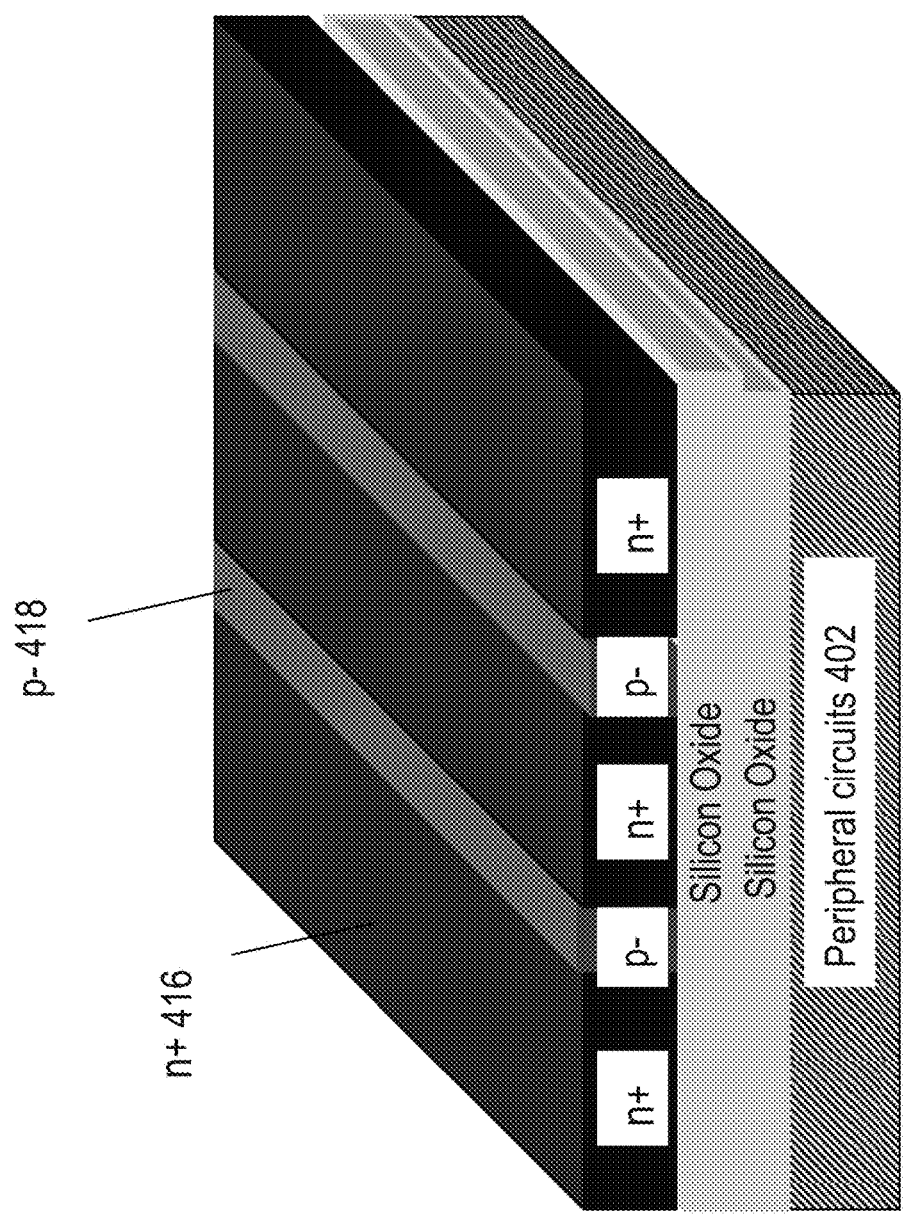

Step (D): FIG. 4D illustrates the structure after Step (D). Using lithography and then implantation, n+ regions 416 and p– regions 418 are formed on the transferred layer of p– Si after Step (C).

Figure 4E:
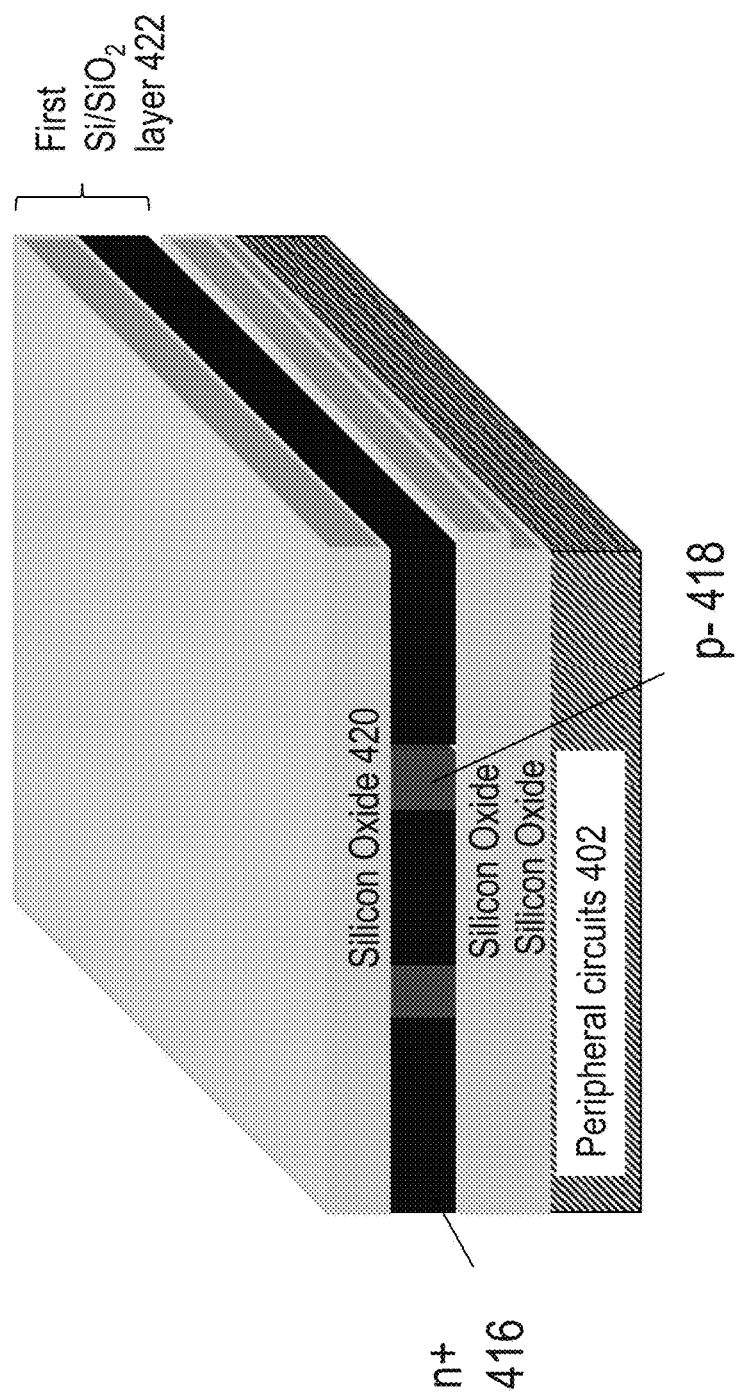

Step (E): FIG. 4E illustrates the structure after Step (E). An oxide layer 420 is deposited atop the structure obtained after Step (D). A first layer of Si/SiO$_2$ 422 is therefore formed atop the peripheral circuits 402.

Figure 4F:
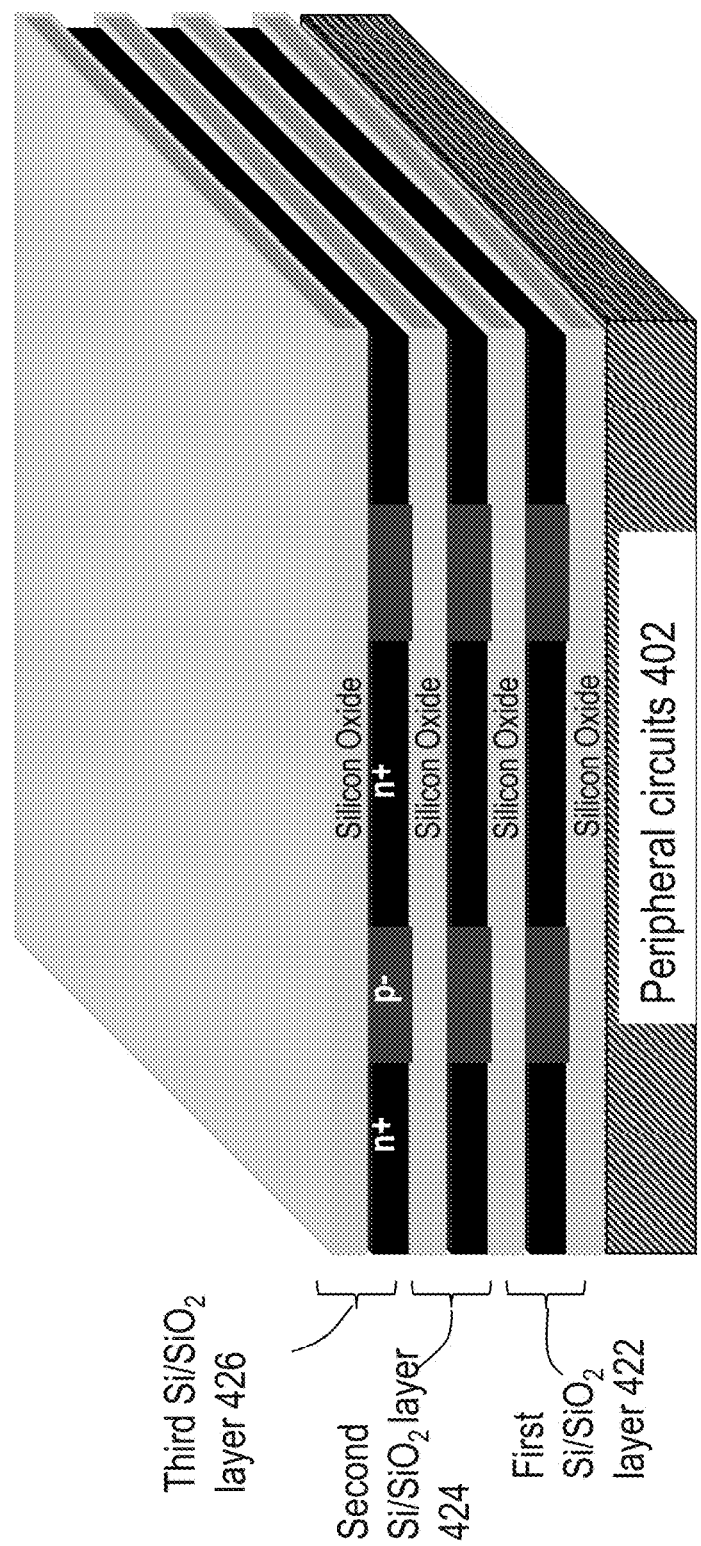

Step (F): FIG. 4F illustrates the structure after Step (F). Using procedures similar to Steps (B)-(E), additional Si/SiO$_2$ layers 424 and 426 are formed atop Si/SiO$_2$ layer 422. A rapid thermal anneal (RTA) or spike anneal or flash anneal or laser anneal is then done to activate all implanted layers 422, 424 and 426 (and possibly also the peripheral circuits 402). Alternatively, the layers 422, 424 and 426 are annealed layer-by-layer as soon as their implantations are done using a laser anneal system.

Figure 4G:
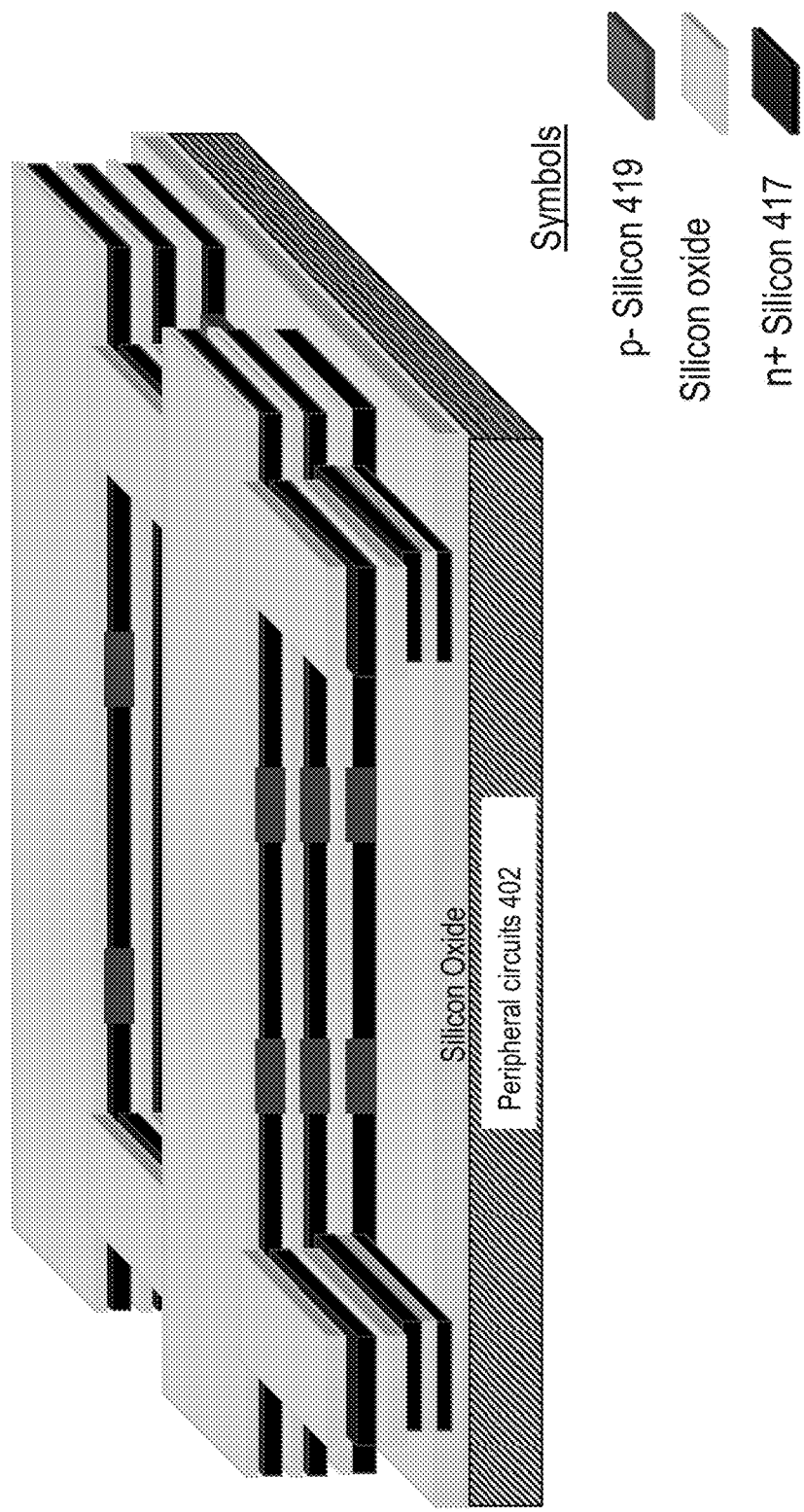

Step (G): FIG. 4G illustrates the structure after Step (G). Lithography and etch processes are then utilized to make a structure as shown in the figure.

Figure 4H:
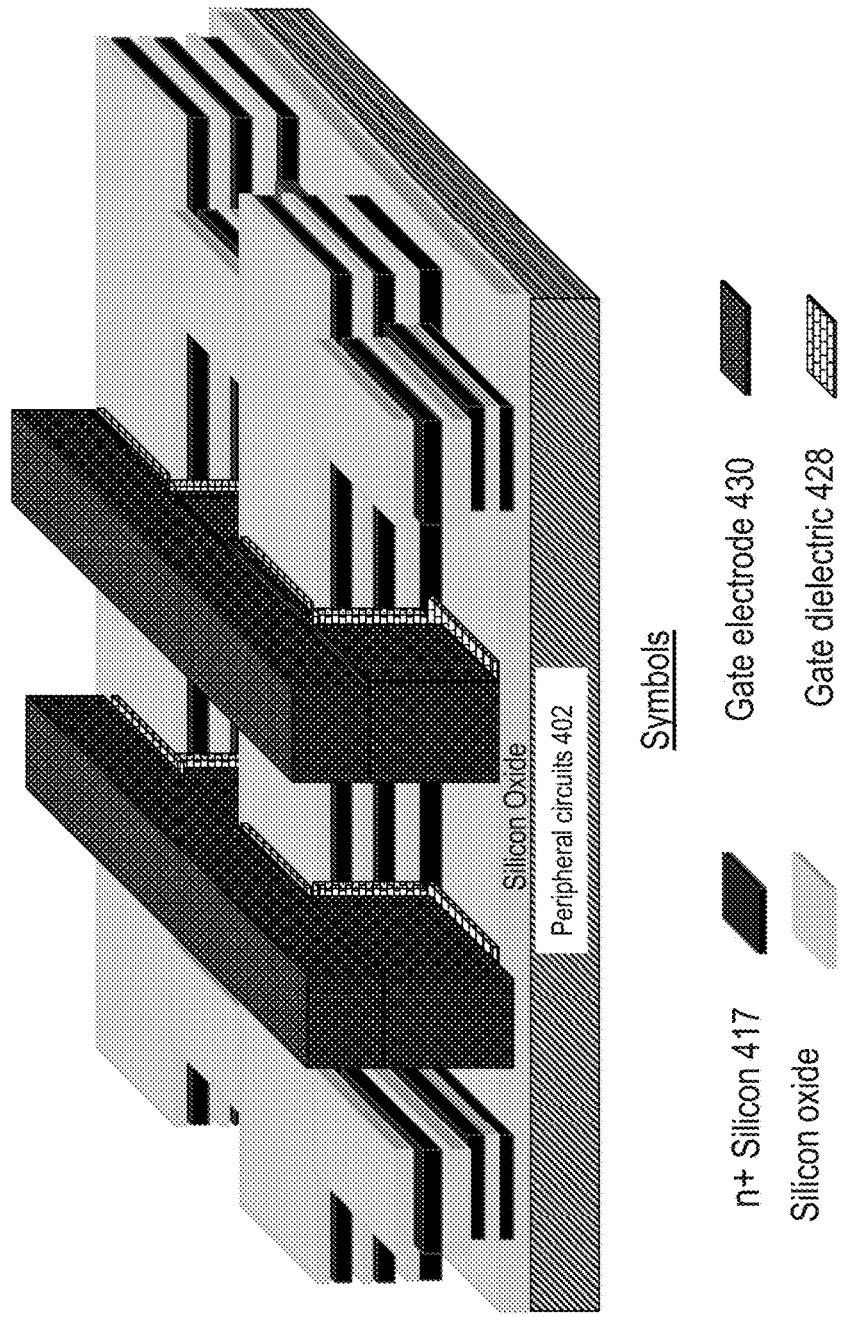

Step (H): FIG. 4H illustrates the structure after Step (H). Gate dielectric 428 and gate electrode 430 are then deposited following which a CMP is done to planarize the gate electrode 430 regions. Lithography and etch are utilized to define gate regions over the p– silicon regions (eg. p– Si region after Step (D)). Note that gate width could be slightly larger than p– region width to compensate for overlay errors in lithography.

Figure 4I:
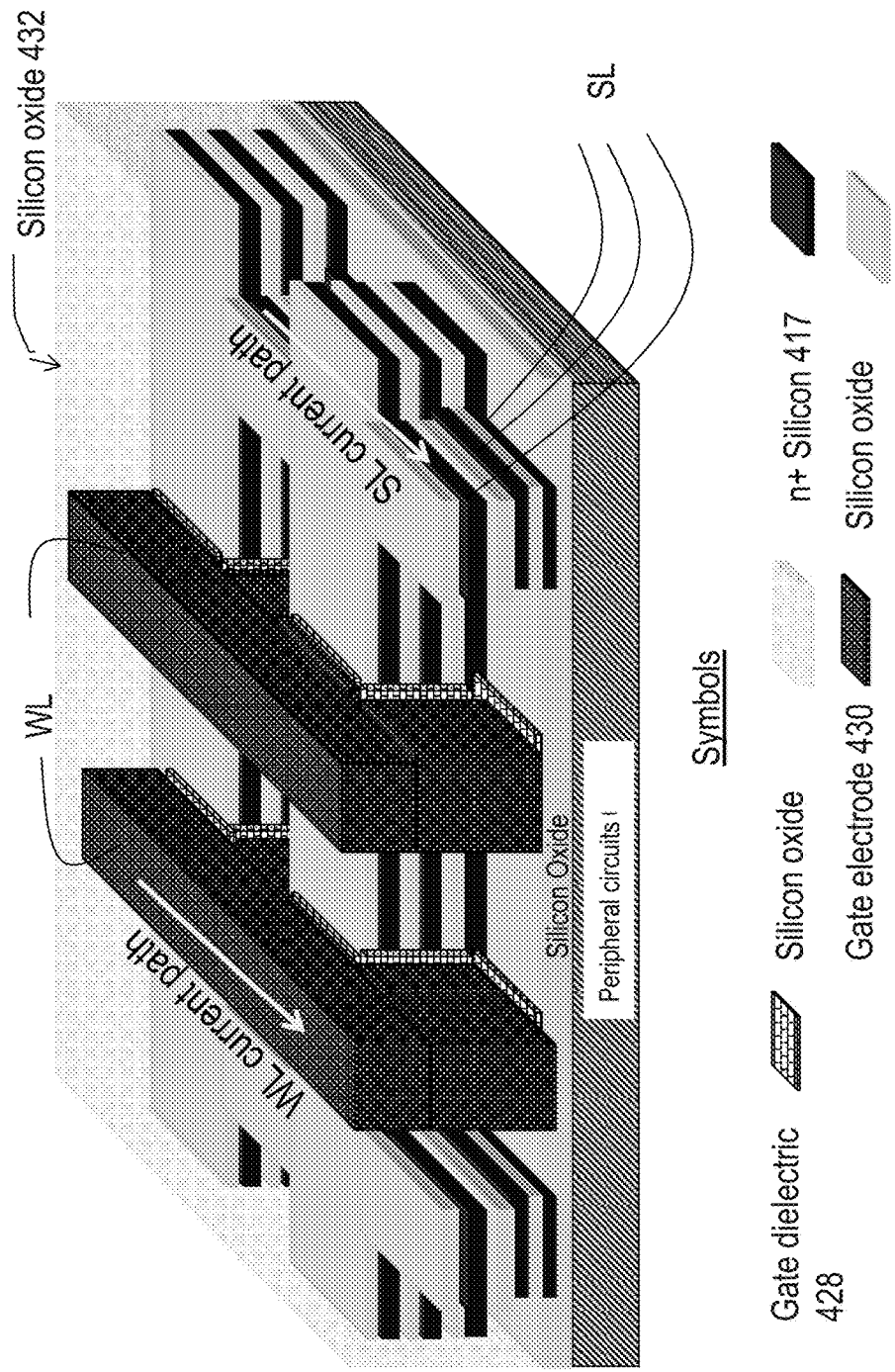

Step (I): FIG. 4I illustrates the structure after Step (I). A silicon oxide layer 432 is then deposited and planarized. For clarity, the silicon oxide layer is shown transparent in the figure, along with word-line (WL) and source-line (SL) regions.

Figure 4J:
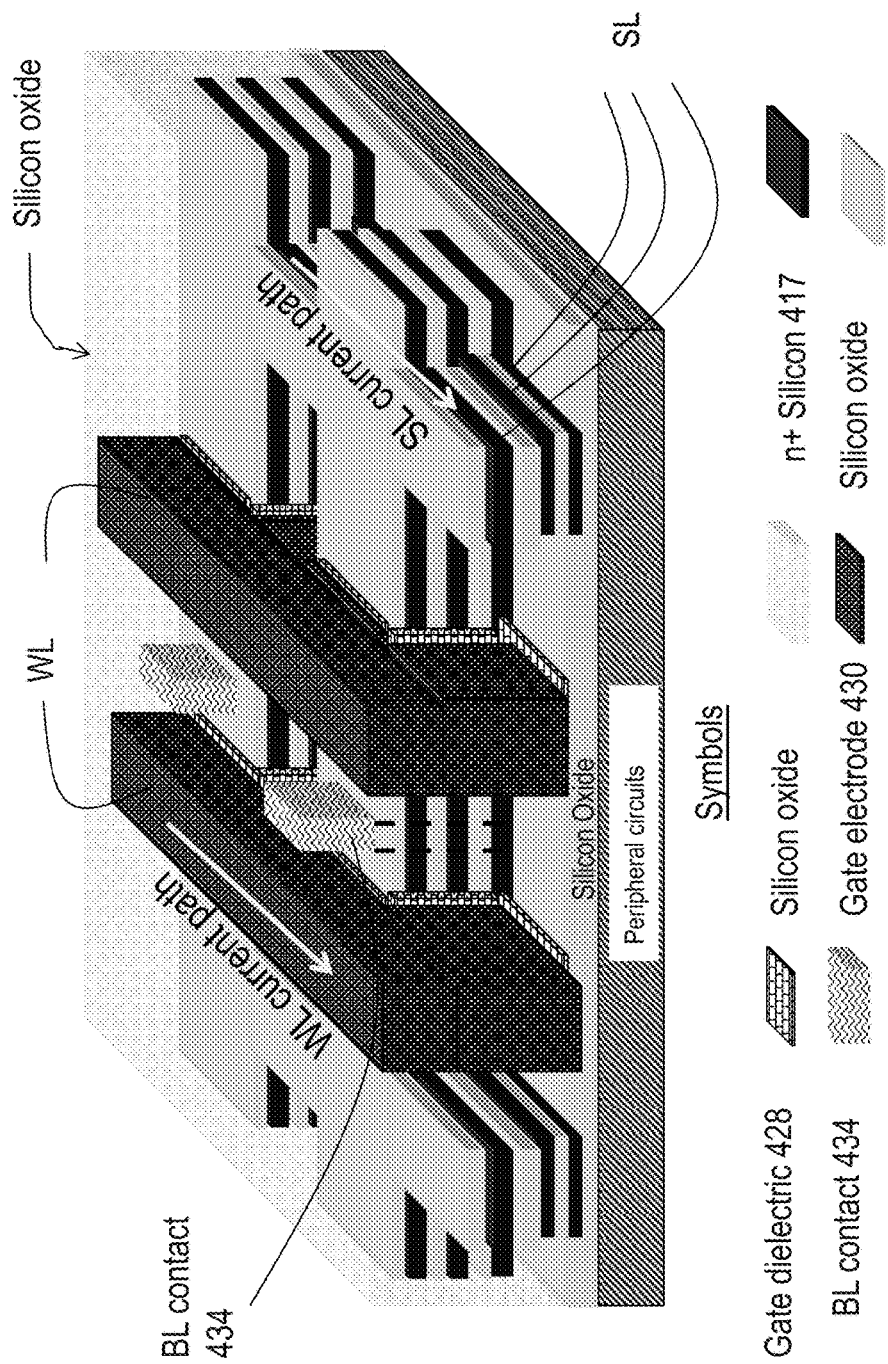

Step (J): FIG. 4J illustrates the structure after Step (J). Bit-line (BL) contacts 434 are formed by etching and deposition. These BL contacts are shared among all layers of memory.

Figure 4K:
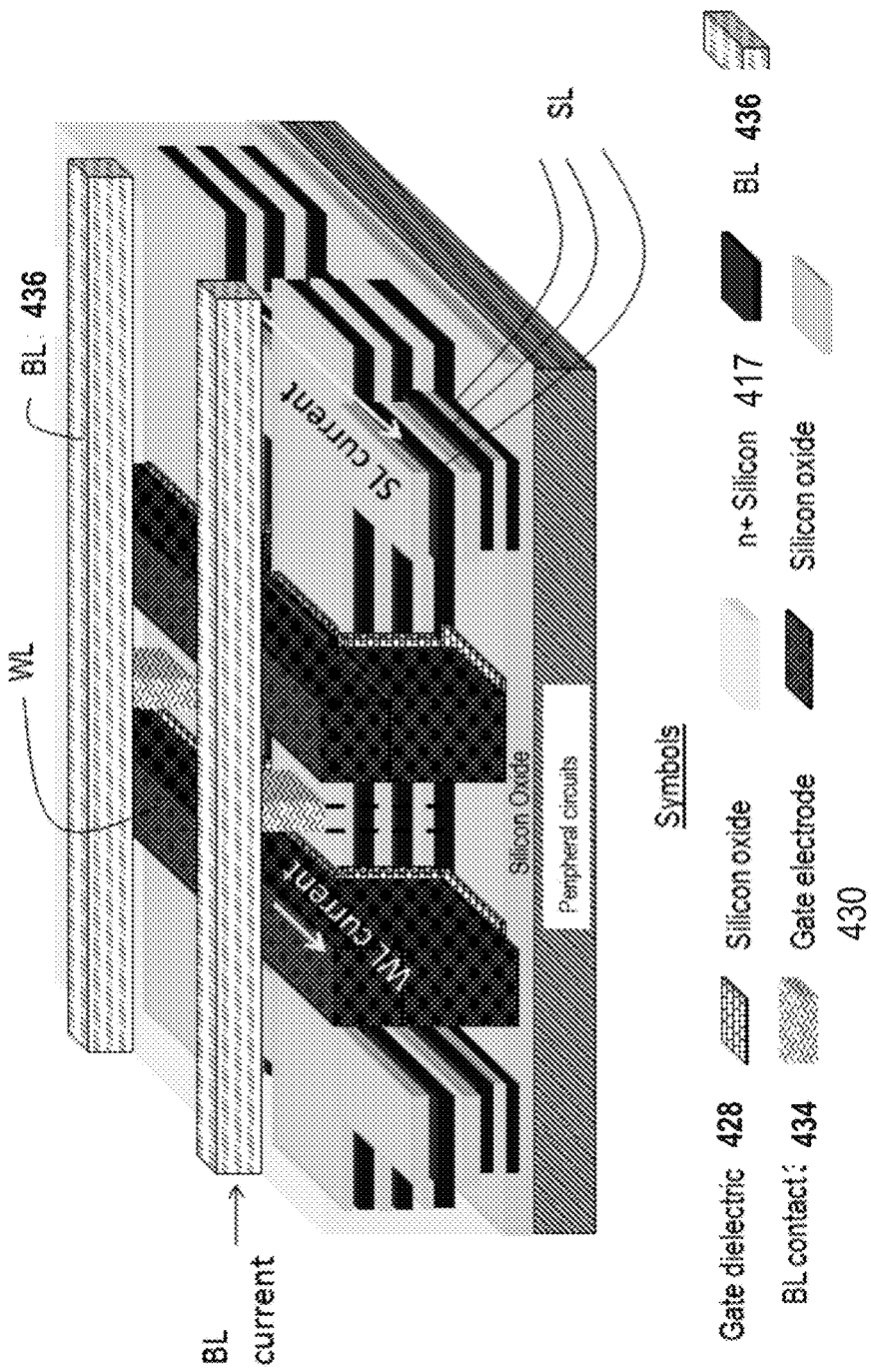

Step (K): FIG. 4K illustrates the structure after Step (K). BLs 436 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (K) as well.

Figure 4L:
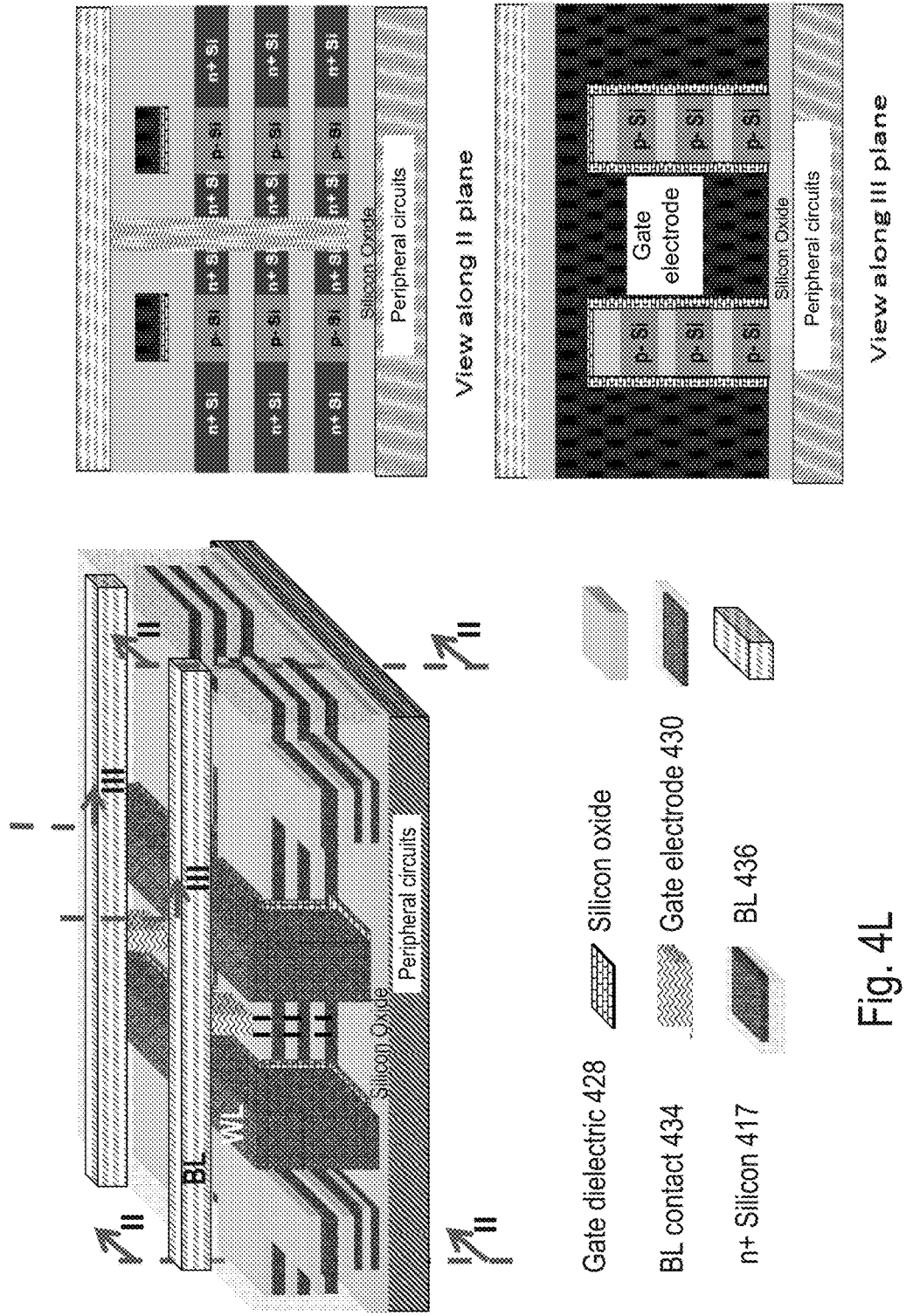

FIG. 4L shows cross-sectional views of the array for clarity. The double-gated transistors in FIG. 4 L can be utilized along with the floating body effect for storing information.

Figure 4M:
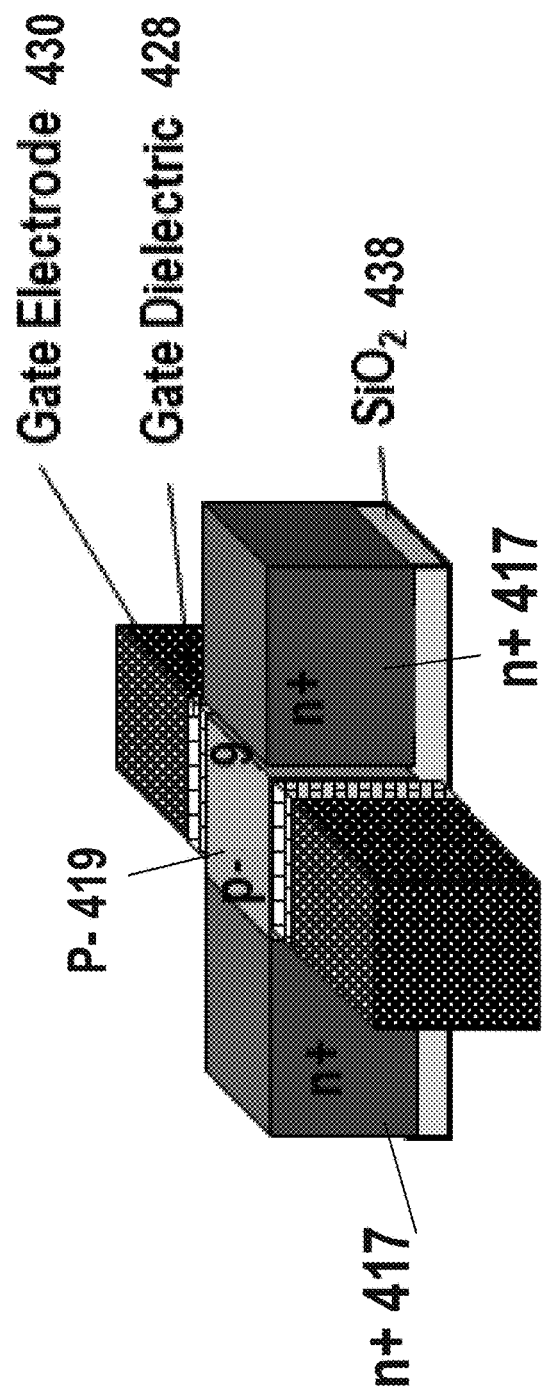

FIG. 4M shows a memory cell of the floating body RAM array with two gates on either side of the p– Si layer 419.

A floating-body DRAM has thus been constructed, with (1) horizontally-oriented transistors—i.e., current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

FIGS. 5A-K describe an alternative process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIG. 5A-K, and all other masks are shared between different layers. The process flow may include several steps in the following sequence.

Figure 5A:
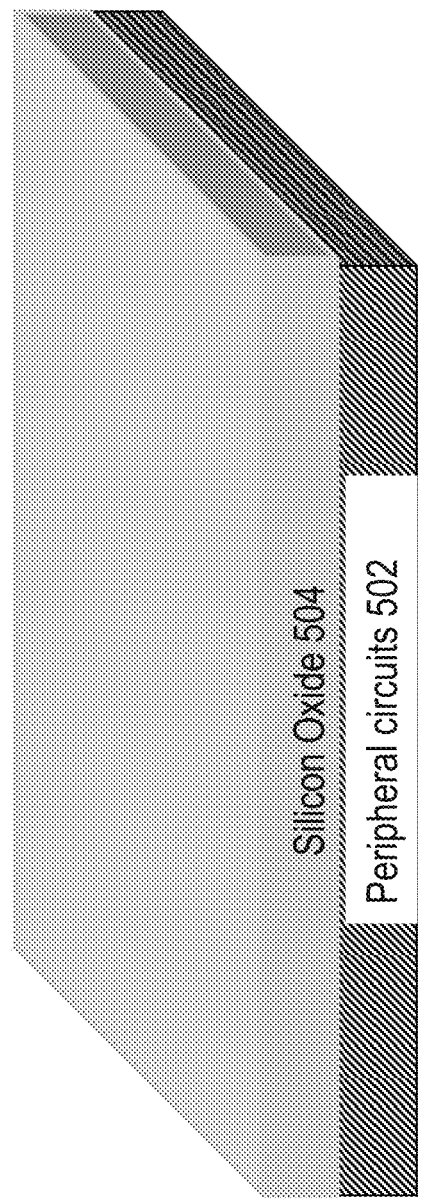

Step (A): Peripheral circuits with tungsten wiring 502 are first constructed and above this oxide layer 504 is deposited. FIG. 5A shows a drawing illustration after Step (A).

Figure 5B:
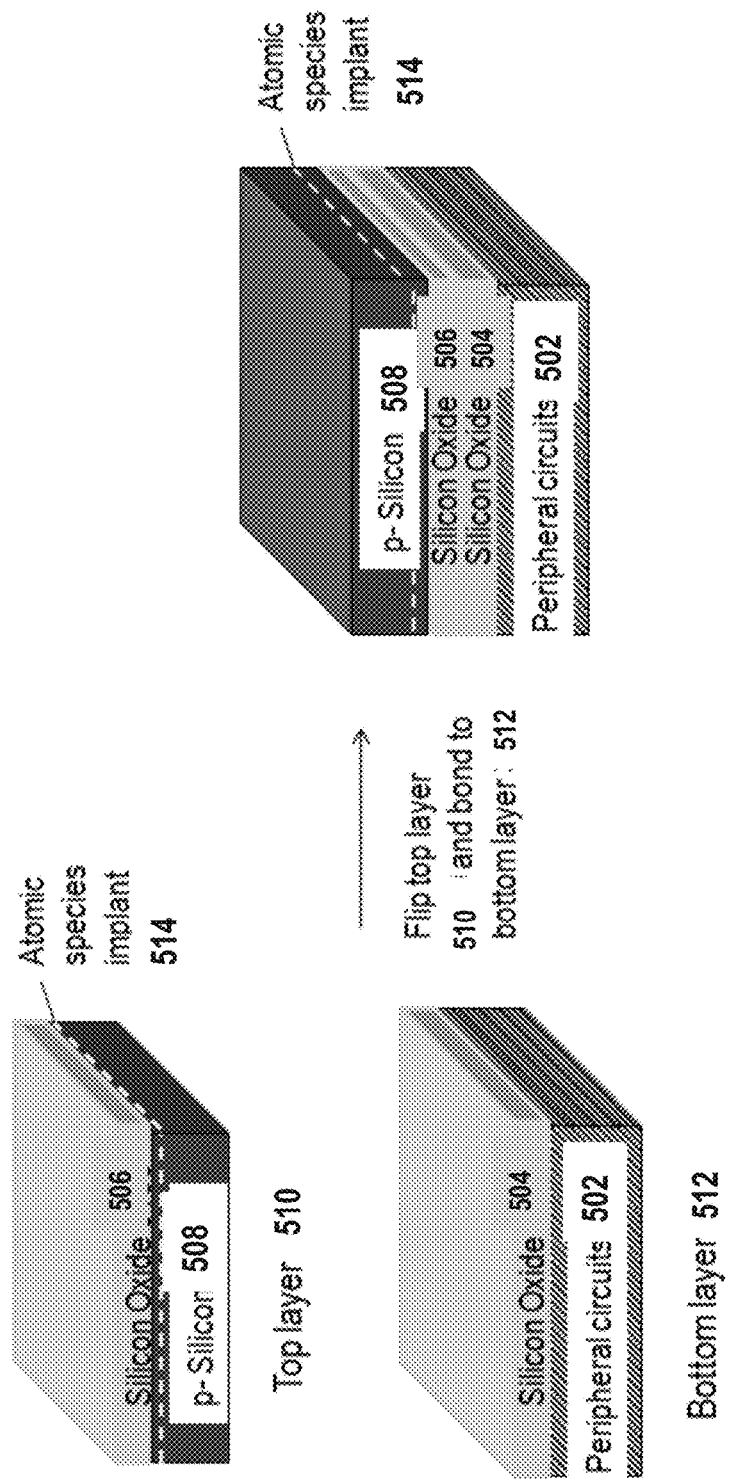

Step (B): FIG. 5B illustrates the structure after Step (B). A p– Silicon wafer 508 has an oxide layer 506 grown or deposited above it. Following this, hydrogen is implanted into the p– Silicon wafer at a certain depth indicated by 514. Alternatively, some other atomic species such as Helium could be (co-)implanted. This hydrogen implanted p– Silicon wafer 508 forms the top layer 510. The bottom layer 512 may include the peripheral circuits 502 with oxide layer 504. The top layer 510 is flipped and bonded to the bottom layer 512 using oxide-to-oxide bonding.

Figure 5C:
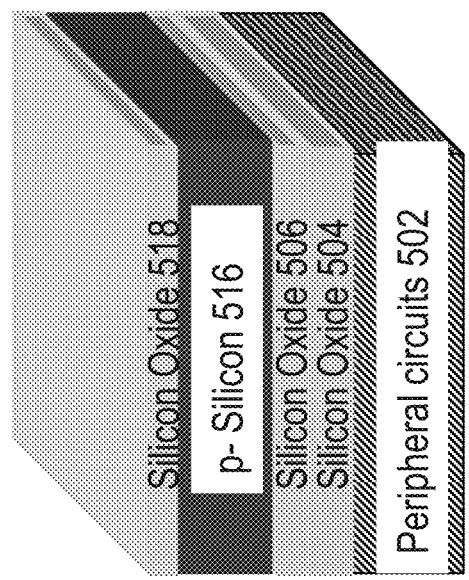

Step (C): FIG. 5C illustrates the structure after Step (C). The stack of top and bottom wafers after Step (B) is cleaved at the hydrogen plane 514 using either a anneal or a sideways mechanical force or other means. A CMP process is then conducted. A layer of silicon oxide 518 is then deposited atop the p– Silicon layer 516. At the end of this step, a single-crystal p– Silicon layer 516 exists atop the peripheral circuits, and this has been achieved using layer-transfer techniques.

Figure 5D:
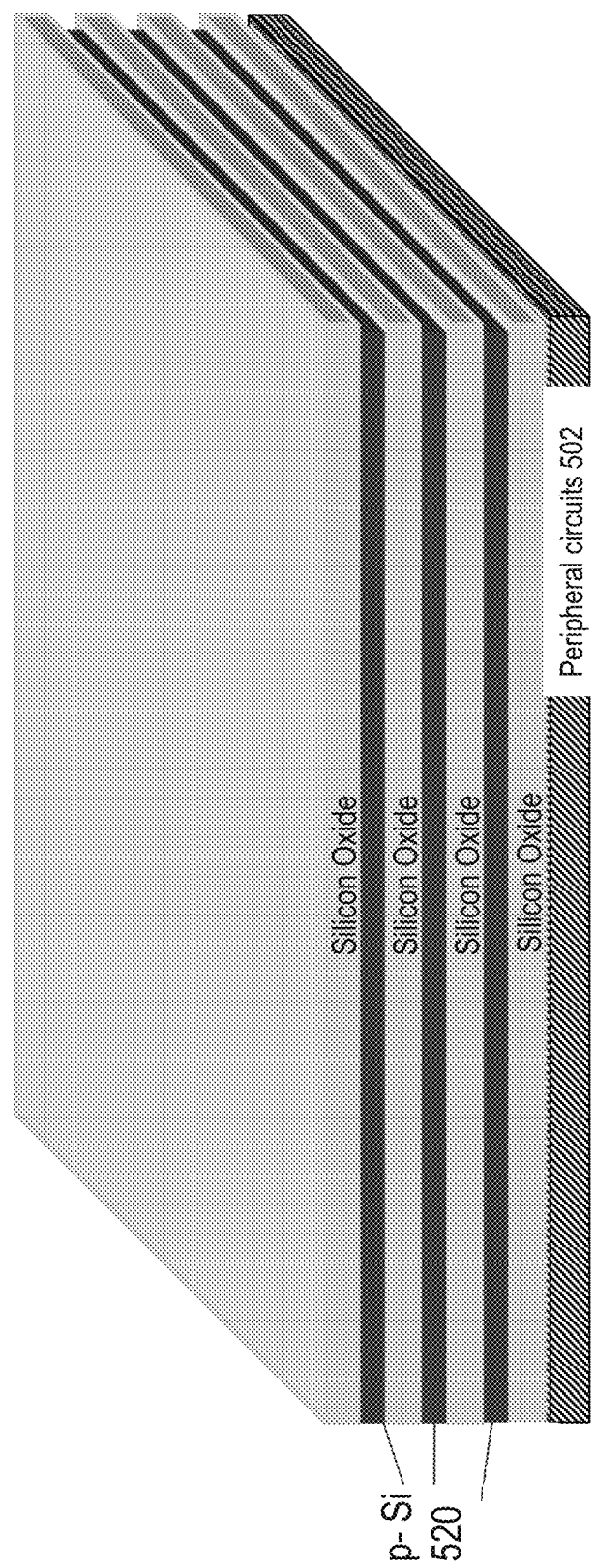

Step (D): FIG. 5D illustrates the structure after Step (D). Using methods similar to Step (B) and (C), multiple p– silicon layers 520 are formed with silicon oxide layers in between.

Figure 5E:
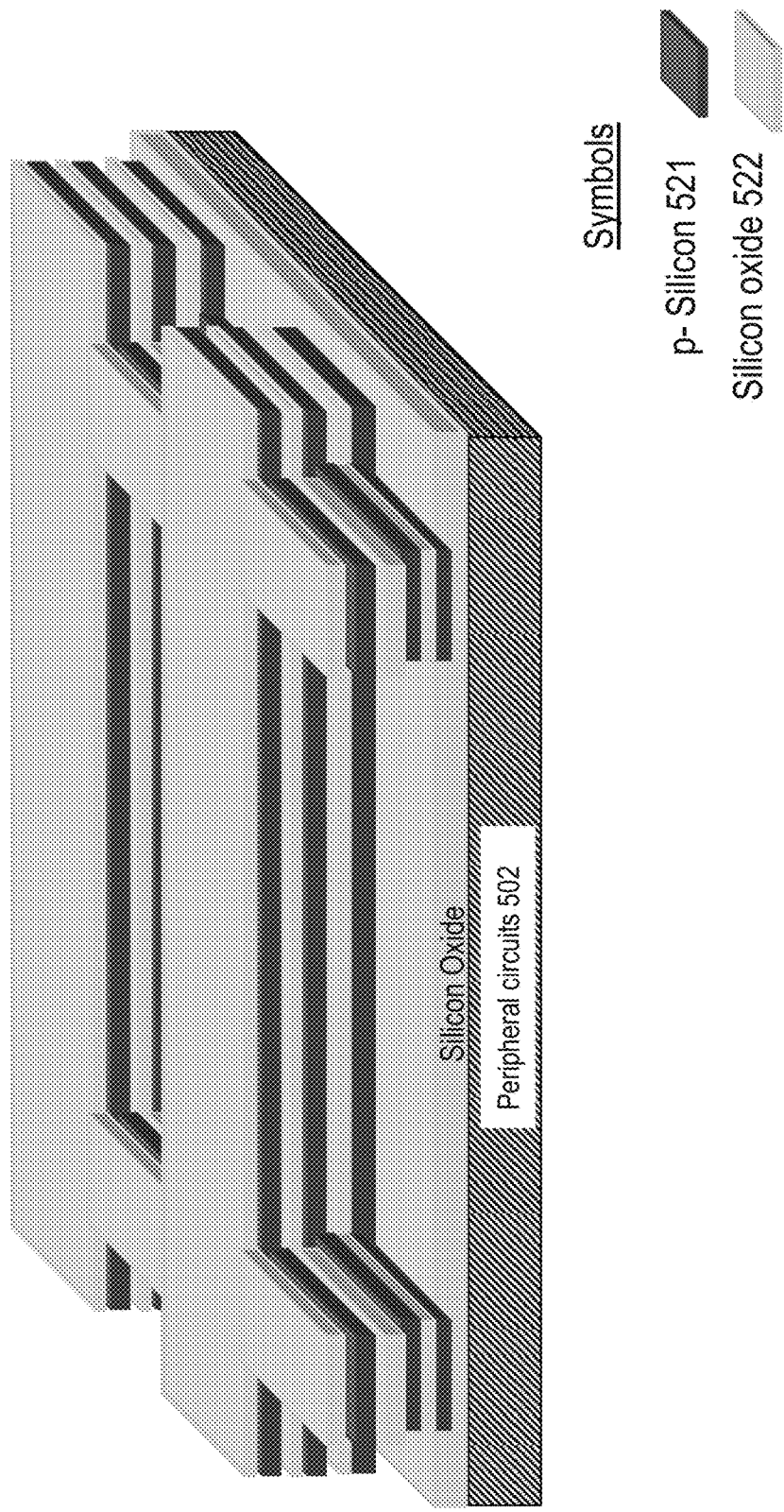

Step (E): FIG. 5E illustrates the structure after Step (E). Lithography and etch processes are then utilized to make a structure as shown in the figure.

Step (F): FIG. 5F illustrates the structure after Step (F). Gate dielectric 526 and gate electrode 524 are then deposited following which a CMP is done to planarize the gate electrode 524 regions. Lithography and etch are utilized to define gate regions.

Step (G): FIG. 5G illustrates the structure after Step (G). Using the hard mask defined in Step (F), p– regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 5H:
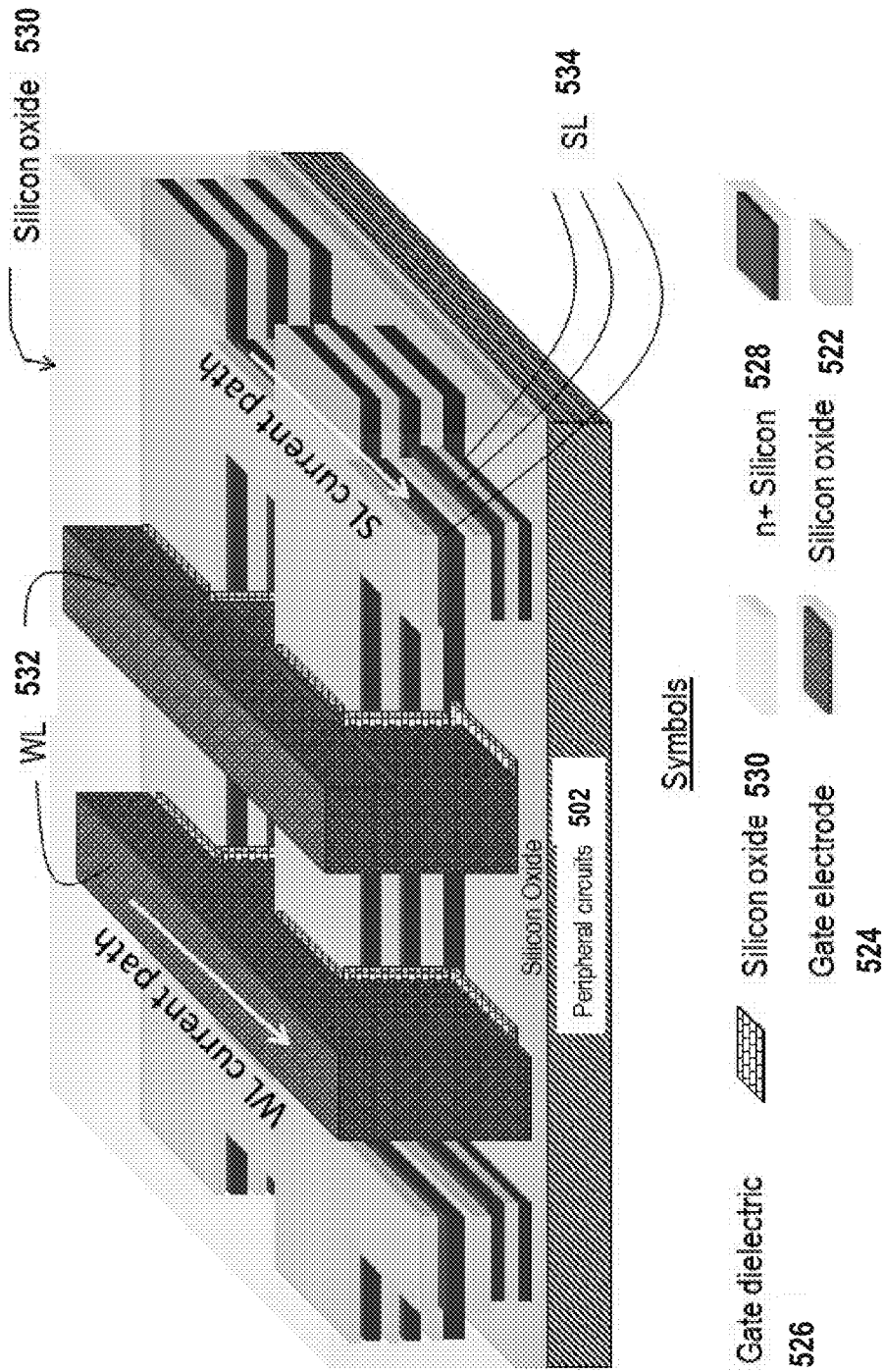
Figure 51:
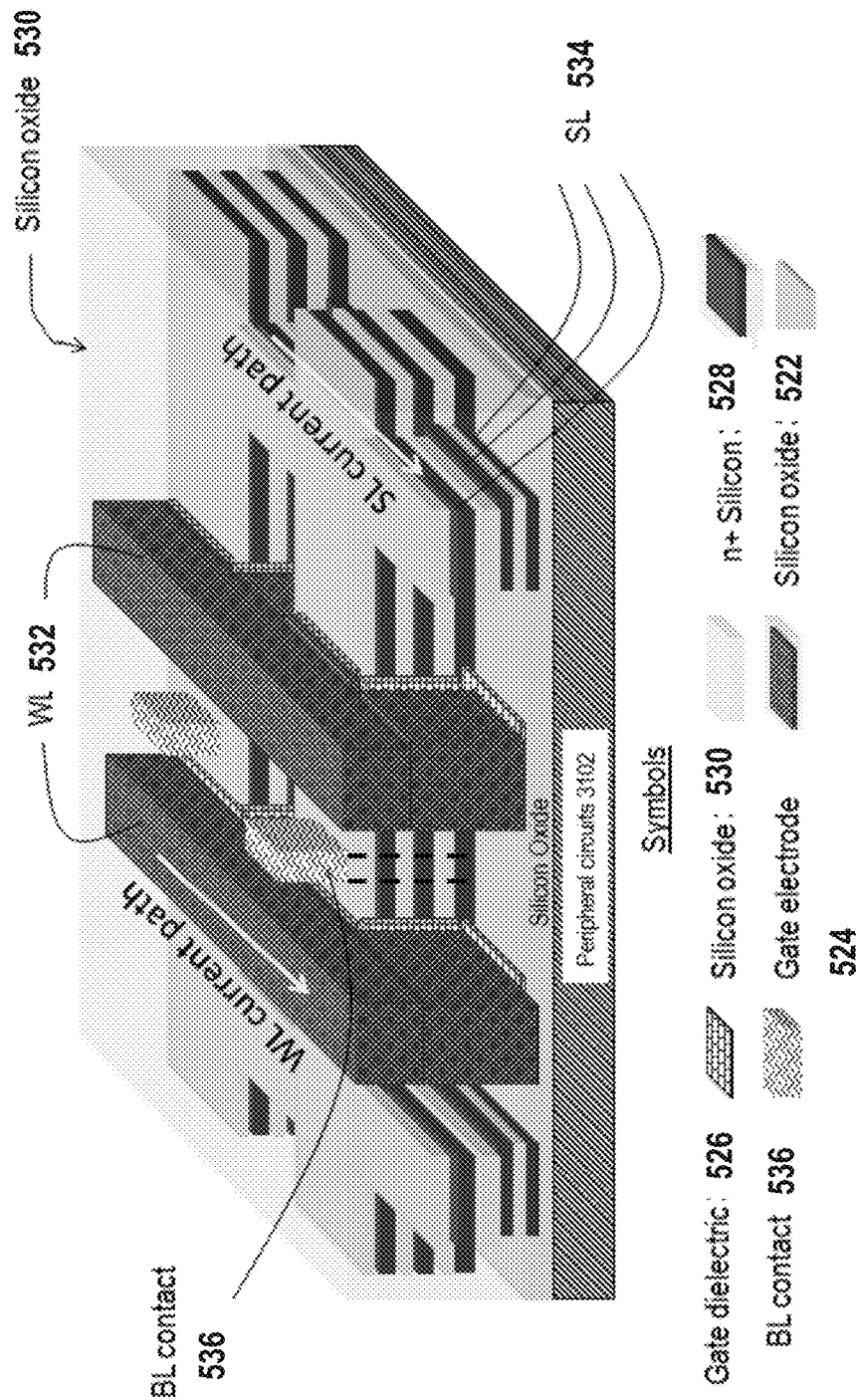

Step (H): FIG. 5H illustrates the structure after Step (H). A silicon oxide layer 530 is then deposited and planarized.

For clarity, the silicon oxide layer is shown transparent, along with word-line (WL) 532 and source-line (SL) 534 regions.

Step (I): FIG. 5I illustrates the structure after Step (I). Bit-line (BL) contacts 536 are formed by etching and deposition. These BL contacts are shared among all layers of memory.

Figure 5J:
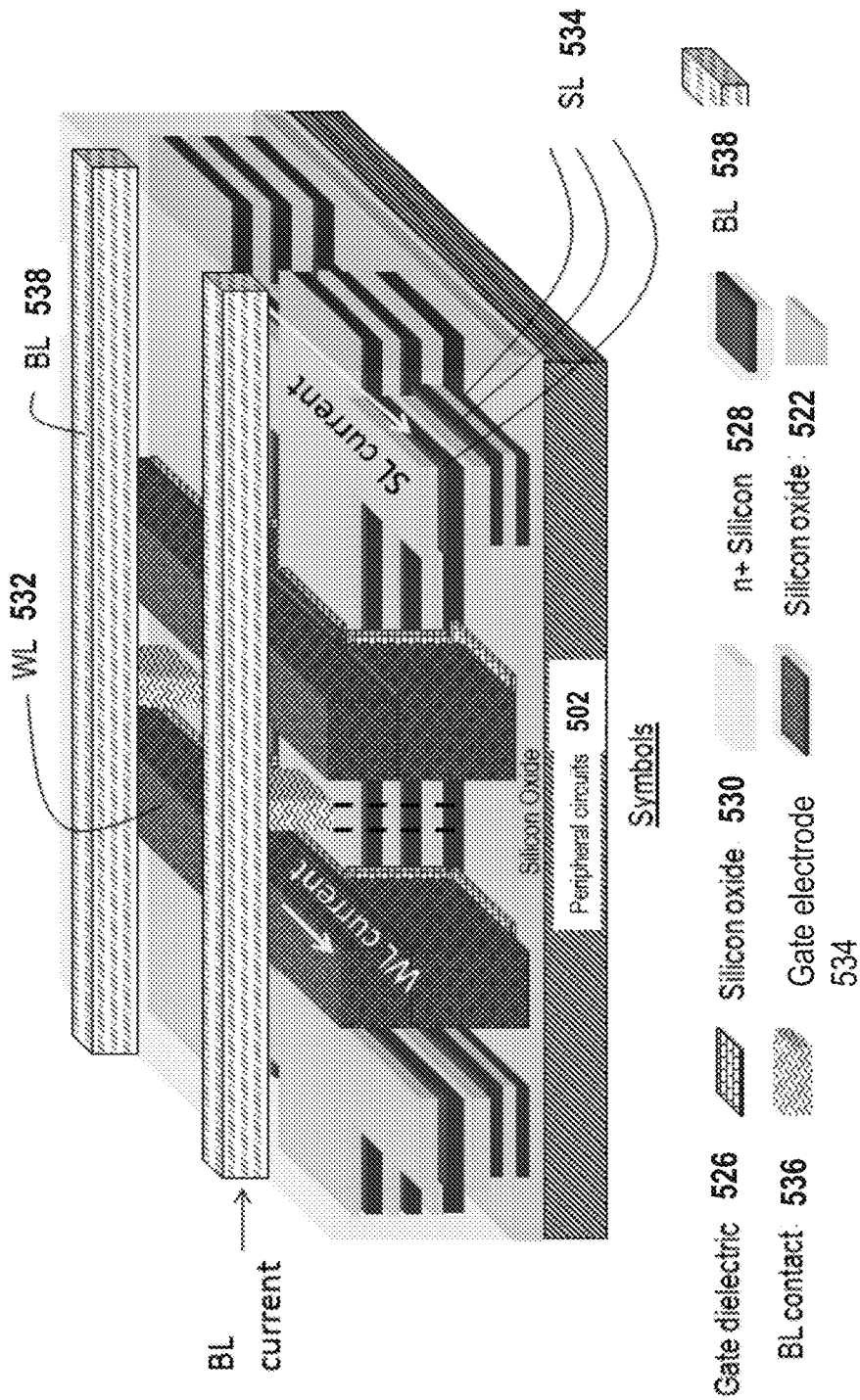
Figure 5K:
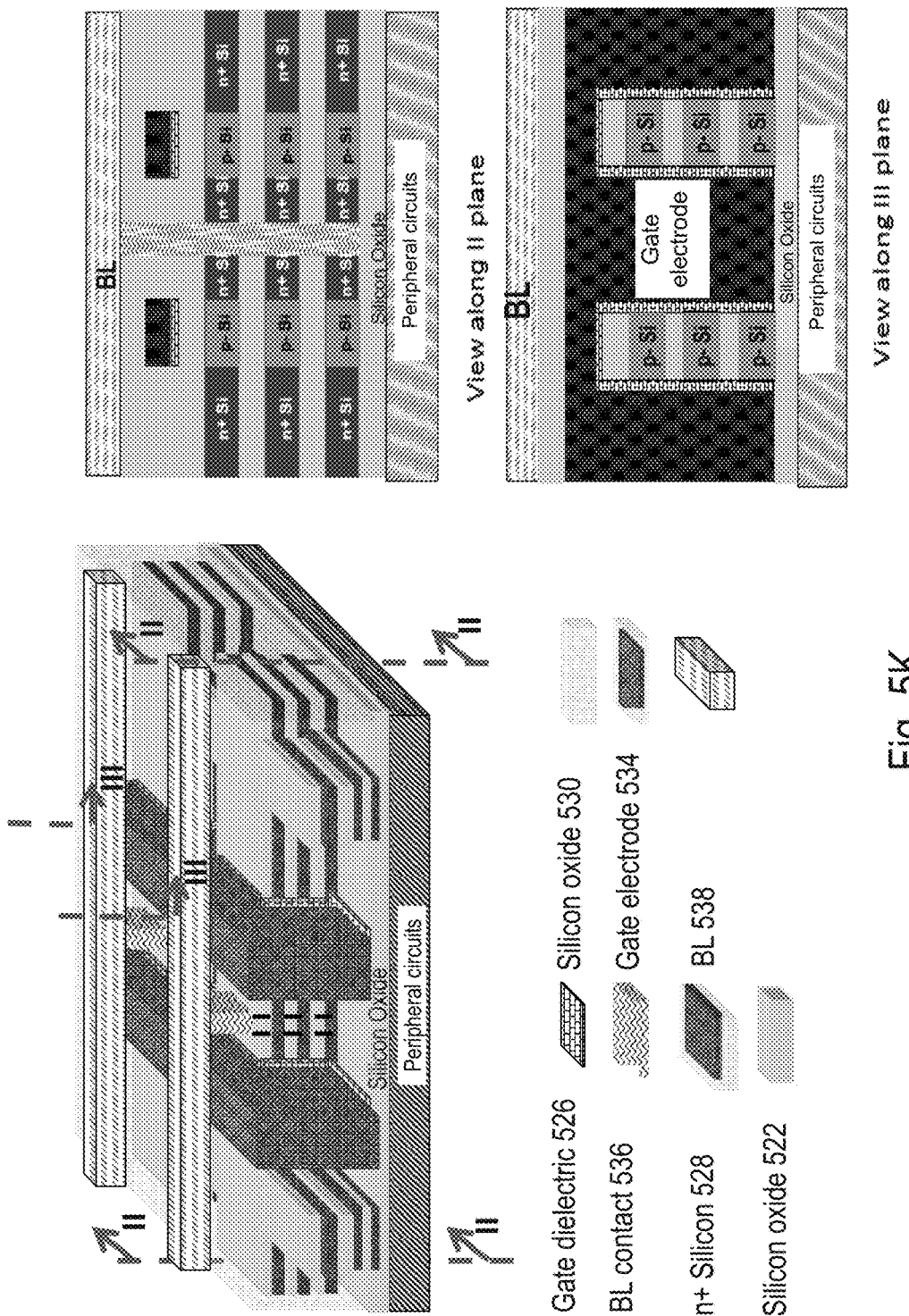

Step (J): FIG. 5J illustrates the structure after Step (J). BLs 538 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

FIG. 31K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

FIG. 9A-J describes an alternative process flow to construct a horizontally-oriented monolithic 3D DRAM. This monolithic 3D DRAM utilizes the floating body effect and independently addressable double-gate transistors. One mask is utilized on a "per-memory-layer" basis for the monolithic 3D DRAM concept shown in FIG. 9A-J, while other masks are shared between different layers. Independently addressable double-gated transistors provide an increased flexibility in the programming, erasing and operating modes of floating body DRAMs. The process flow may include several steps that occur in the following sequence.

Figure 9A:
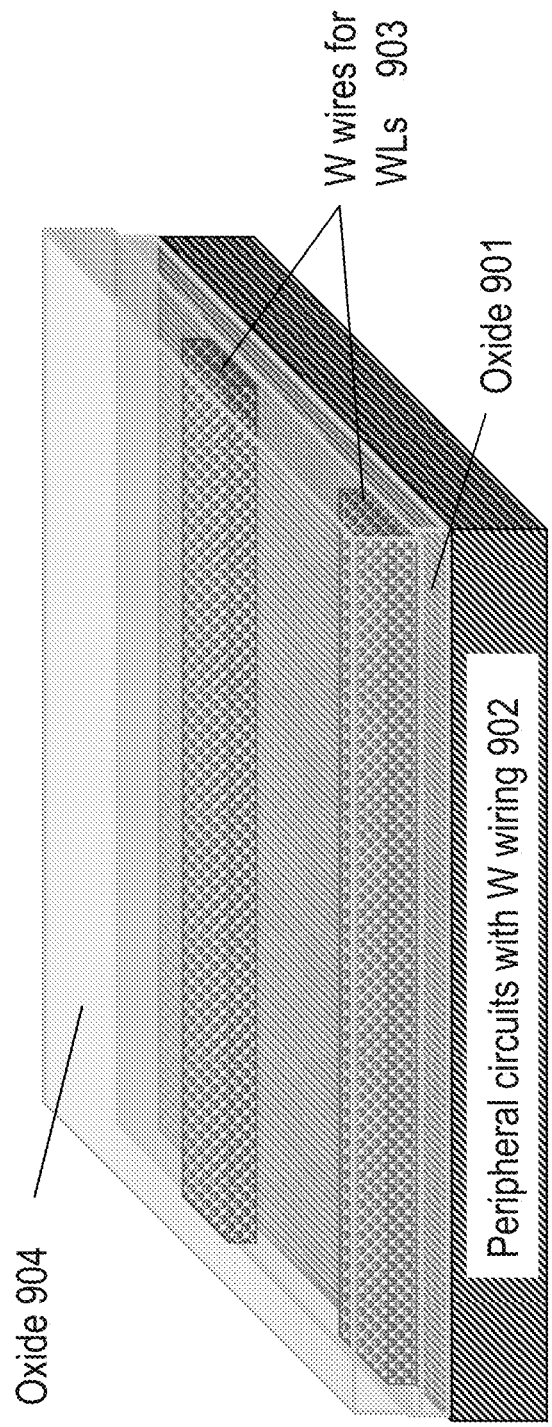
FIGS. 9A-9J illustrates a technique to construct a horizontally-oriented monolithic 3D DRAM that utilizes the floating body effect and has independently addressable double-gate transistors.

Step (A): Peripheral circuits 902 with tungsten (W) wiring may be constructed. Isolation, such as oxide 901, may be deposited on top of peripheral circuits 902 and tungsten word line (WL) wires 903 may be constructed on top of oxide 901. WL wires 903 may be coupled to the peripheral circuits 902 through metal vias (not shown). Above WL wires 903 and filling in the spaces, oxide layer 904 is deposited and may be chemically mechanically polished (CMP) in preparation for oxide-oxide bonding. FIG. 9A illustrates the structure after Step (A).

Figure 9B:
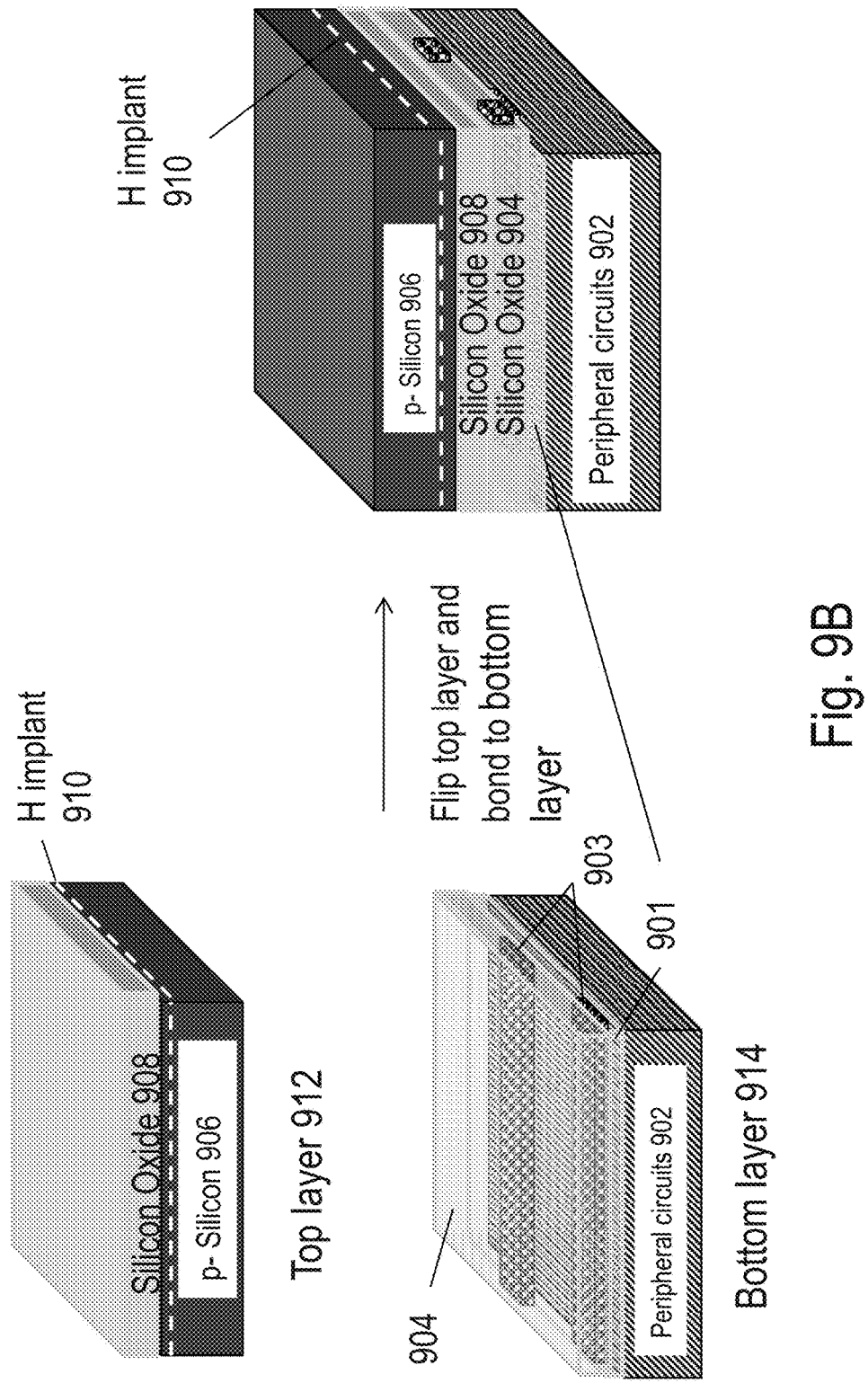

Step (B): FIG. 9B shows a drawing illustration after Step (B). A p− Silicon wafer 906 has an oxide layer 908 grown or deposited above it. Following this, hydrogen is implanted into the p− Silicon wafer at a certain depth indicated by dashed lines as hydrogen plane 910. Alternatively, some other atomic species such as Helium could be (co-)implanted. This hydrogen implanted p− Silicon wafer 906 forms the top layer 912. The bottom layer 914 may include the peripheral circuits 902 with oxide layer 904, WL wires 903 and oxide 901. The top layer 912 may be flipped and bonded to the bottom layer 914 using oxide-to-oxide bonding of oxide layer 904 to oxide layer 908.

Figure 9C:
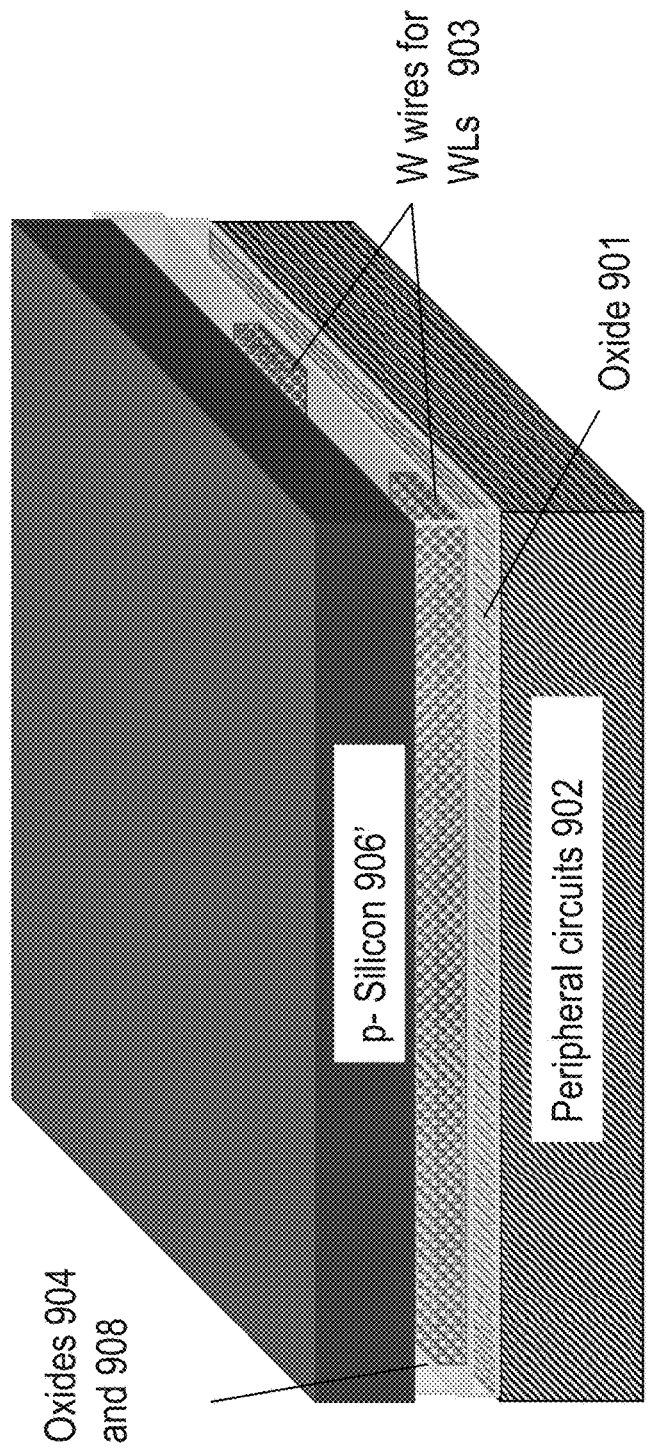

Step (C): FIG. 9C illustrates the structure after Step (C). The stack of top and bottom wafers after Step (B) is cleaved at the hydrogen plane 910 using either an anneal, a sideways mechanical force or other means of cleaving or thinning the top layer 912 described elsewhere in this document. A CMP process may then be conducted. At the end of this step, a single-crystal p− Si layer 906' exists atop the peripheral circuits, and this has been achieved using layer-transfer techniques.

Figure 9D:
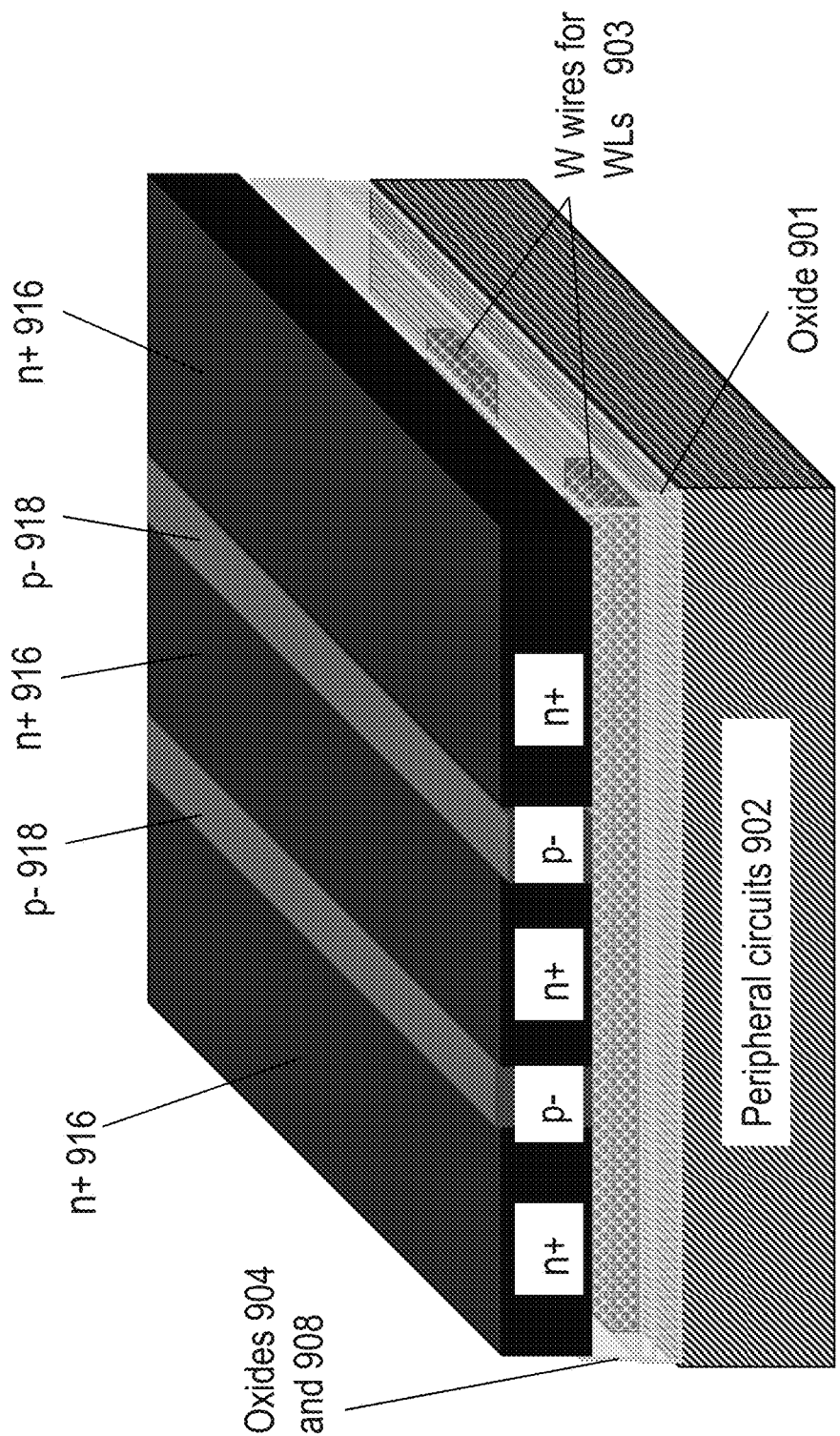

Step (D): FIG. 9D illustrates the structure after Step (D). Using lithography and then ion implantation or other semiconductor doping methods such as plasma assisted doping (PLAD), n+ regions 916 and p− regions 918 are formed on the transferred layer of p− Si after Step (C).

Figure 9E:
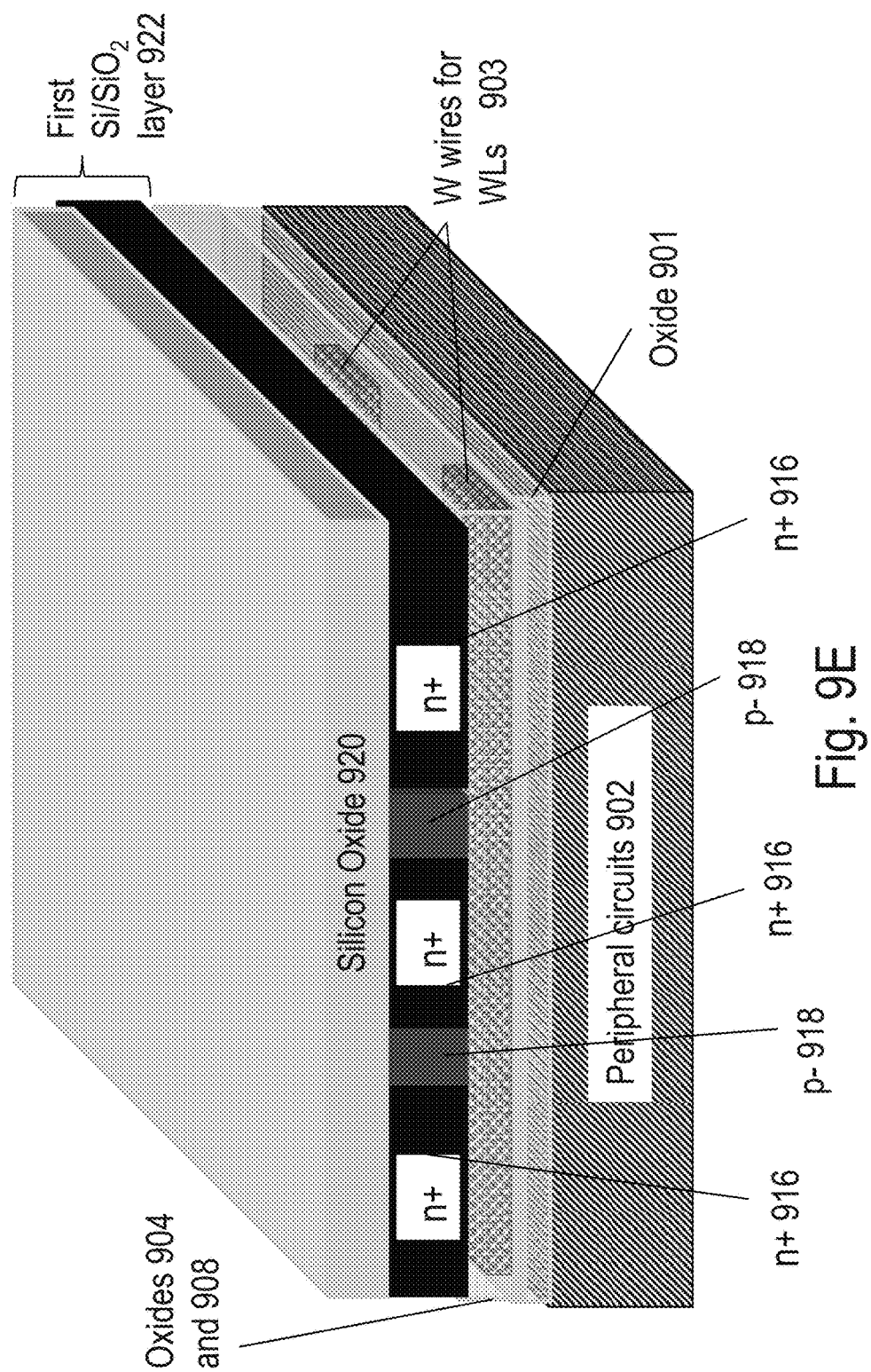

Step (E): FIG. 9E illustrates the structure after Step (E). An oxide layer 920 is deposited atop the structure obtained after Step (D). A first layer of $Si/SiO_2$ 922 is therefore formed atop the peripheral circuits 902, oxide 901, WL wires 903, oxide layer 904 and oxide layer 908.

Figure 9F:
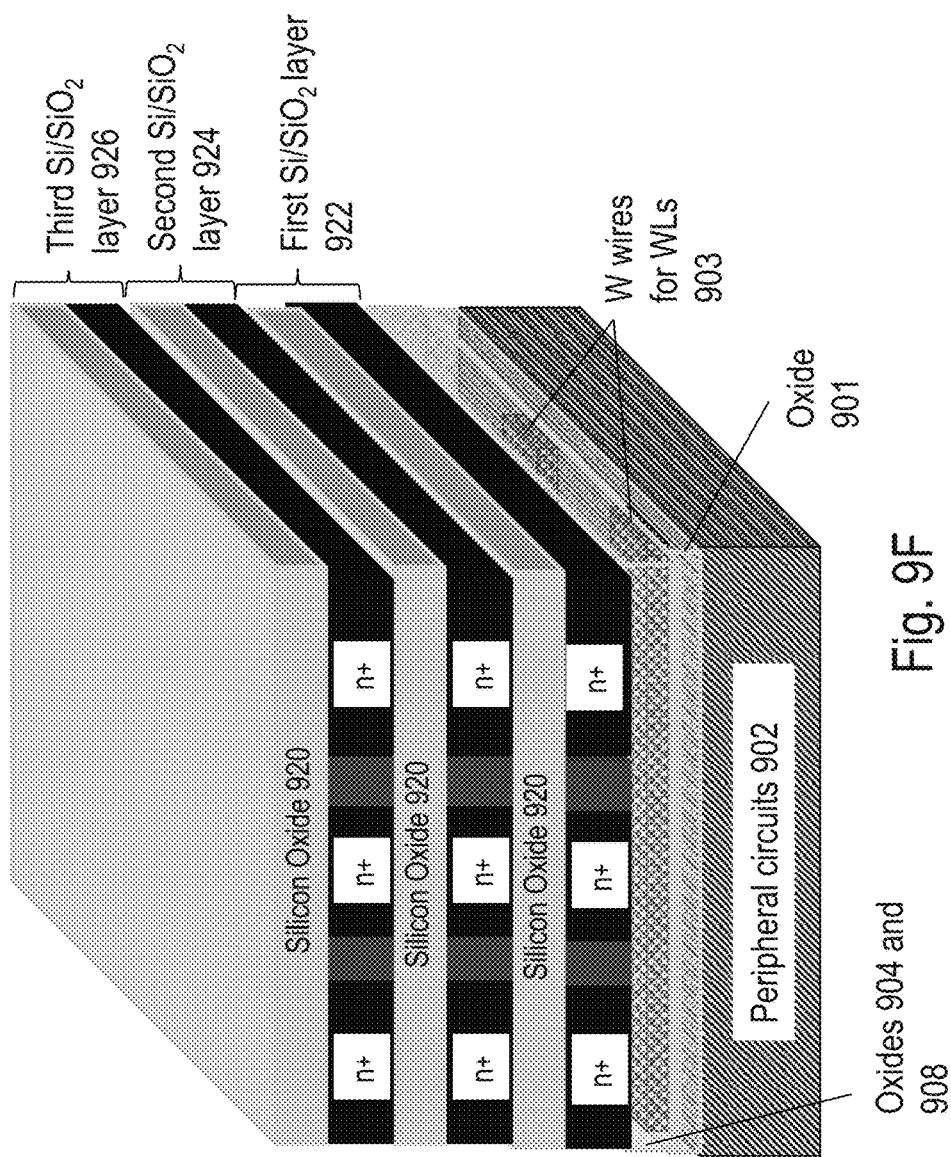

Step (F): FIG. 9F illustrates the structure after Step (F). Using procedures similar to Steps (B)-(E), additional $Si/SiO_2$ layers 924 and 926 are formed atop $Si/SiO_2$ layer 922. A rapid thermal anneal (RTA) or spike anneal or flash anneal or laser anneal may then be done to activate all implanted or doped regions within $Si/SiO_2$ layers 922, 924 and 926 (and possibly also the peripheral circuits 902). Alternatively, the $Si/SiO_2$ layers 922, 924 and 926 may be annealed layer-by-layer as soon as their implantations or dopings are done using an optical anneal system such as a laser anneal system. A CMP polish/plasma etch stop layer (not shown), such as silicon nitride, may be deposited on top of the topmost $Si/SiO_2$ layer, for example third $Si/SiO_2$ layer 926.

Figure 9G:
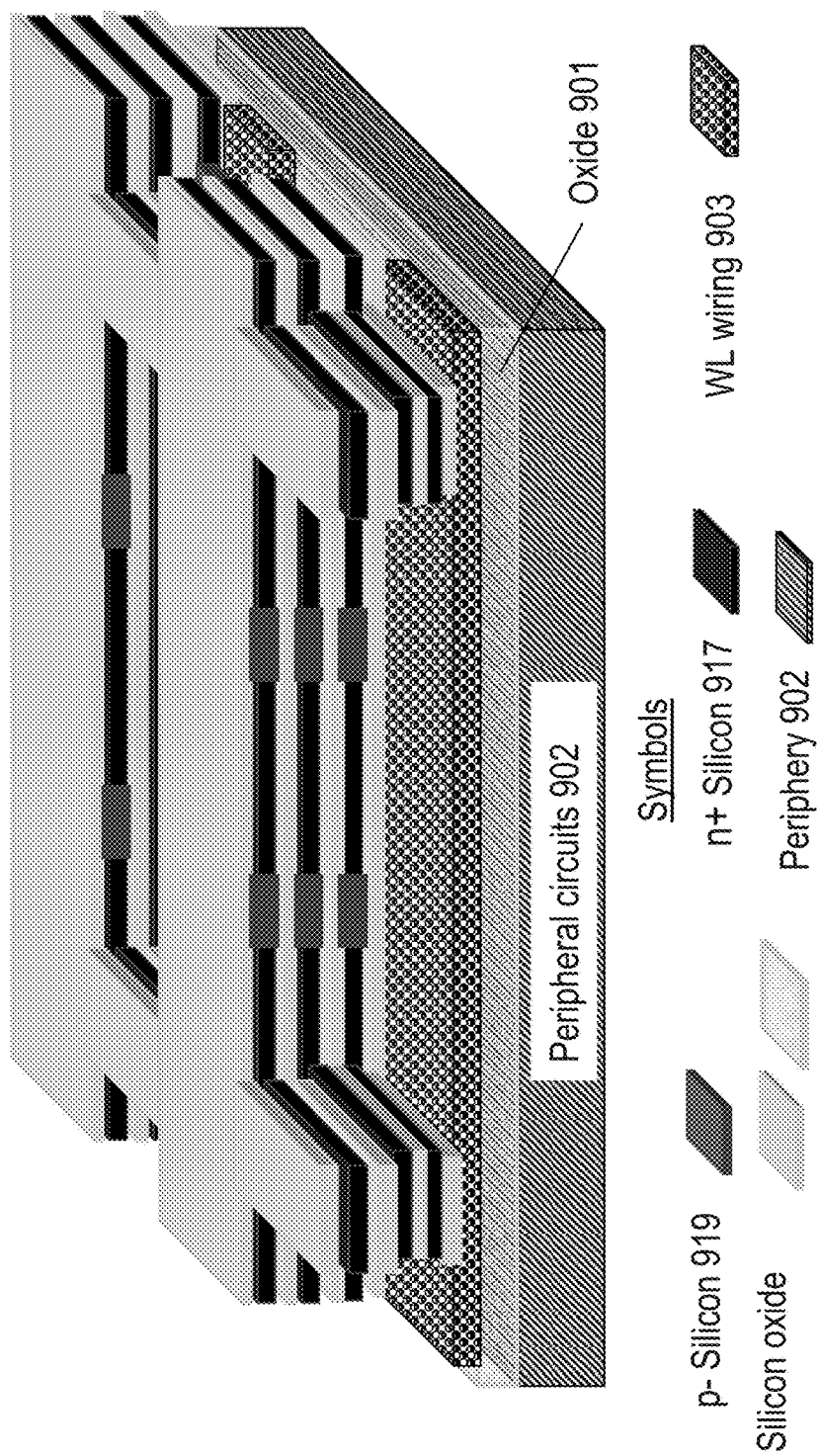

Step (G): FIG. 9G illustrates the structure after Step (G). Lithography and etch processes are then utilized to make an exemplary structure as shown in FIG. 9G, thus forming n+ regions 917, p− regions 919, and associated oxide regions.

Figure 9H:
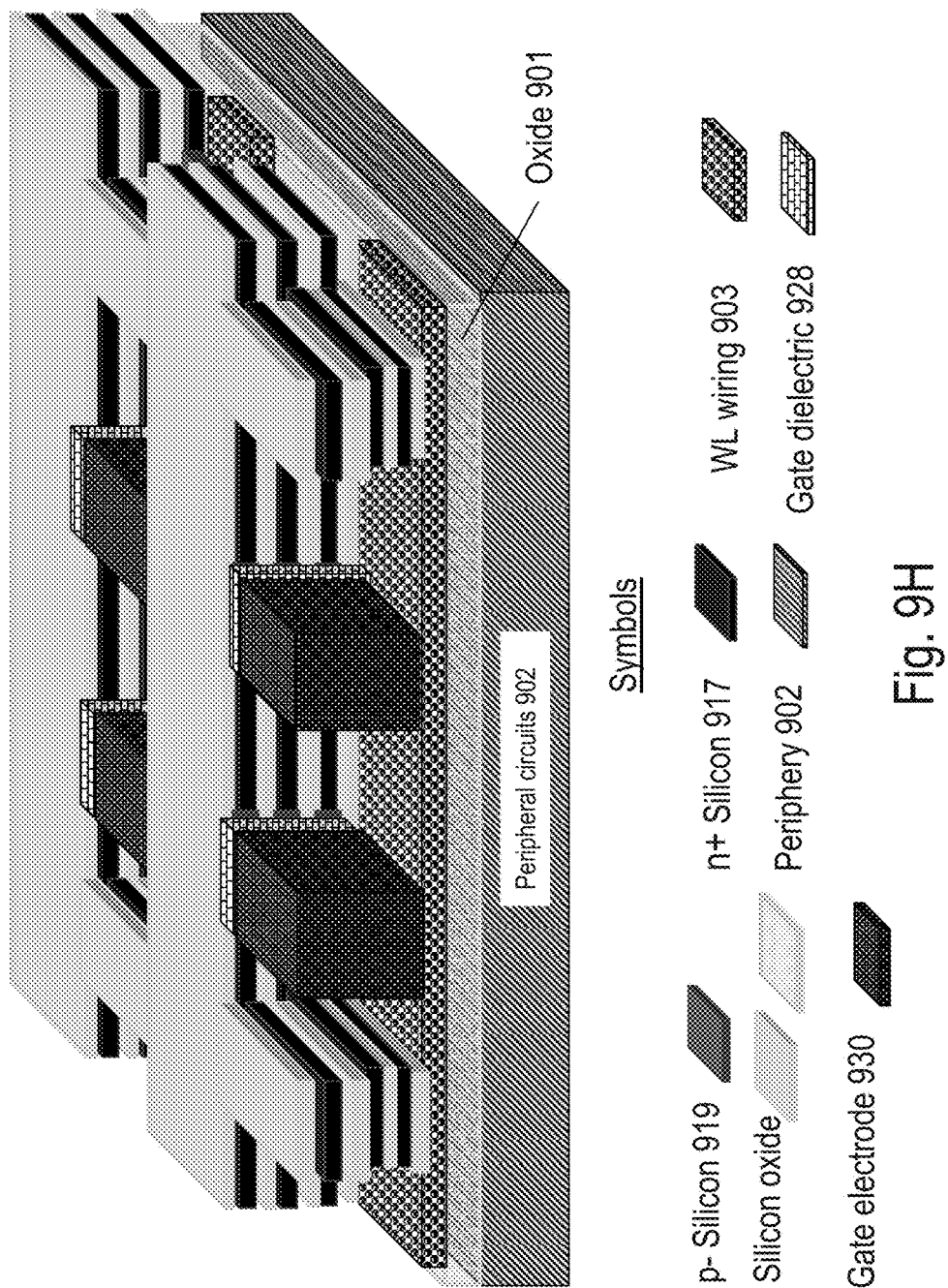

Step (H): FIG. 9H illustrates the structure after Step (H). Gate dielectric 928 may be deposited and then an etch-back process may be employed to clear the gate dielectric from the top surface of WL wires 903. Then gate electrode 930 may be deposited such that an electrical coupling may be made from WL wires 903 to gate electrode 930. A CMP is done to planarize the gate electrode 930 regions such that the gate electrode 930 forms many separate and electrically disconnected regions. Lithography and etch are utilized to define gate regions over the p− silicon regions (eg. p− Si regions 919 after Step (G)). Note that gate width could be slightly larger than p− region width to compensate for overlay errors in lithography. A silicon oxide layer is then deposited and planarized. For clarity, the silicon oxide layer is shown transparent in the figure.

Figure 9I:
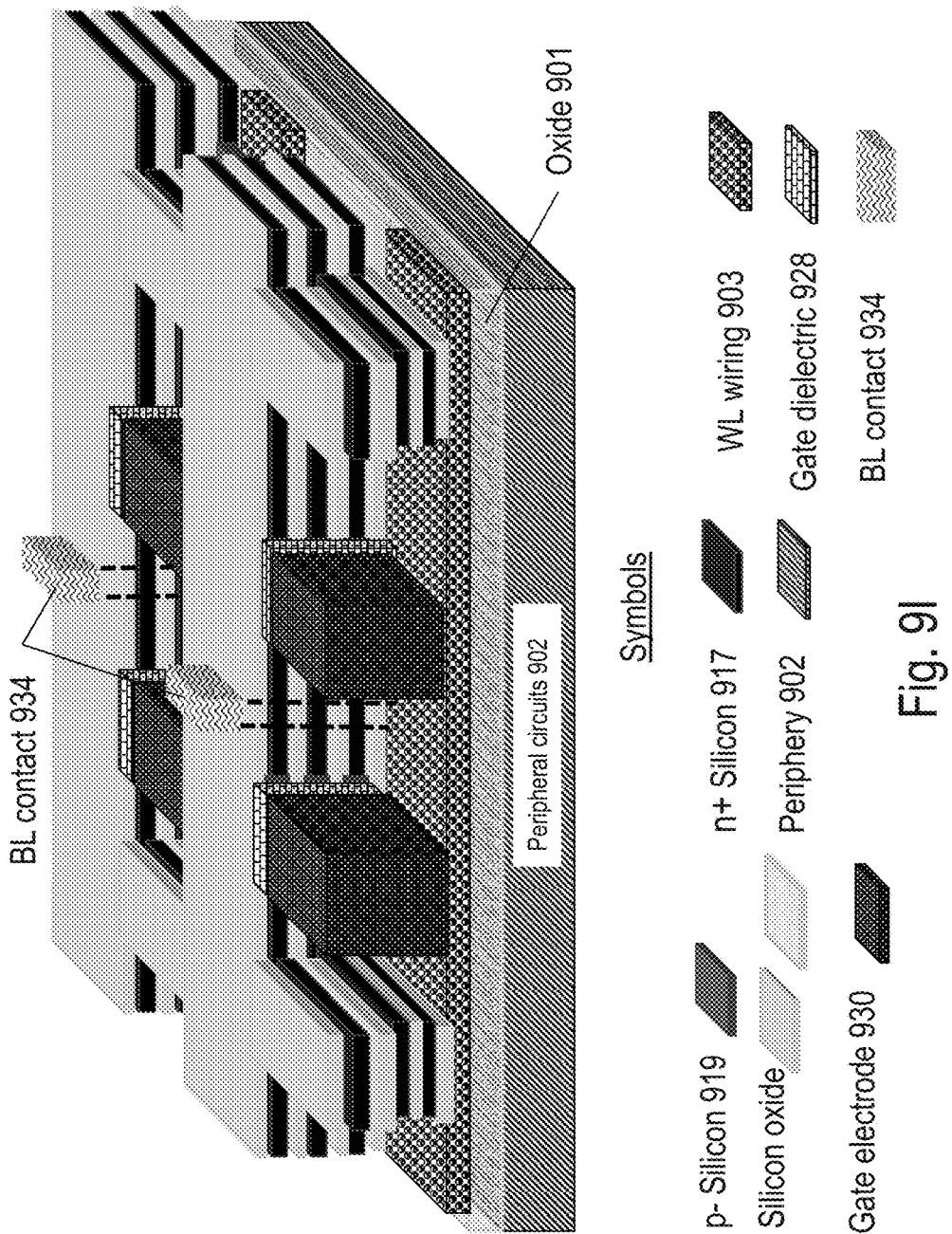

Step (I): FIG. 9I illustrates the structure after Step (I). Bit-line (BL) contacts 934 are formed by etching and deposition. These BL contacts are shared among all layers of memory.

Figure 9J:
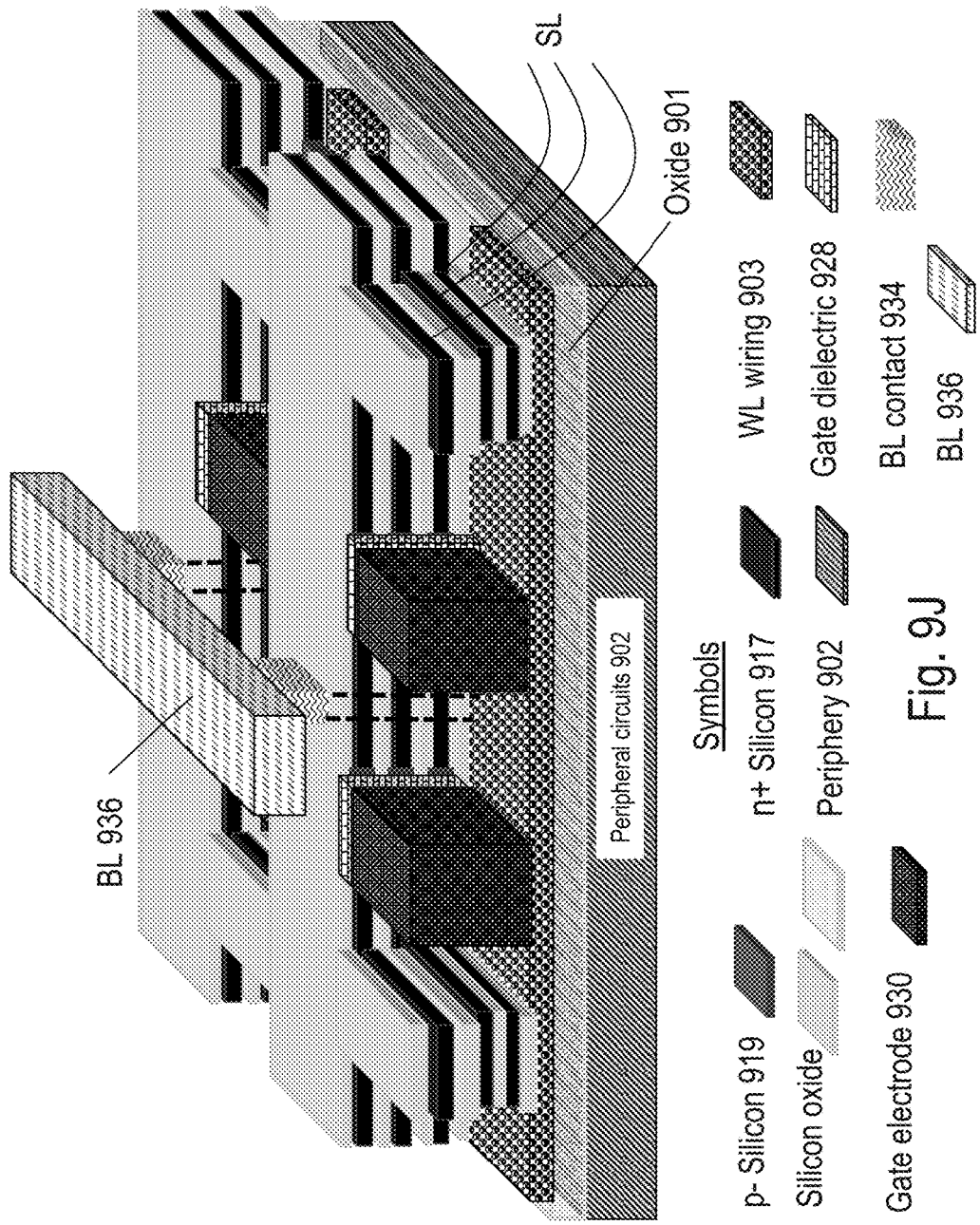

Step (J): FIG. 9J illustrates the structure after Step (J). Bit Lines (BLs) 936 are then constructed. SL contacts (not shown) can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

A floating-body DRAM has thus been constructed, with (1) horizontally-oriented transistors—i.e., current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers and independently addressable, and (4) monocrystalline (or single-crystal) silicon layers obtained by layer transfer techniques such as ion-cut. WL wires 903 need not be on the top layer of the peripheral circuits 902, they may be integrated. WL wires 903 may be constructed of another high temperature resistant material, such as NiCr.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIGS. 4A-M and 5A-K may be modified. FIGS. 9A-J is one example of how process modification may be made to achieve independently addressable double gates. Moreover, selective epi technology or laser recrystallization technology could be utilized for implementing structures shown in FIGS. 4A-M, FIGS. 5A-K, and FIGS. 9A-J. Various other types of layer transfer schemes that have been described in Section 1.3.4 can be utilized for construction of various 3D DRAM structures. Furthermore, buried wiring, i.e. where wiring for memory arrays is below the memory layers but above the periphery, may also be used. This may permit the use of low melting point metals, such as aluminum or copper, for some of the memory wiring While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, conductive bridge RAM, and MRAM. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIGS. 6A-J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 6A-J, and all other masks are shared between different layers. The process flow may include several steps that occur in the following sequence.

Figure 6A:
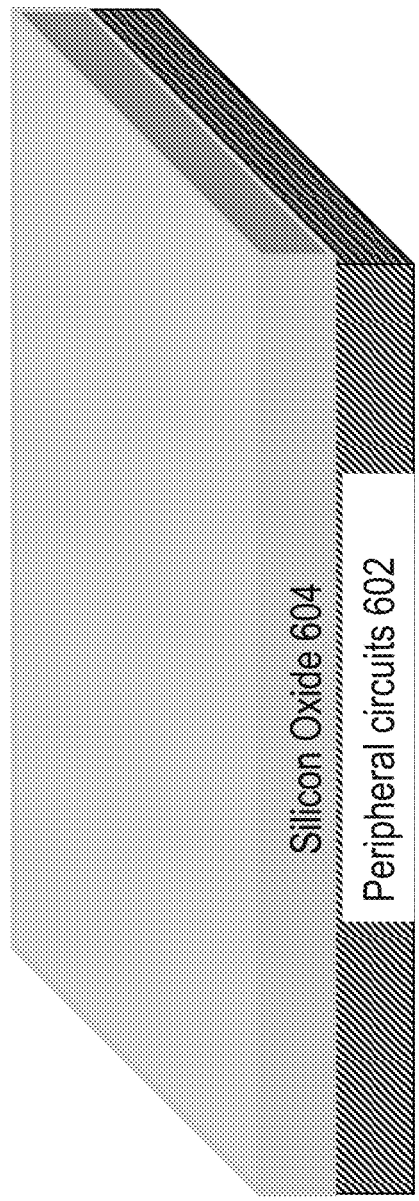

Step (A): Peripheral circuits 602 are first constructed and above this oxide layer 604 is deposited. FIG. 6A shows a drawing illustration after Step (A).

Figure 6B:
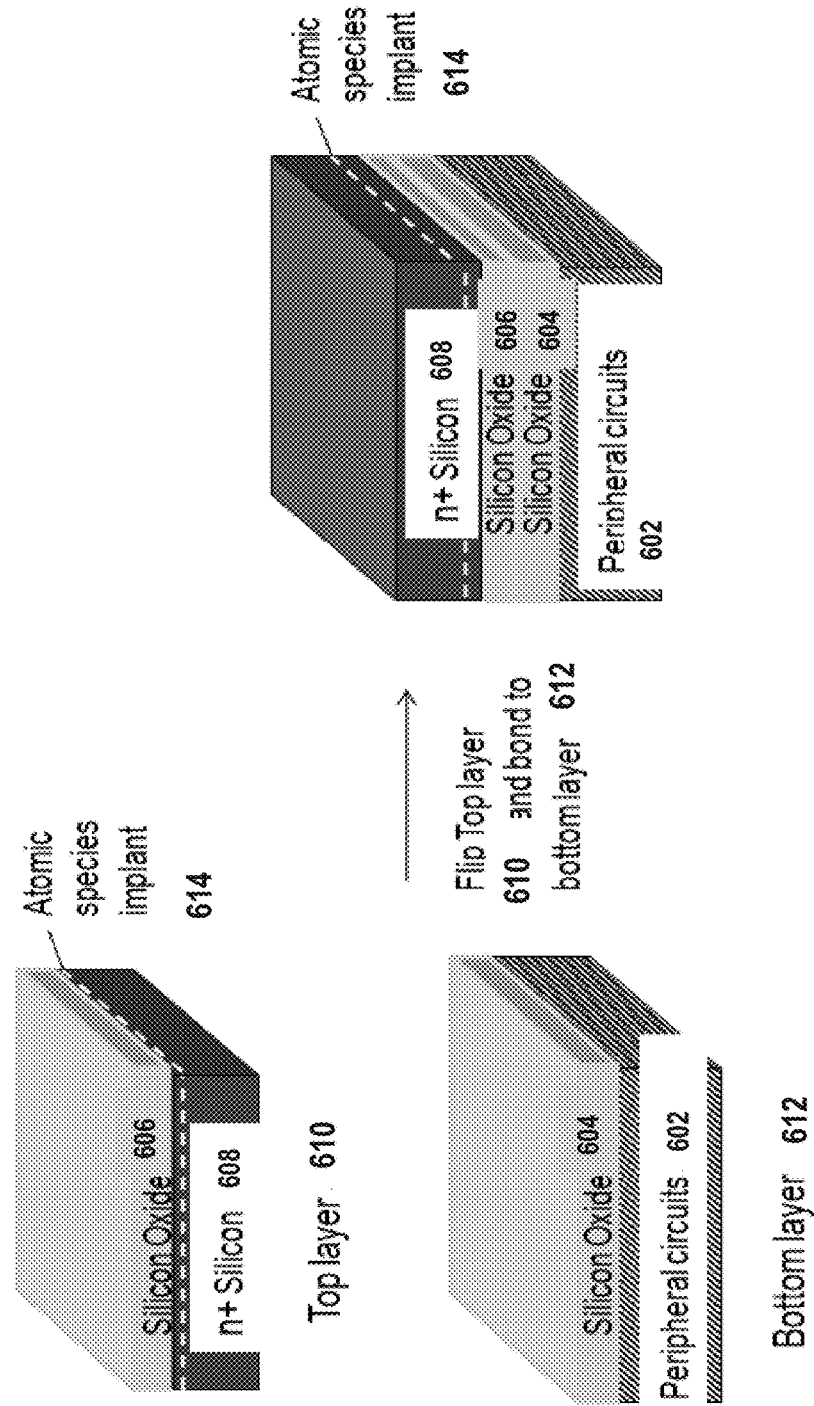

Step (B): FIG. 6B illustrates the structure after Step (B). N+ Silicon wafer 608 has an oxide layer 606 grown or deposited above it. Following this, hydrogen is implanted into the n+ Silicon wafer at a certain depth indicated by 614. Alternatively, some other atomic species such as Helium could be (co-)implanted. This hydrogen implanted n+ Silicon wafer 608 forms the top layer 610. The bottom layer 612 may include the peripheral circuits 602 with oxide layer 604. The top layer 610 is flipped and bonded to the bottom layer 612 using oxide-to-oxide bonding.

Figure 6C:
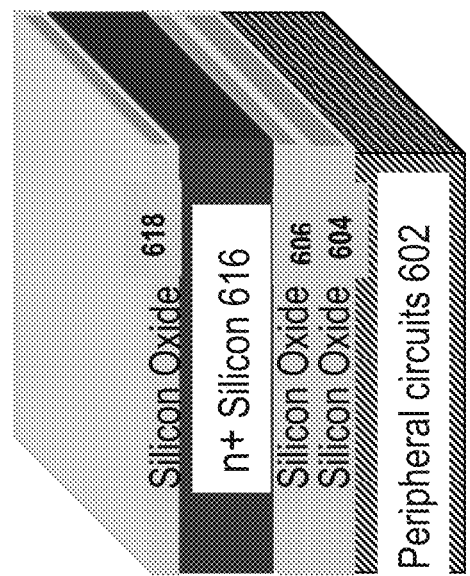

Step (C): FIG. 6C illustrates the structure after Step (C). The stack of top and bottom wafers after Step (B) is cleaved at the hydrogen plane 614 using either a anneal or a sideways mechanical force or other means. A CMP process is then conducted. A layer of silicon oxide 618 is then deposited atop the n+ Silicon layer 616. At the end of this step, a single-crystal n+ Si layer 616 exists atop the peripheral circuits, and this has been achieved using layer-transfer techniques.

Figure 6D:
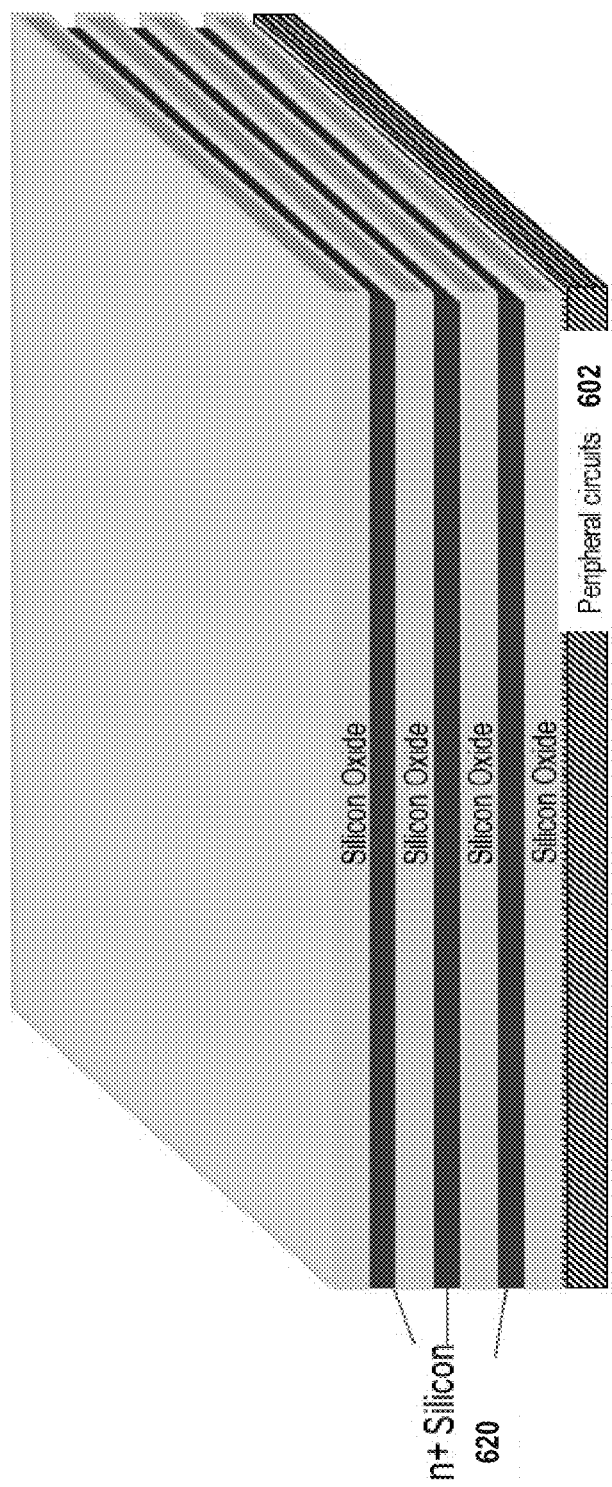

Step (D): FIG. 6D illustrates the structure after Step (D). Using methods similar to Step (B) and (C), multiple n+ silicon layers 620 are formed with silicon oxide layers in between.

Figure 6E:
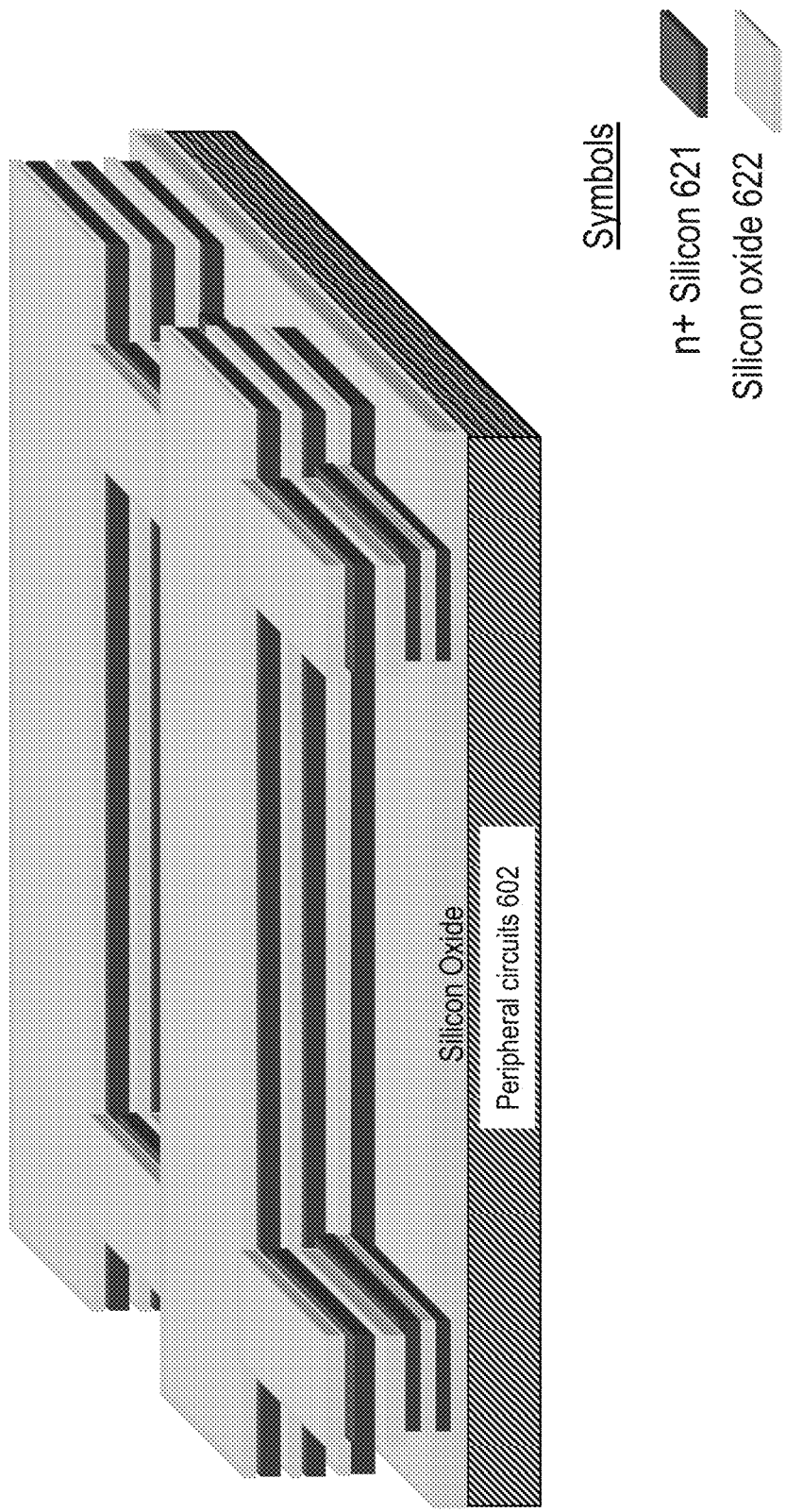

Step (E): FIG. 6E illustrates the structure after Step (E). Lithography and etch processes are then utilized to make a structure as shown in the figure.

Figure 6F:
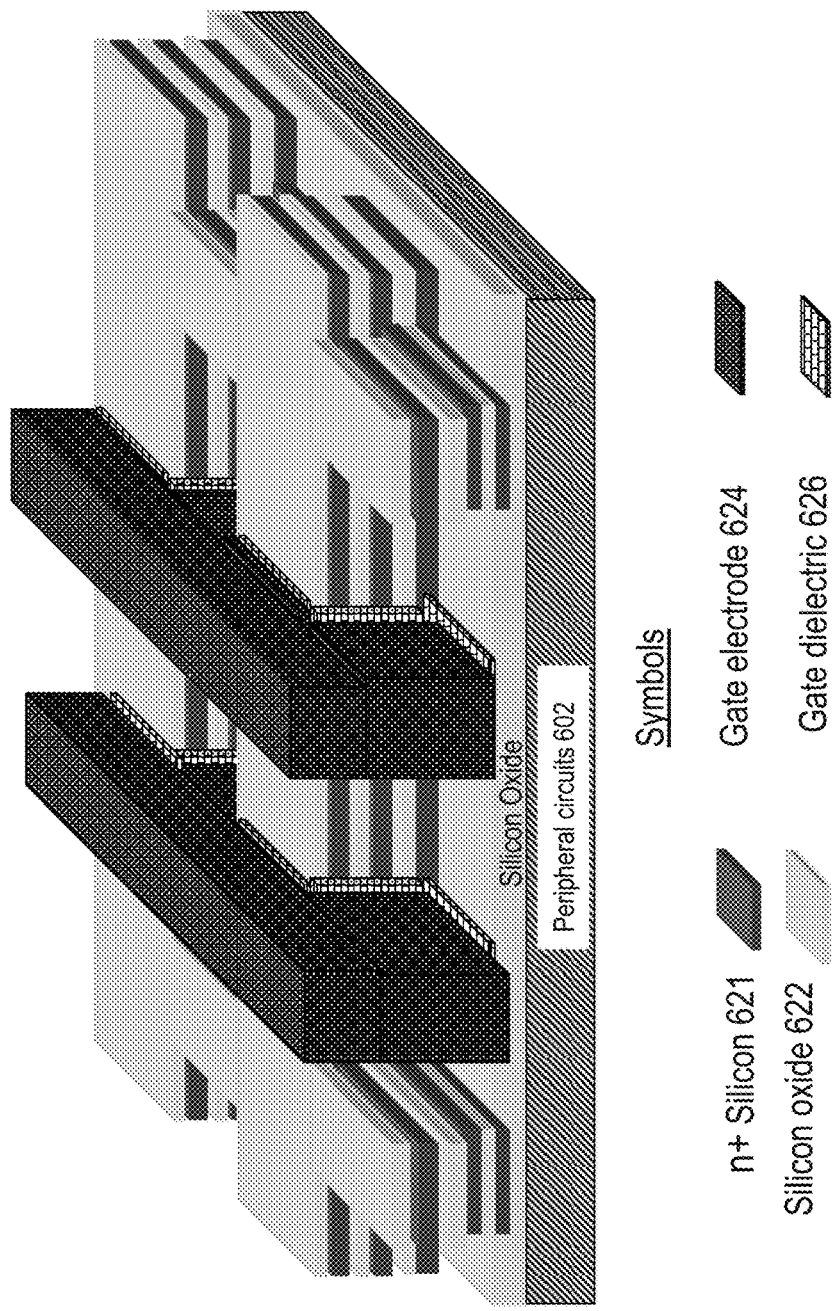

Step (F): FIG. 6F illustrates the structure after Step (F). Gate dielectric 626 and gate electrode 624 are then deposited following which a CMP is performed to planarize the gate electrode 624 regions. Lithography and etch are utilized to define gate regions.

Figure 6G:
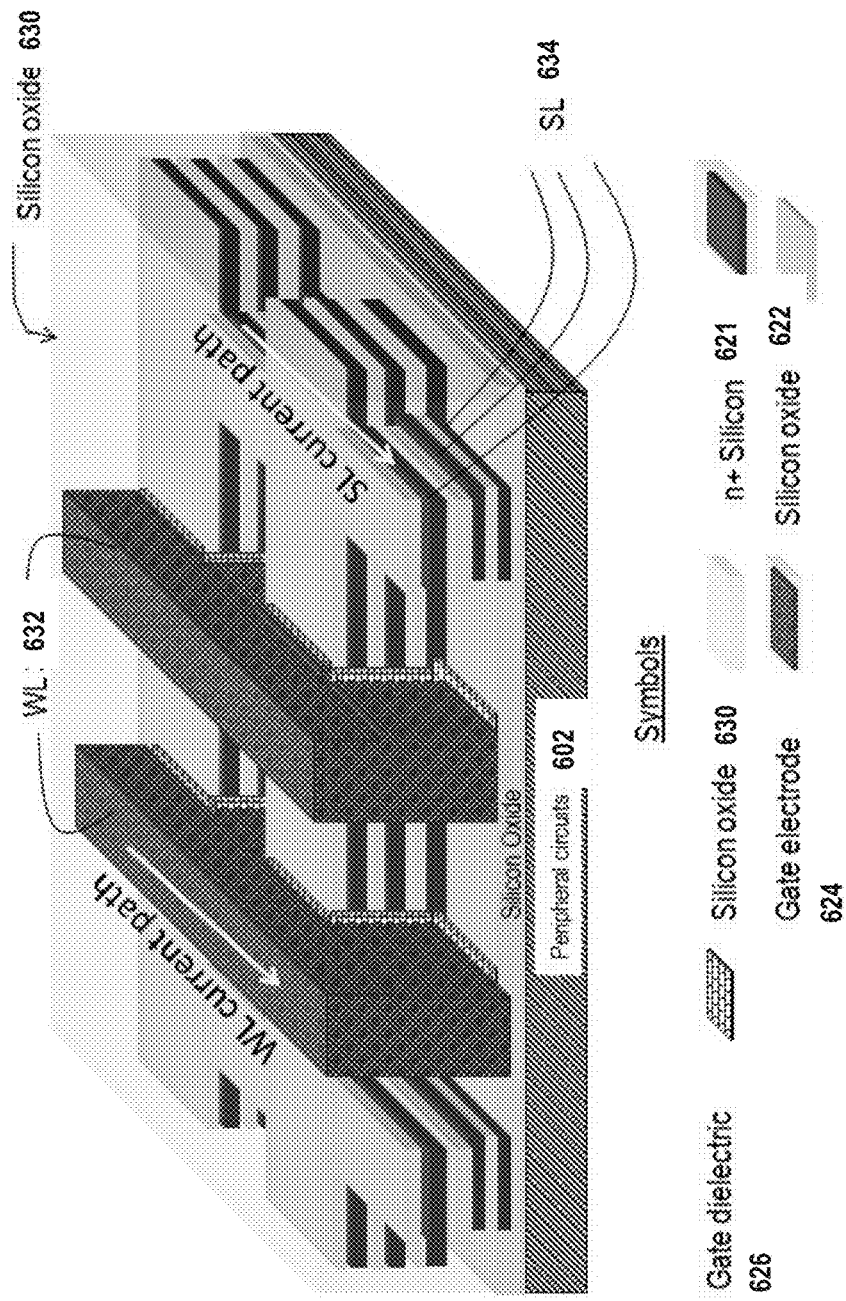

Step (G): FIG. 6G illustrates the structure after Step (G). A silicon oxide layer 630 is then deposited and planarized. The silicon oxide layer is shown transparent in the figure for clarity, along with word-line (WL) 632 and source-line (SL) 634 regions.

Figure 6H:
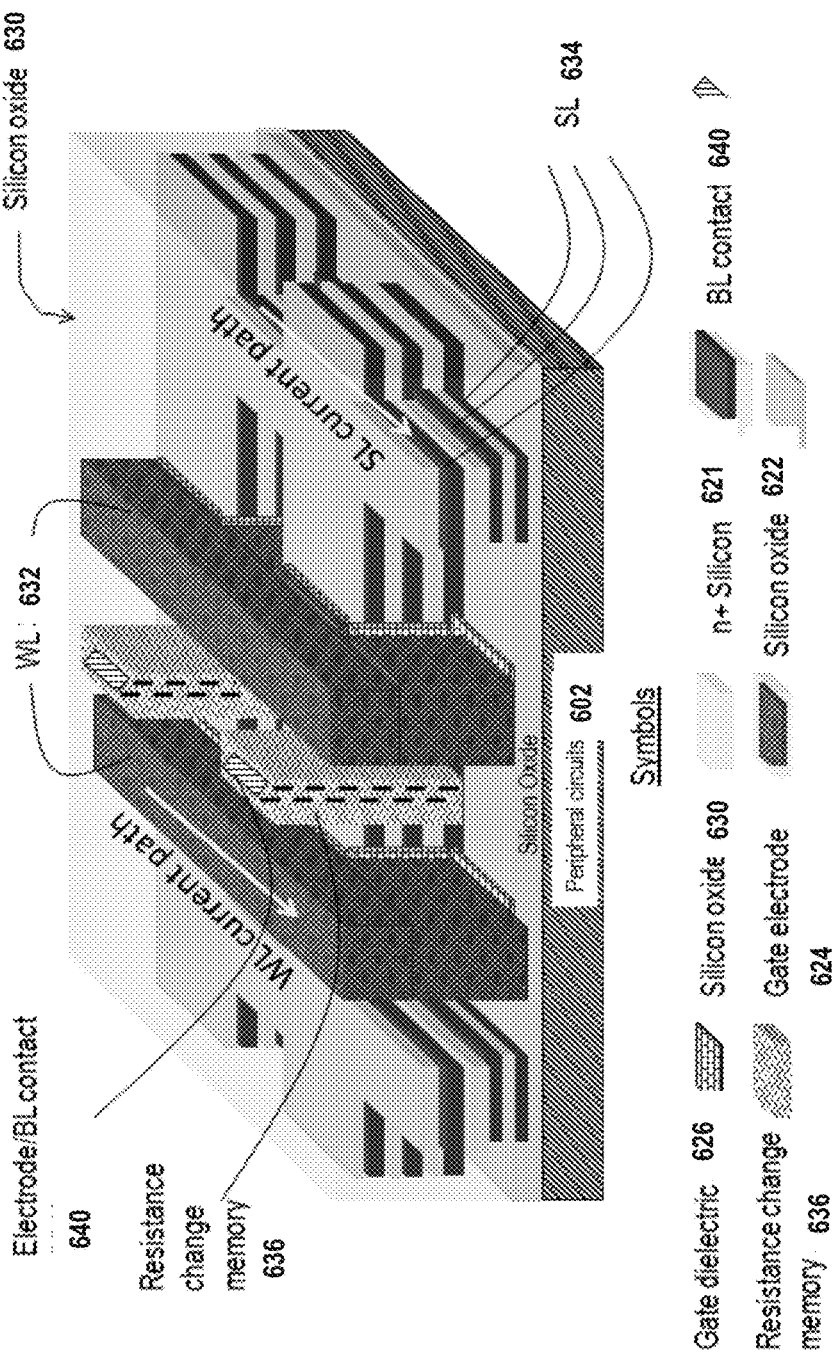
Figure 61:
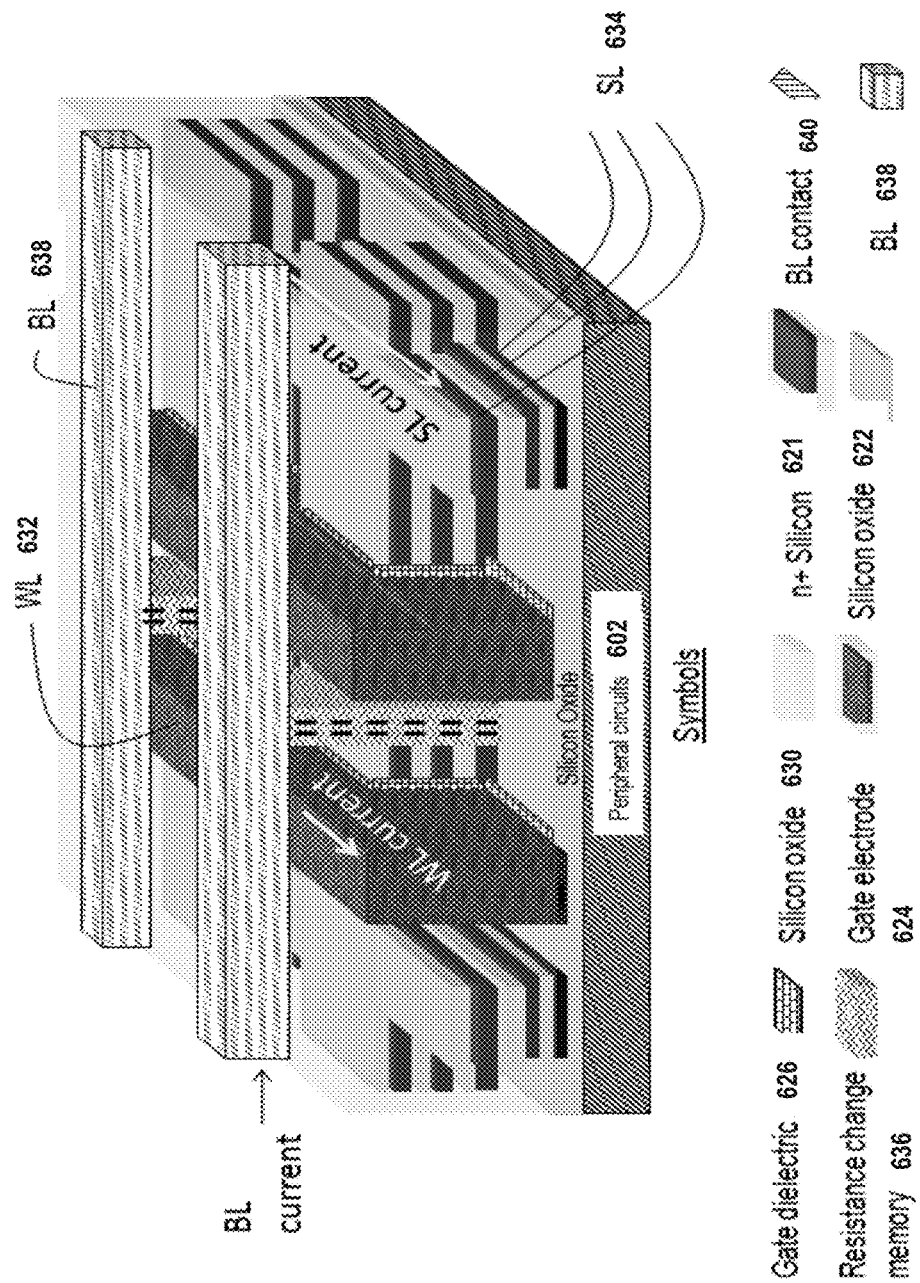

Step (H): FIG. 6H illustrates the structure after Step (H). Vias are etched through multiple layers of silicon and silicon dioxide as shown in the figure. A resistance change memory material 636 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 640. A CMP process is then conducted to planarize the surface. It can be observed that multiple resistance change memory elements in series with junction-less transistors are created after this step.

Step (I): FIG. 6I illustrates the structure after Step (I). BLs 638 are then constructed. Contacts are made to BLs, WLs and SLs of the memory array at its edges. SL contacts can be made into stair-like structures using techniques described in in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

Figure 6J:
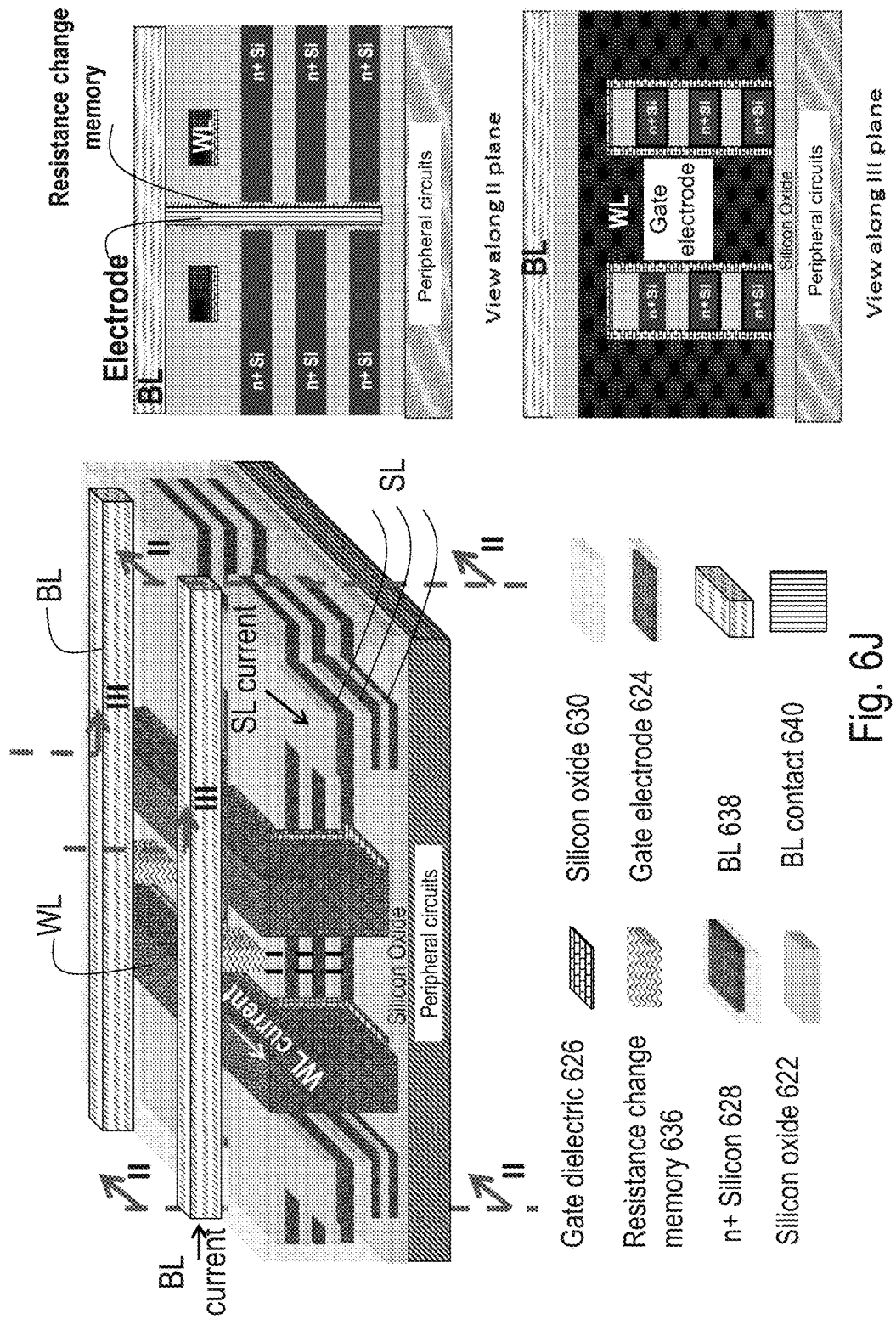

FIG. 6J shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIGS. 7A-K describe an alternative process flow to construct a horizontally-oriented monolithic 3D resistive memory array. This embodiment has a resistance-based memory element in series with a transistor selector. No mask is utilized on a "per-memory-layer" basis for the monolithic 3D resistance change memory (or resistive memory) concept shown in FIGS. 7A-K, and all other masks are shared between different layers. The process flow may include several steps as described in the following sequence.

Figure 7A:
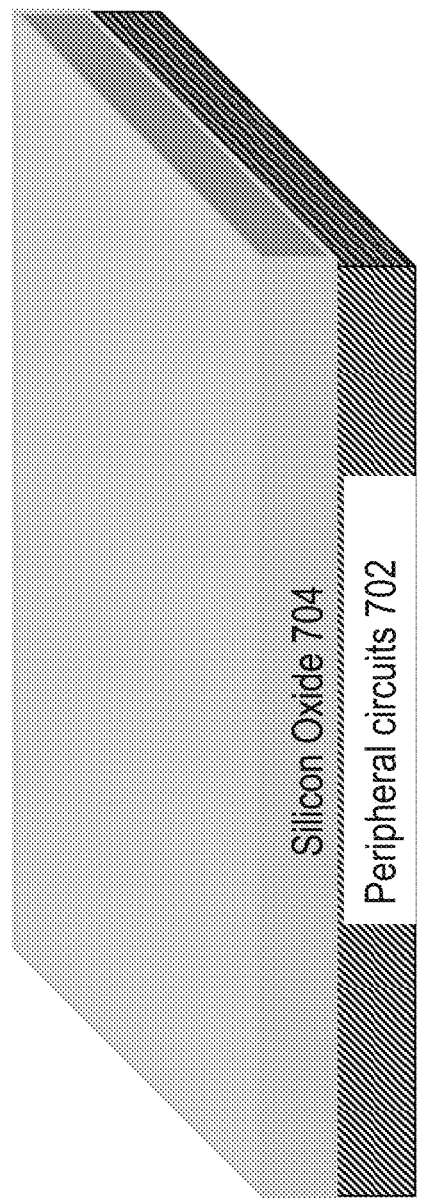

Step (A): Peripheral circuits with tungsten wiring 702 are first constructed and above this oxide layer 704 is deposited. FIG. 7A shows a drawing illustration after Step (A).

Figure 7B:
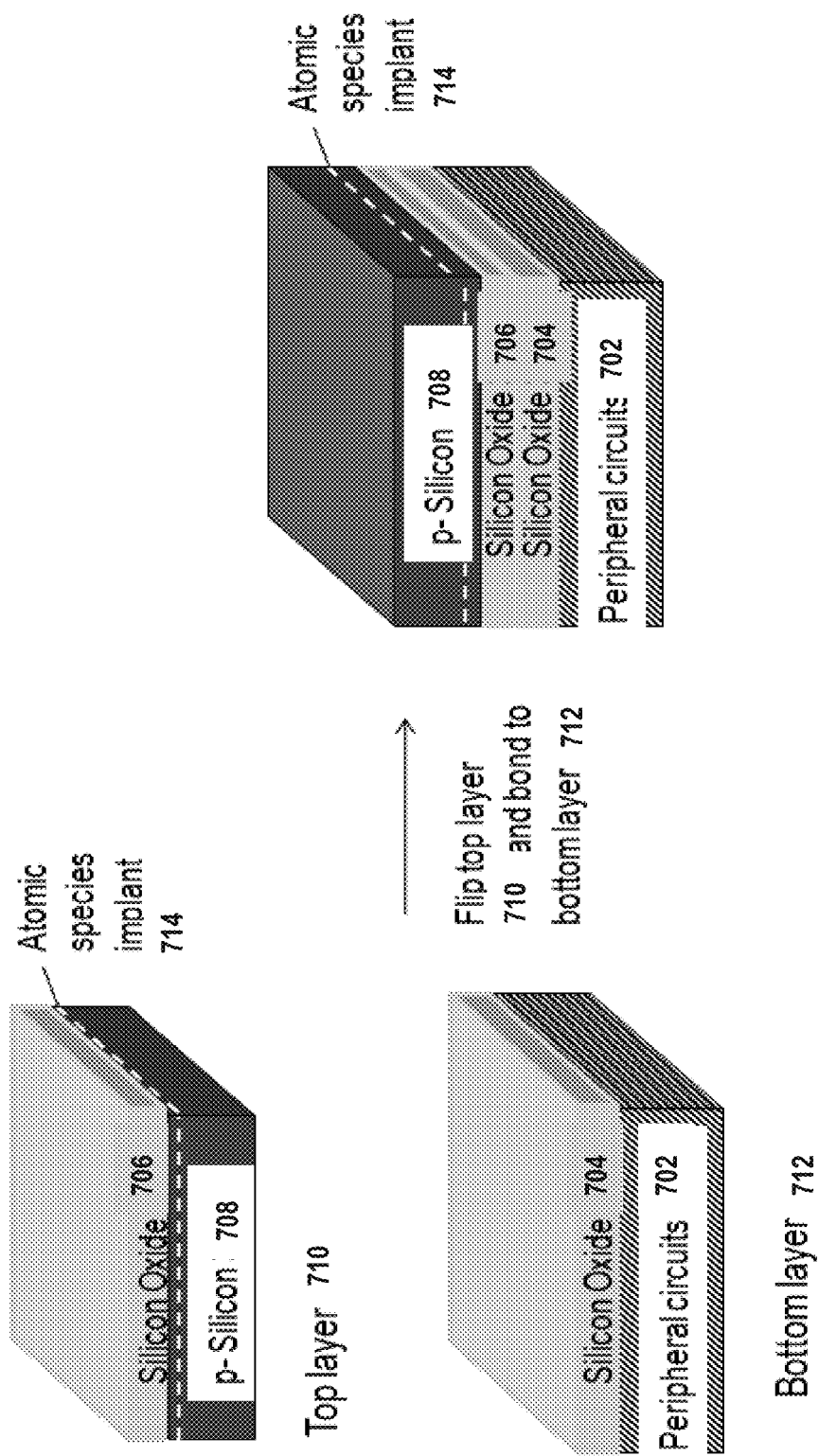

Step (B): FIG. 7B illustrates the structure after Step (B). A p− Silicon wafer 708 has an oxide layer 706 grown or deposited above it. Following this, hydrogen is implanted into the p− Silicon wafer at a certain depth indicated by 714. Alternatively, some other atomic species such as Helium could be (co-)implanted. This hydrogen implanted p− Silicon wafer 708 forms the top layer 710. The bottom layer 712 may include the peripheral circuits 702 with oxide layer 704. The top layer 710 is flipped and bonded to the bottom layer 712 using oxide-to-oxide bonding.

Figure 7C:
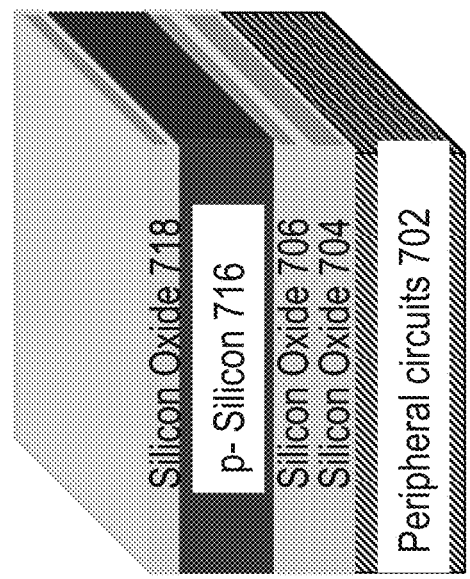

Step (C): FIG. 7C illustrates the structure after Step (C). The stack of top and bottom wafers after Step (B) is cleaved at the hydrogen plane 714 using either an anneal or a sideways mechanical force or other means. A CMP process is then conducted. A layer of silicon oxide 718 is then deposited atop the p− Silicon layer 716. At the end of this step, a single− crystal p− Silicon layer 716 exists atop the peripheral circuits, and this has been achieved using layer-transfer techniques.

Figure 7D:
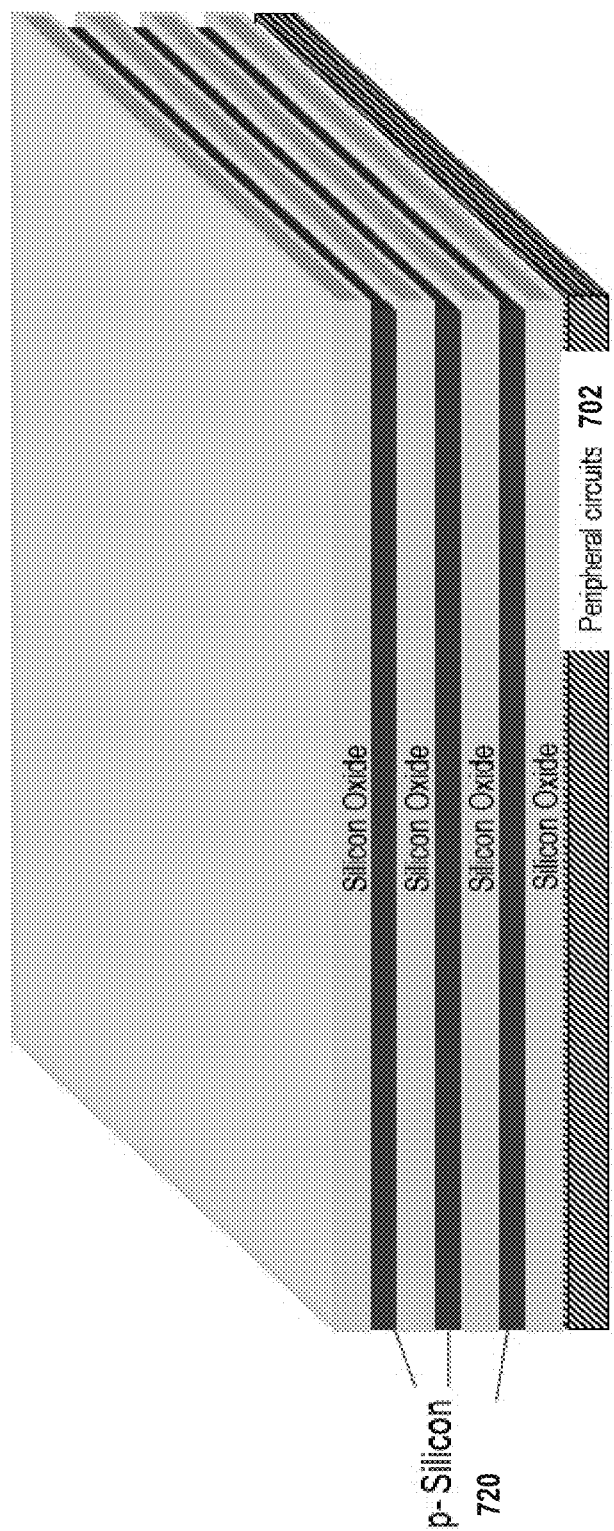

Step (D): FIG. 7D illustrates the structure after Step (D). Using methods similar to Step (B) and (C), multiple p− silicon layers 720 are formed with silicon oxide layers in between.

Figure 7E:
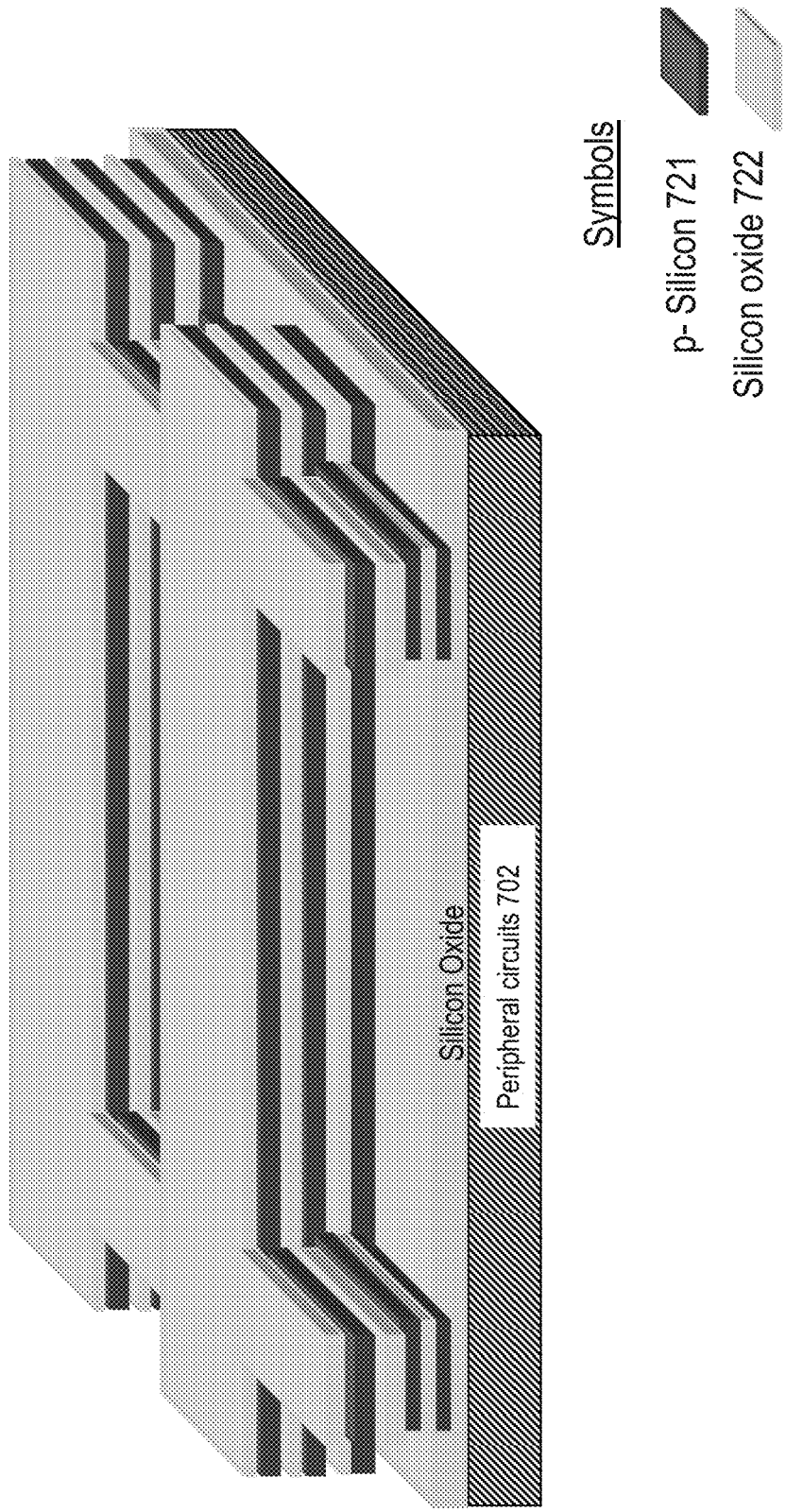

Step (E): FIG. 7E illustrates the structure after Step (E). Lithography and etch processes are then utilized to make a structure as shown in the figure.

Figure 7F:
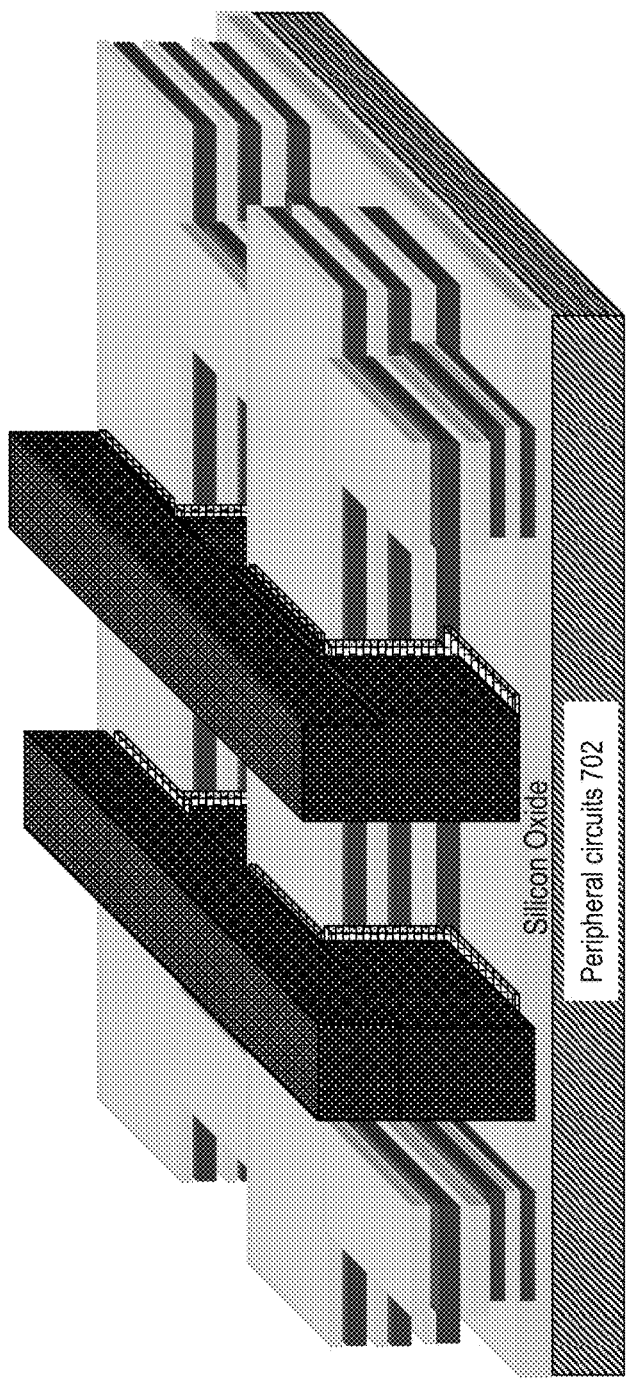

Step (F): FIG. 7F illustrates the structure on after Step (F). Gate dielectric 726 and gate electrode 724 are then deposited following which a CMP is done to planarize the gate electrode 724 regions. Lithography and etch are utilized to define gate regions.

Figure 7G:
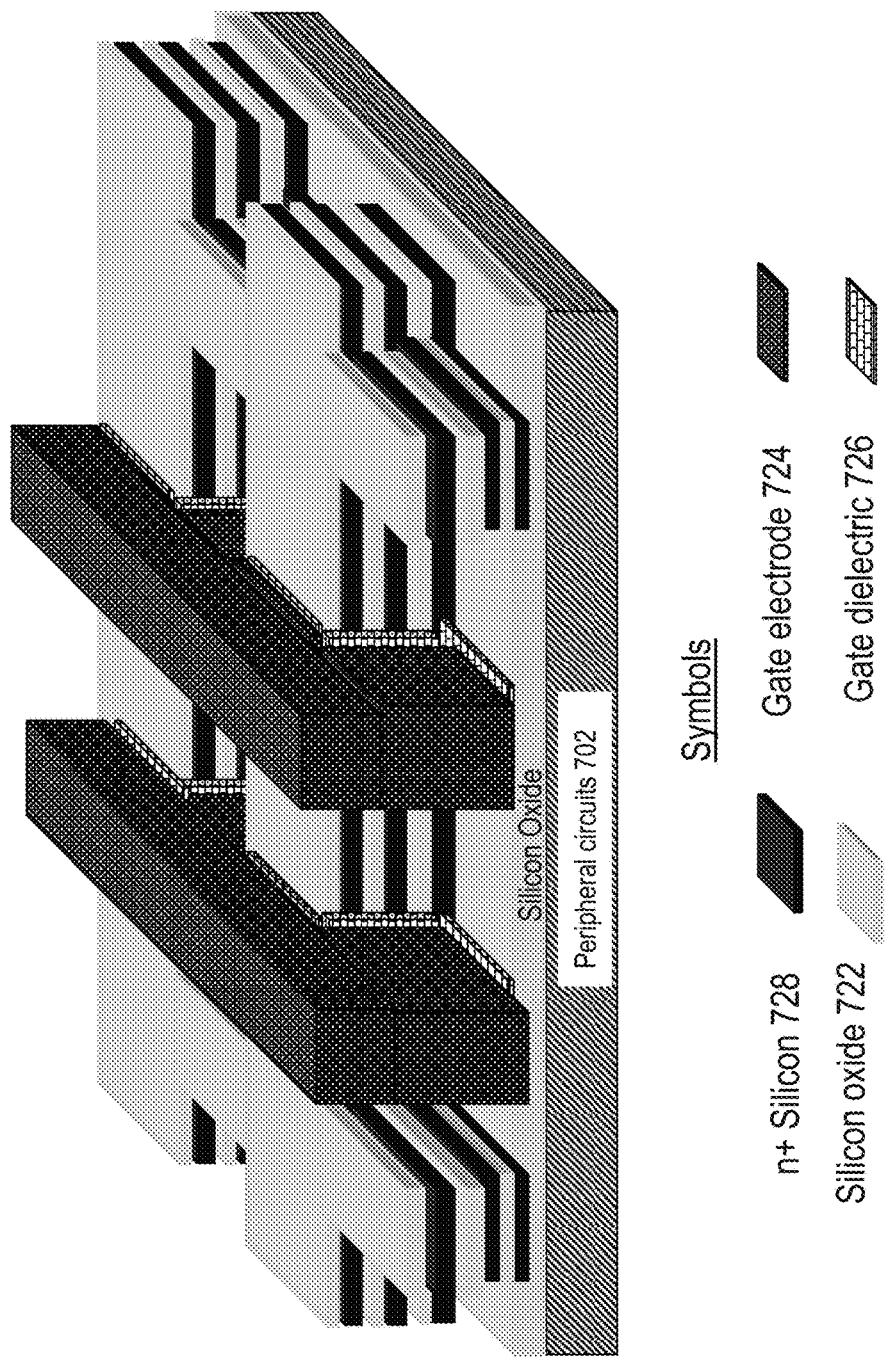

Step (G): FIG. 7G illustrates the structure after Step (G). Using the hard mask defined in Step (F), p− regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 7H:
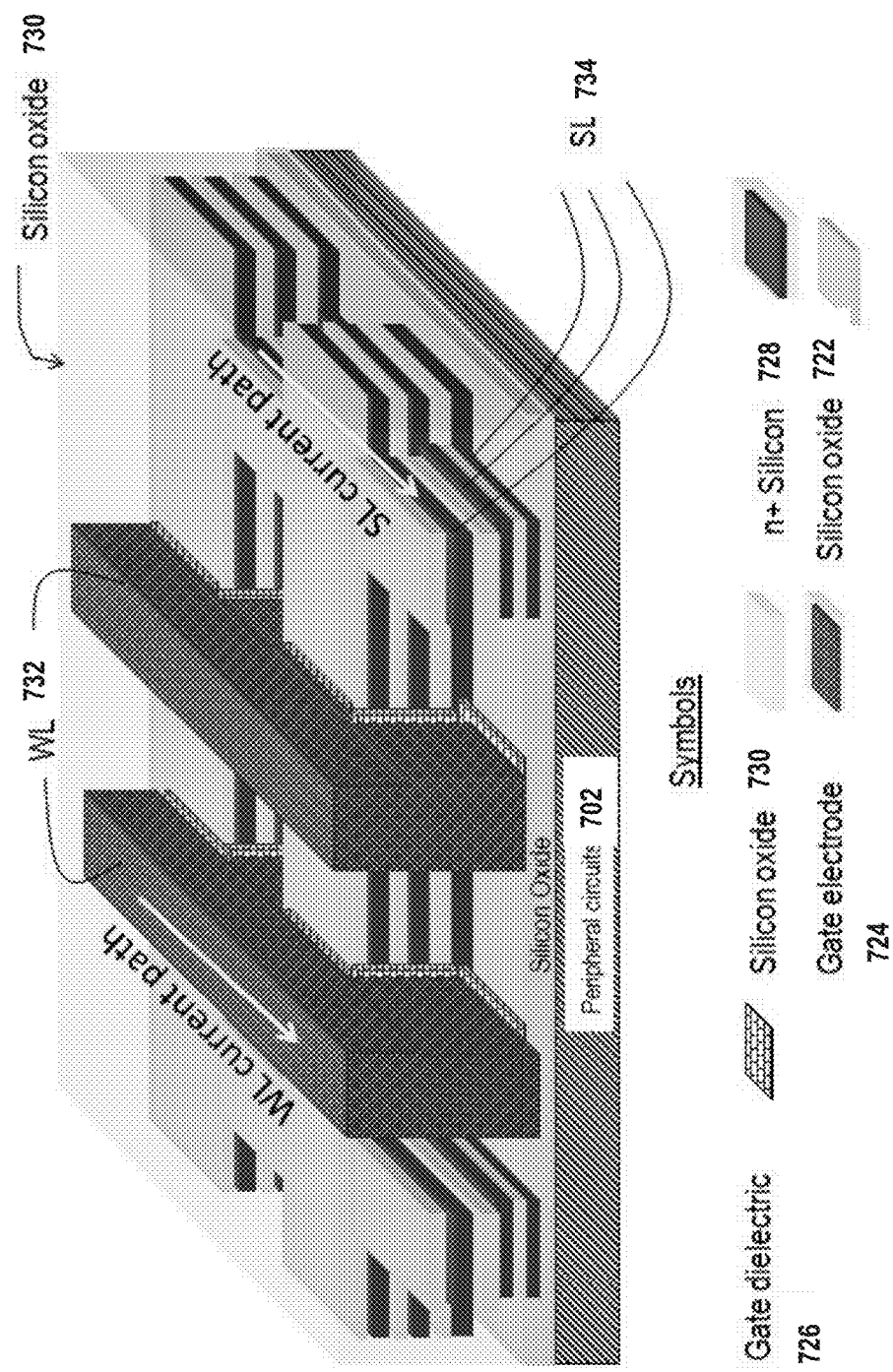
Figure 71:
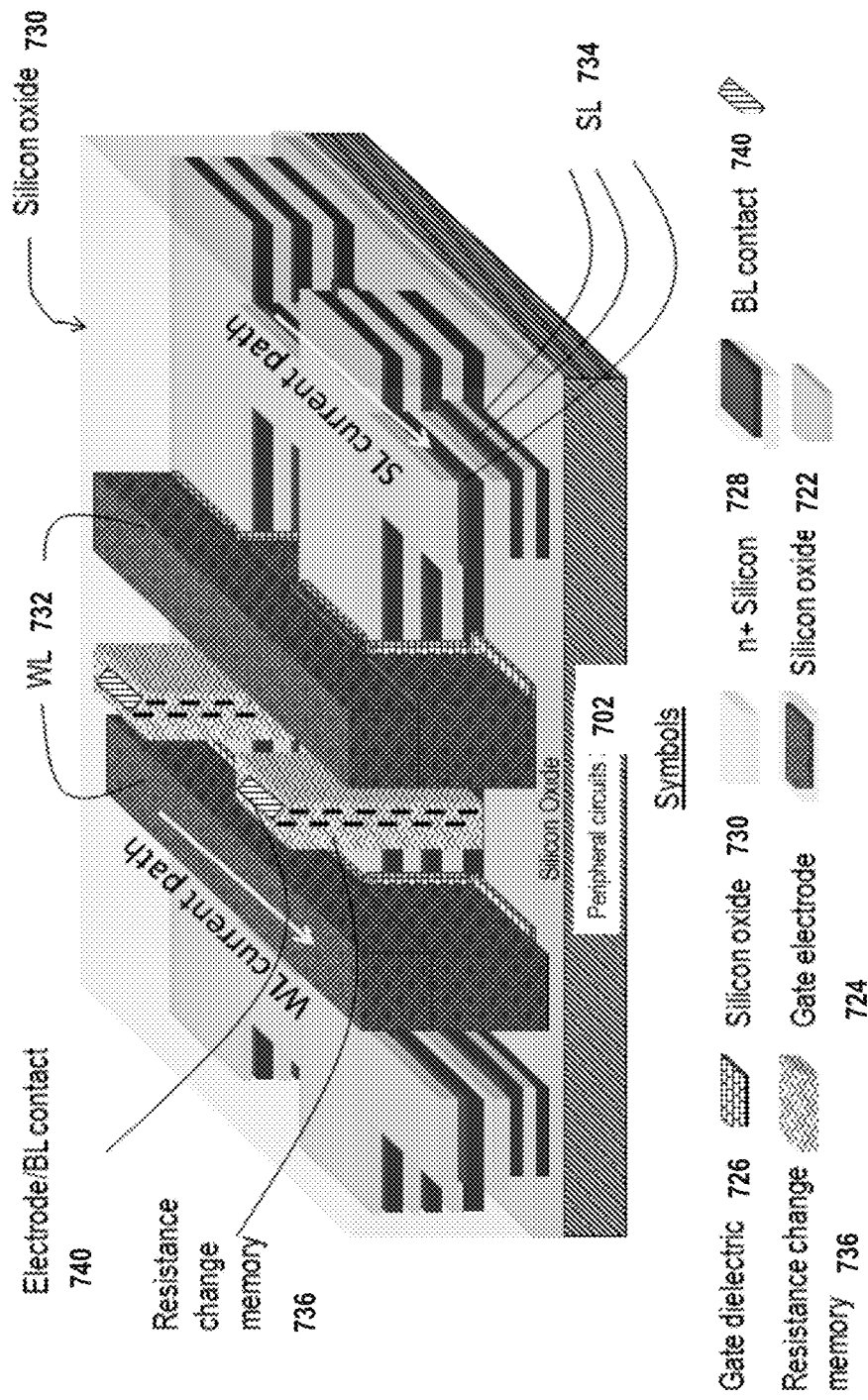

Step (H): FIG. 7H illustrates the structure after Step (H). A silicon oxide layer 730 is then deposited and planarized. The silicon oxide layer is shown transparent in the figure for clarity, along with word-line (WL) 732 and source-line (SL) 734 regions.

Step (I): FIG. 7I illustrates the structure after Step (I). Vias are etched through multiple layers of silicon and silicon dioxide as shown in the figure. A resistance change memory material 736 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 740. A CMP process is then conducted to planarize the surface. It can be observed that multiple resistance change memory elements in series with transistors are created after this step.

Figure 7J:
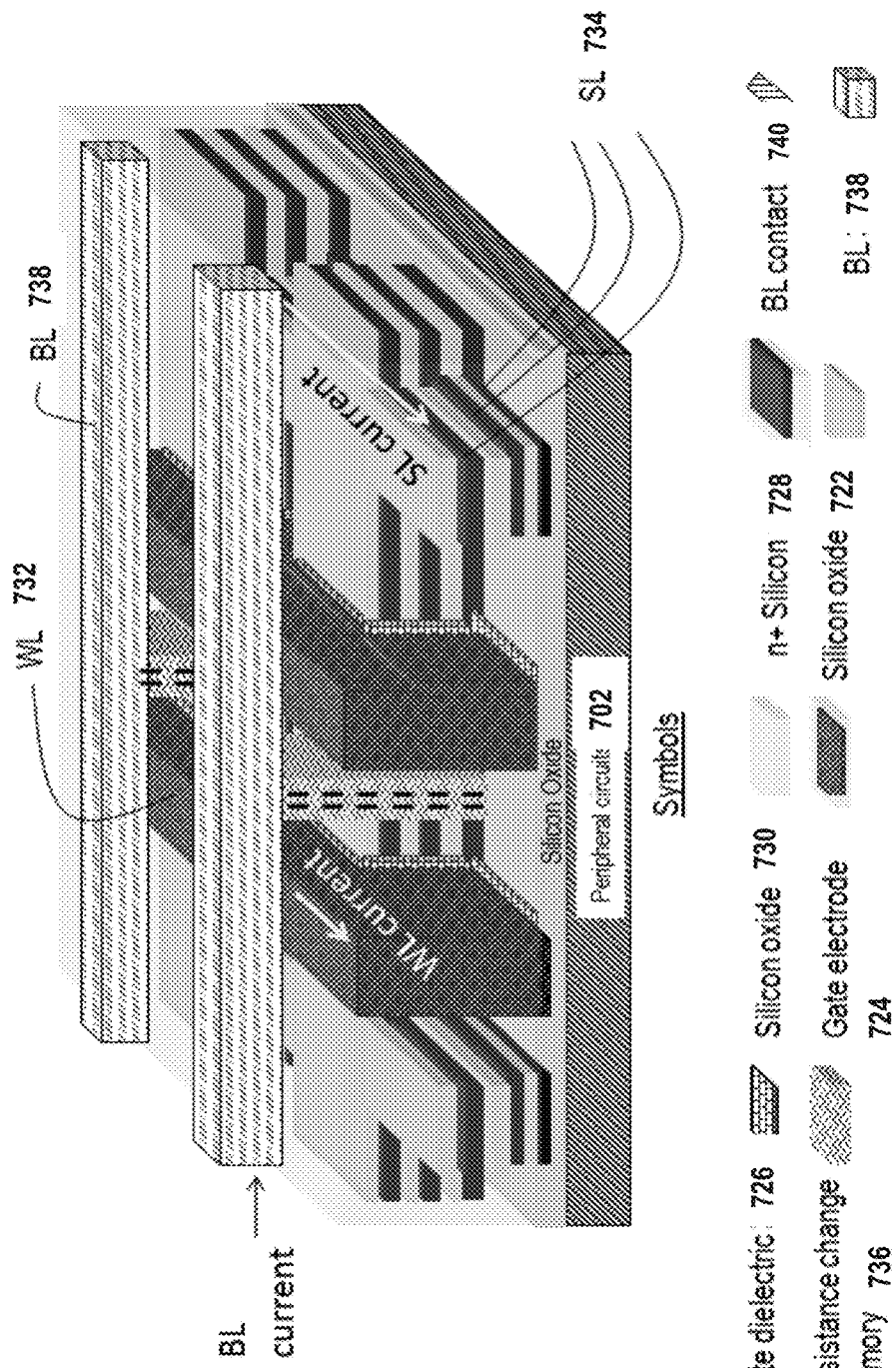

Step (J): FIG. 7J illustrates the structure after Step (J). BLs 738 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (I) as well.

Figure 7K:
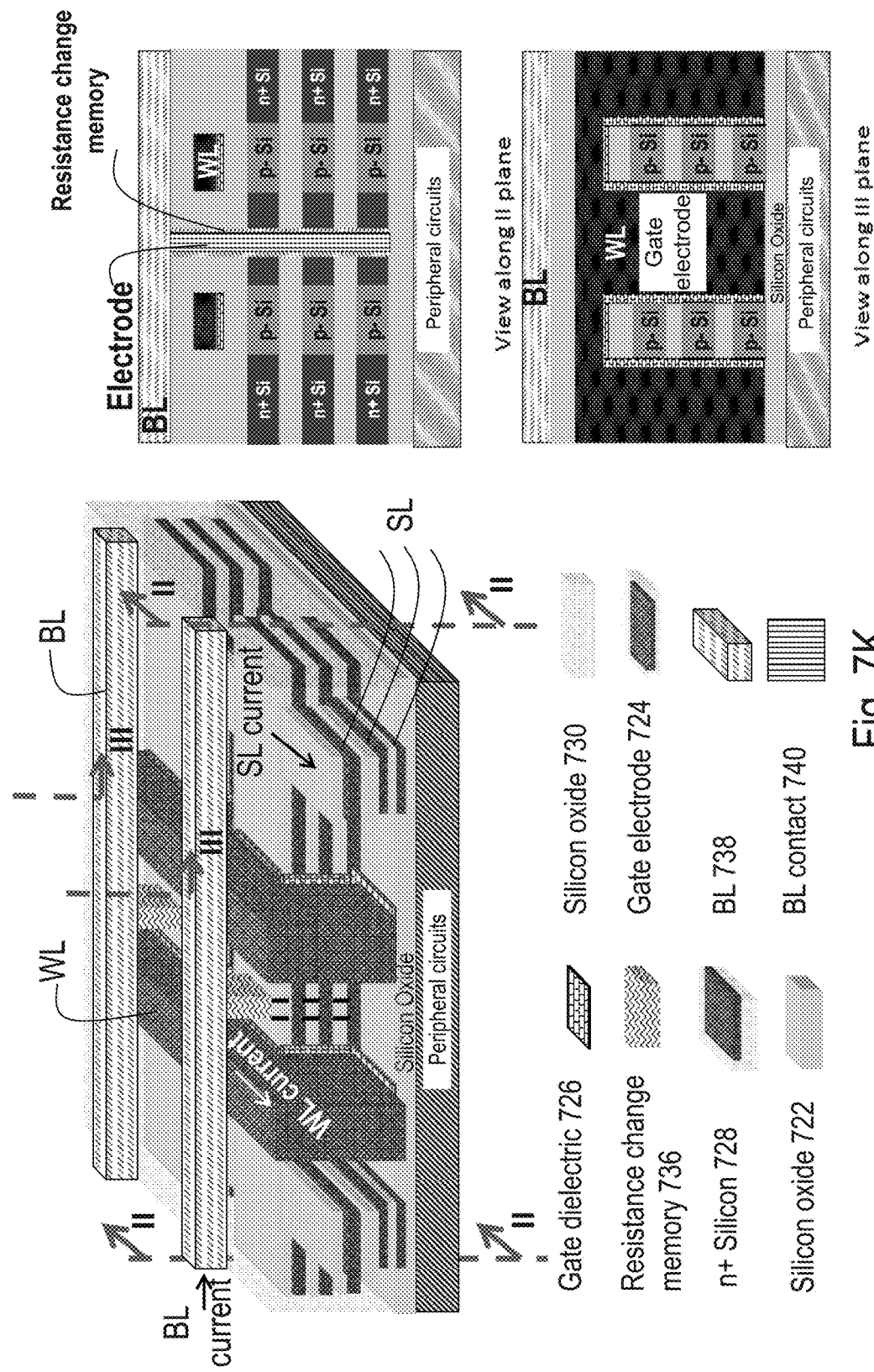

FIG. 7K shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

FIG. 8A-L describes an alternative process flow to construct a horizontally-oriented monolithic 3D resistive memory array. This embodiment has a resistance-based memory element in series with a transistor selector. One mask is utilized on a "per-memory-layer" basis for the monolithic 3D resistance change memory (or resistive memory) concept shown in FIGS. 8A-L, and all other masks are shared between different layers. The process flow may include several steps as described in the following sequence.

Figure 8A:
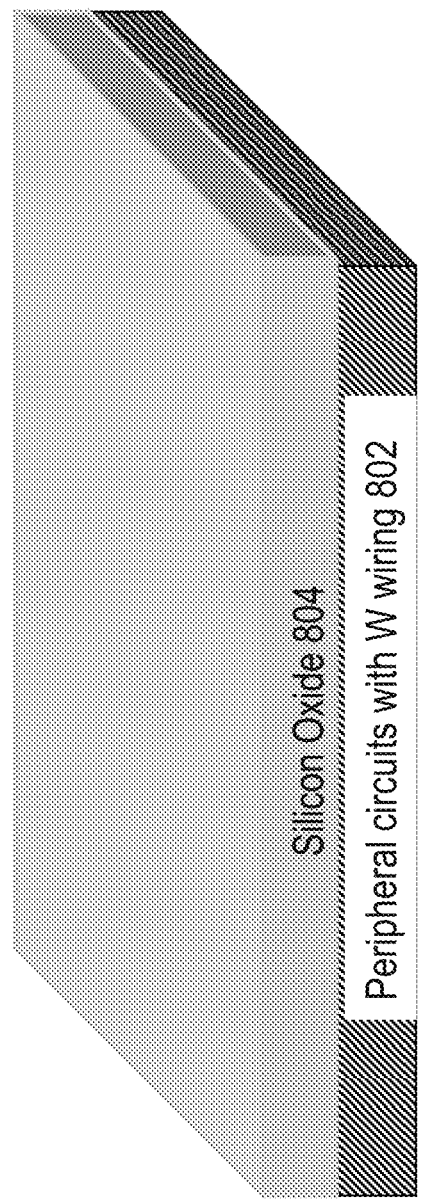
FIGS. 8A-8L show a one-mask per layer 3D resistive memory.

Step (A): Peripheral circuit layer 802 with tungsten wiring is first constructed and above this oxide layer 804 is deposited. FIG. 8A illustrates the structure after Step (A).

Figure 8B:
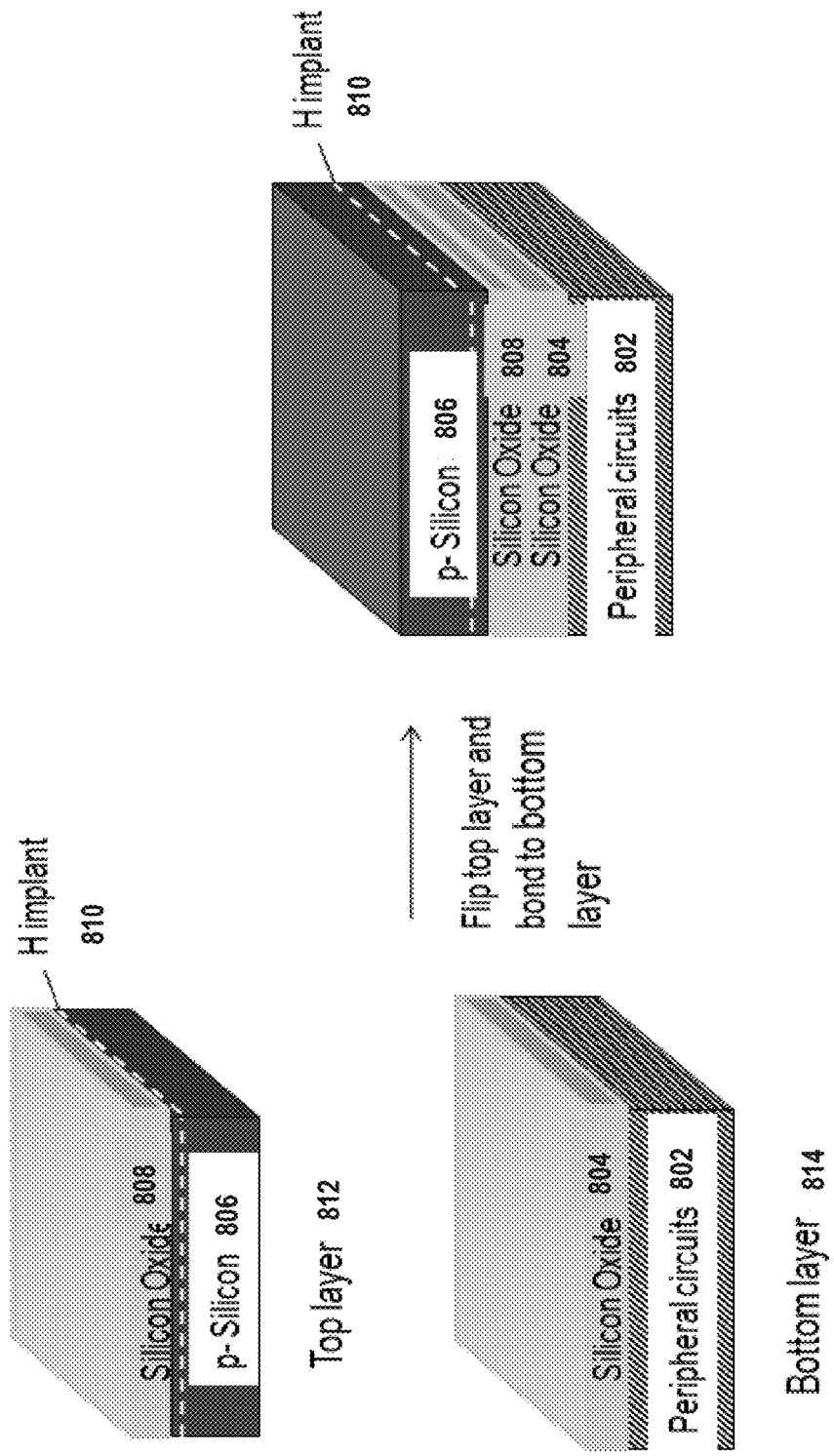

Step (B): FIG. 8B illustrates the structure after Step (B). A p− Silicon wafer 806 has an oxide layer 808 grown or deposited above it. Following this, hydrogen is implanted into the p− Silicon wafer at a certain depth indicated by 810. Alternatively, some other atomic species such as Helium could be (co-)implanted. This hydrogen implanted p− Silicon wafer 806 forms the top layer 812. The bottom layer 814 may include the peripheral circuit layer 802 with oxide layer 804. The top layer 812 is flipped and bonded to the bottom layer 814 using oxide-to-oxide bonding.

Figure 8C:
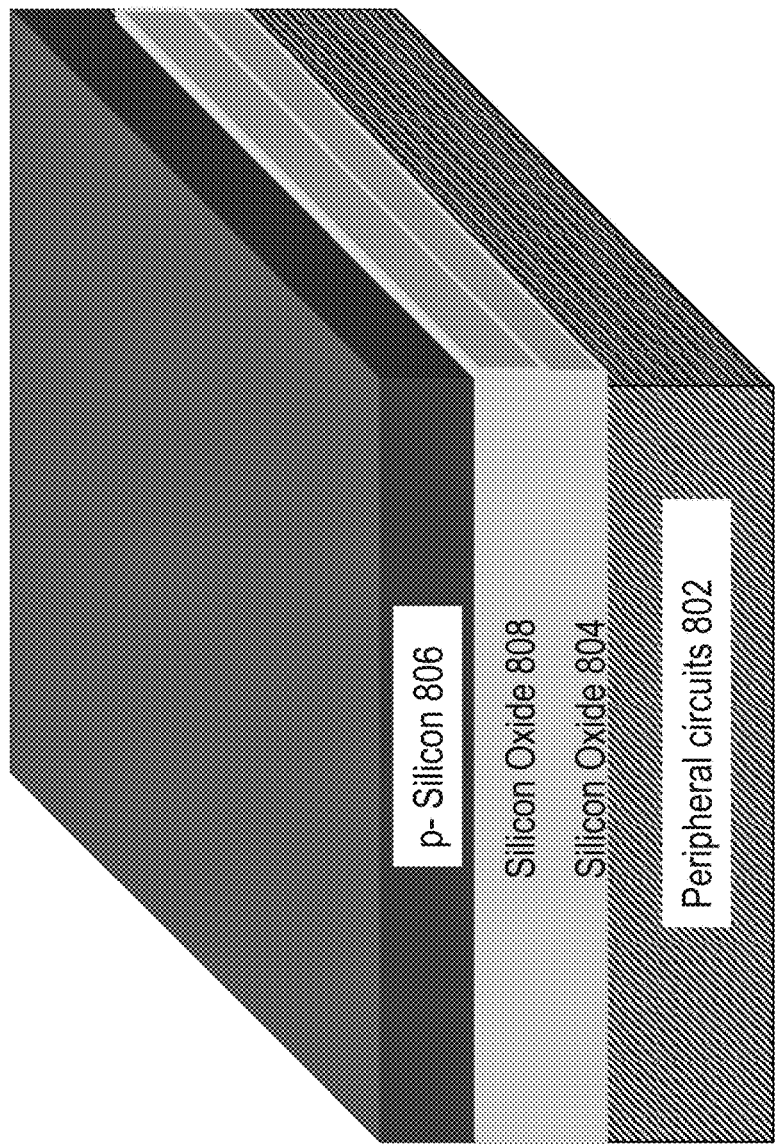

Step (C): FIG. 8C illustrates the structure after Step (C). The stack of top and bottom wafers after Step (B) is cleaved at the hydrogen plane 810 using either a anneal or a sideways mechanical force or other means. A CMP process is then conducted. At the end of this step, a single-crystal p− Si layer exists atop the peripheral circuits, and this has been achieved using layer-transfer techniques.

Figure 8D:
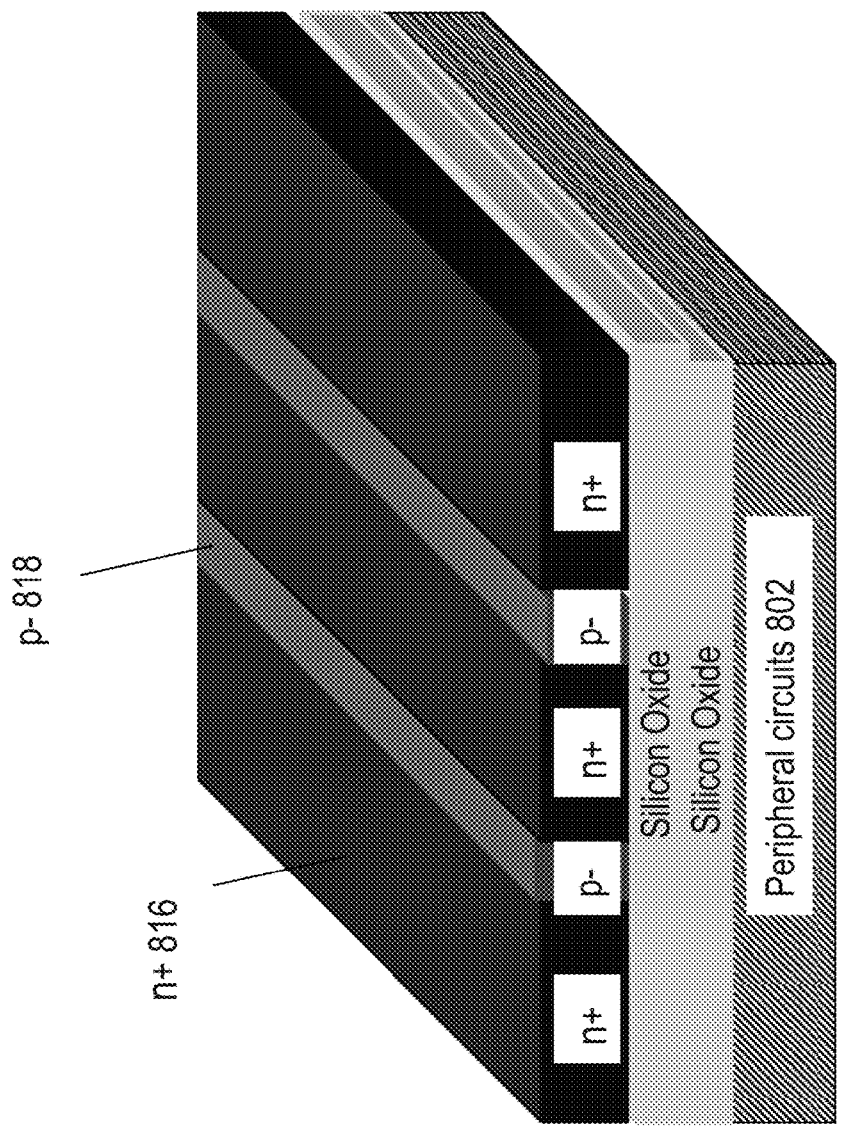

Step (D): FIG. 8D illustrates the structure after Step (D). Using lithography and then implantation, n+ regions 816 and p− regions 818 are formed on the transferred layer of p− Si after Step (C).

Figure 8E:
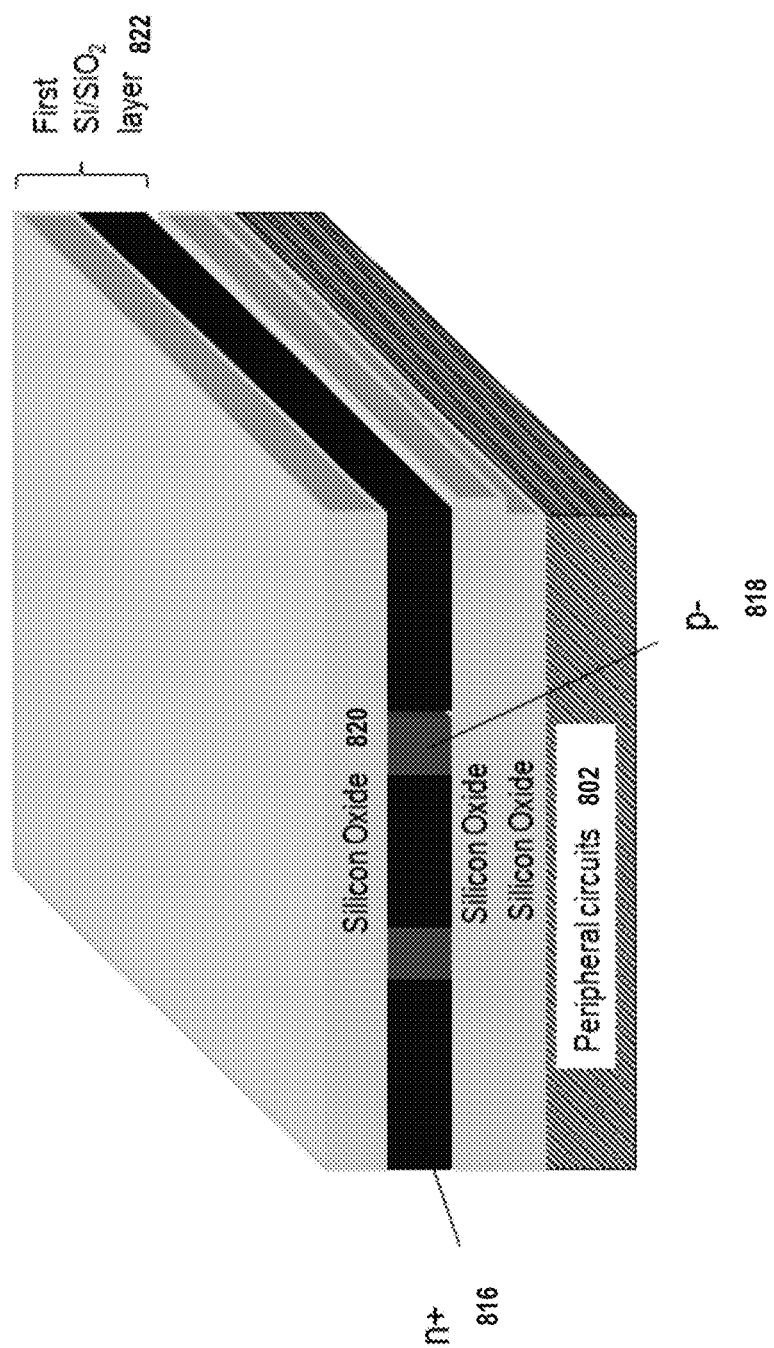

Step (E): FIG. 8E illustrates the structure after Step (E). An oxide layer 820 is deposited atop the structure obtained after Step (D). A first layer of Si/SiO$_2$ 822 is therefore formed atop the peripheral circuit layer 802.

Figure 8F:
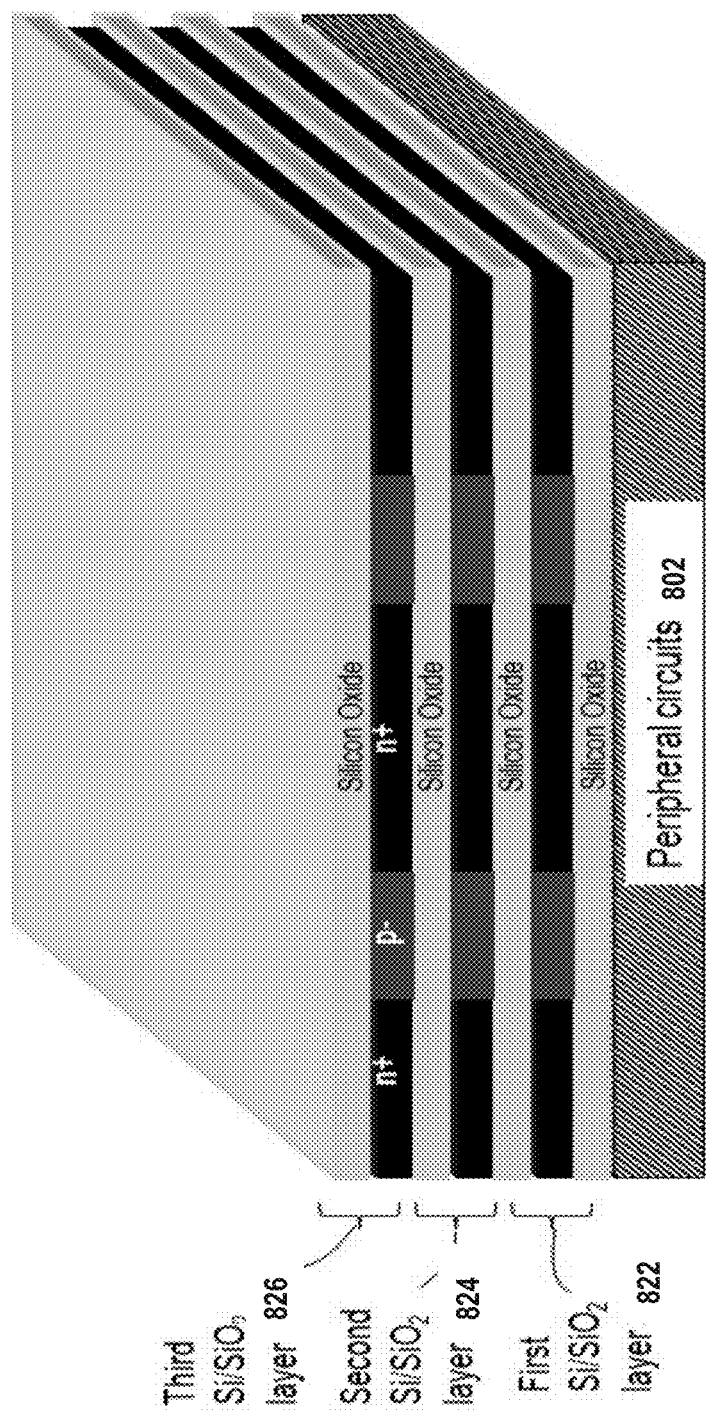

Step (F): FIG. 8F illustrates the structure after Step (F). Using procedures similar to Steps (B)-(E), additional Si/SiO₂ layers 824 and 826 are formed atop Si/SiO₂ layer 822. A rapid thermal anneal (RTA) or spike anneal or flash anneal or laser anneal is then done to activate all implanted layers 822, 824 and 826 (and possibly also the peripheral circuit layer 802). Alternatively, the layers 822, 824 and 826 are annealed layer-by-layer as soon as their implantations are done using a laser anneal system.

Figure 8G:
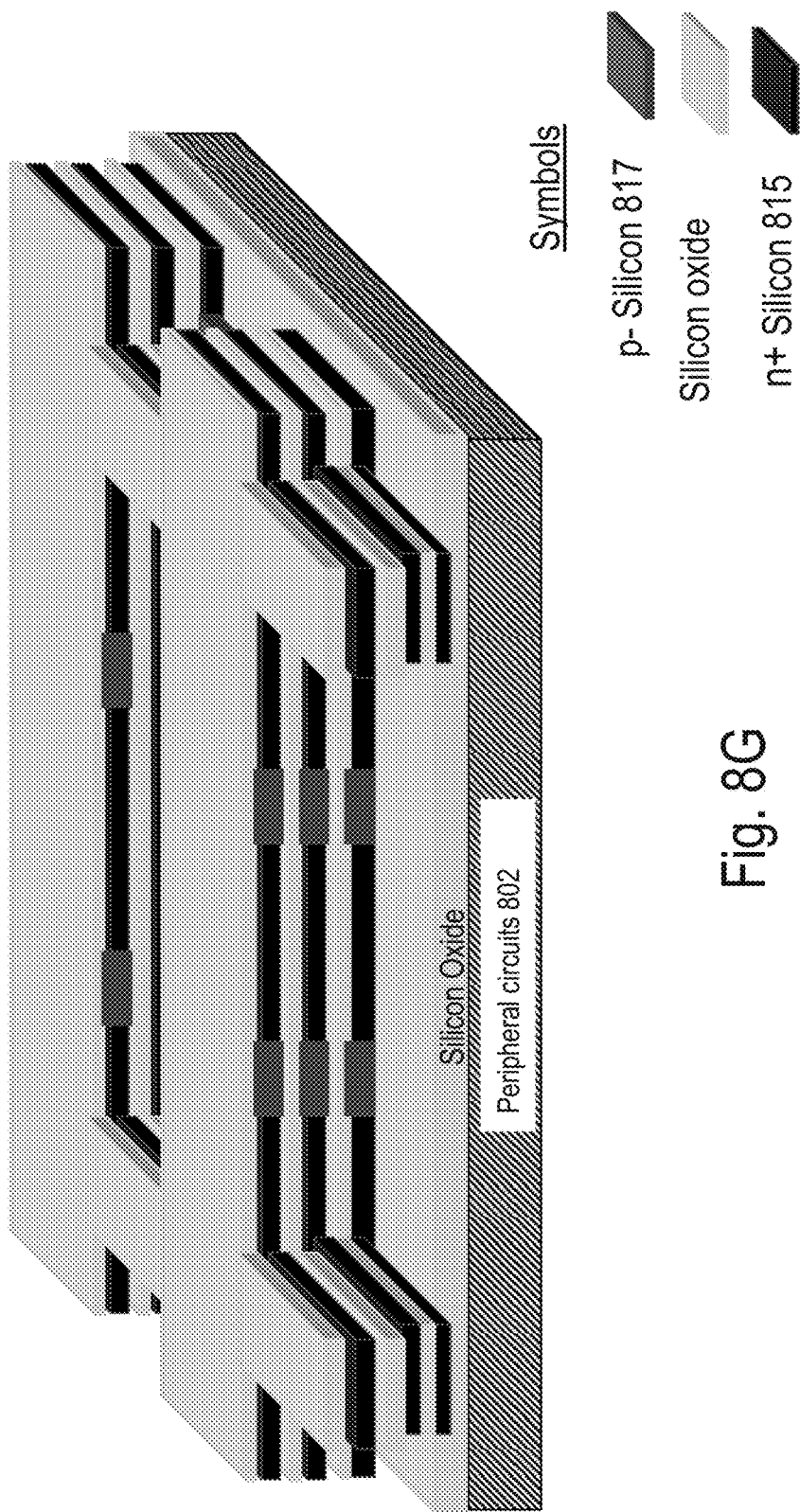

Step (G): FIG. 8G illustrates the structure after Step (G). Lithography and etch processes are then utilized to make a structure as shown in the figure.

Figure 8H:
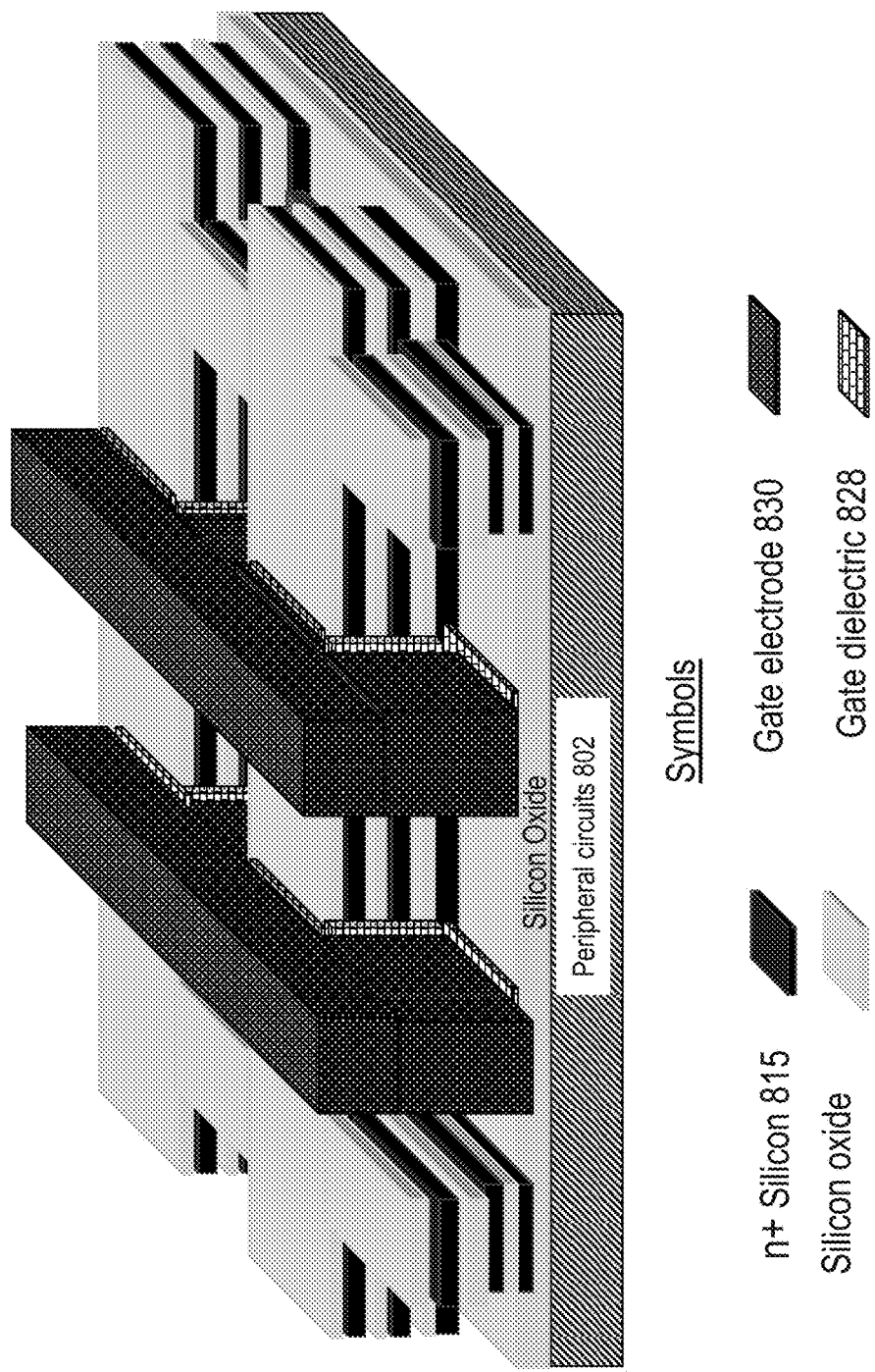

Step (H): FIG. 8H illustrates the structure after Step (H). Gate dielectric 828 and gate electrode 830 are then deposited following which a CMP is done to planarize the gate electrode 830 regions. Lithography and etch are utilized to define gate regions over the p− silicon regions (eg. p− Si region 818 after Step (D)). Note that gate width could be slightly larger than p− region width to compensate for overlay errors in lithography.

Figure 8I:
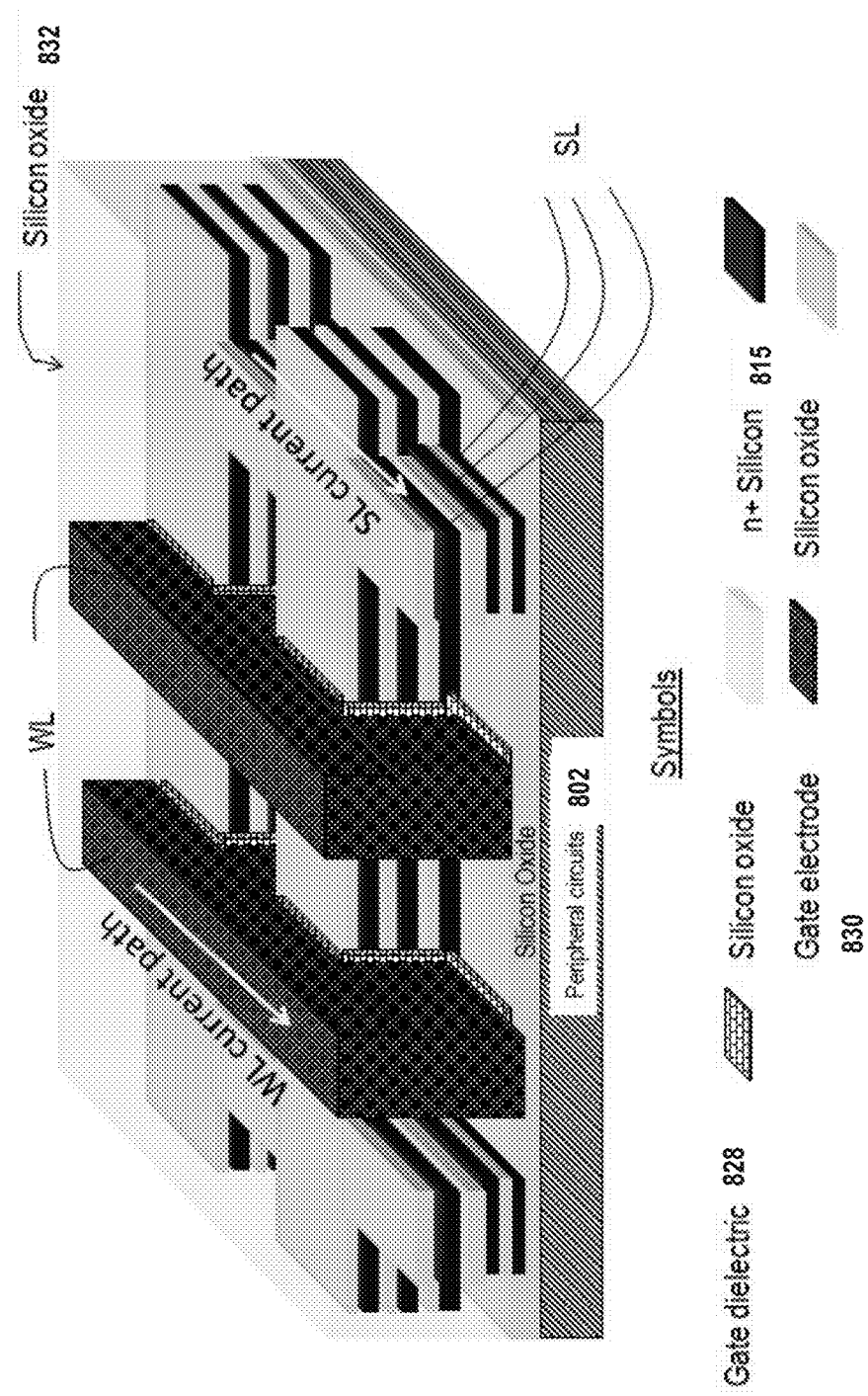

Step (I): FIG. 8I illustrates the structure after Step (I). A silicon oxide layer 832 is then deposited and planarized. It is shown transparent in the figure for clarity. Word-line (WL) and Source-line (SL) regions are shown in the figure.

Figure 8J:
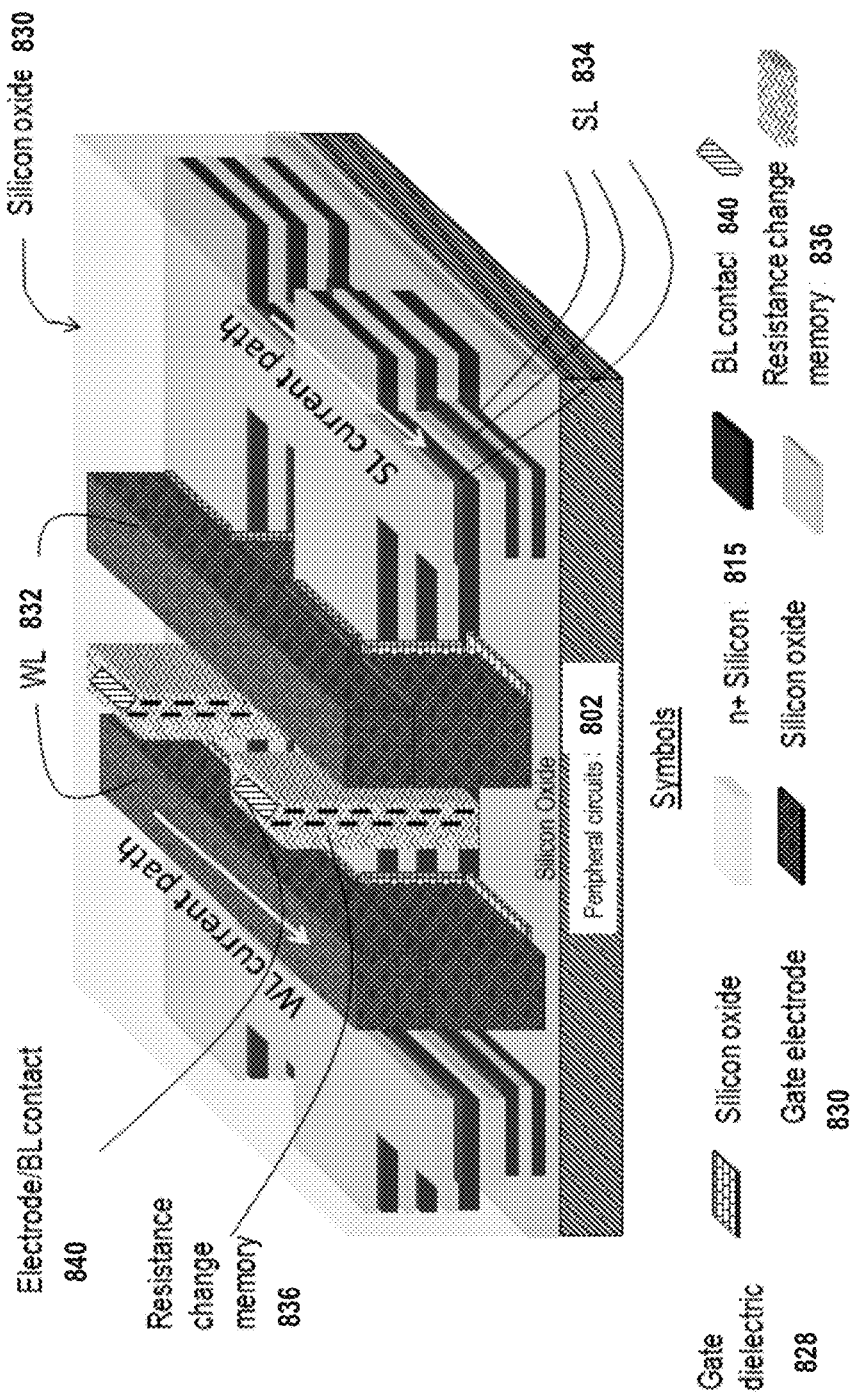

Step (J): FIG. 8J illustrates the structure after Step (J). Vias are etched through multiple layers of silicon and silicon dioxide as shown in the figure. A resistance change memory material 836 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 840. A CMP process is then conducted to planarize the surface. It can be observed that multiple resistance change memory elements in series with transistors are created after this step.

Figure 8K:
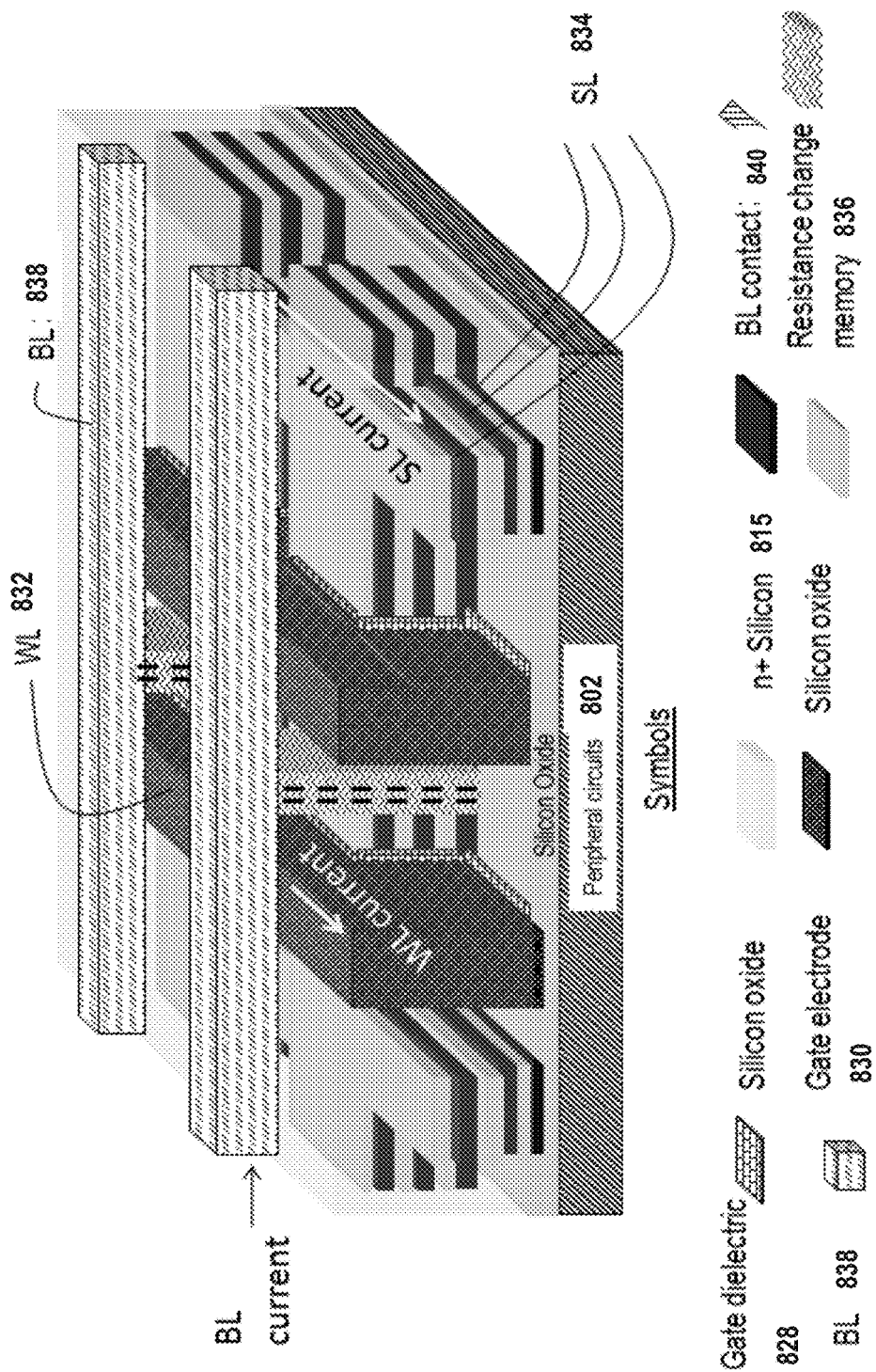

Step (K): FIG. 8K illustrates the structure after Step (K). BLs 836 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (J) as well.

Figure 8L:
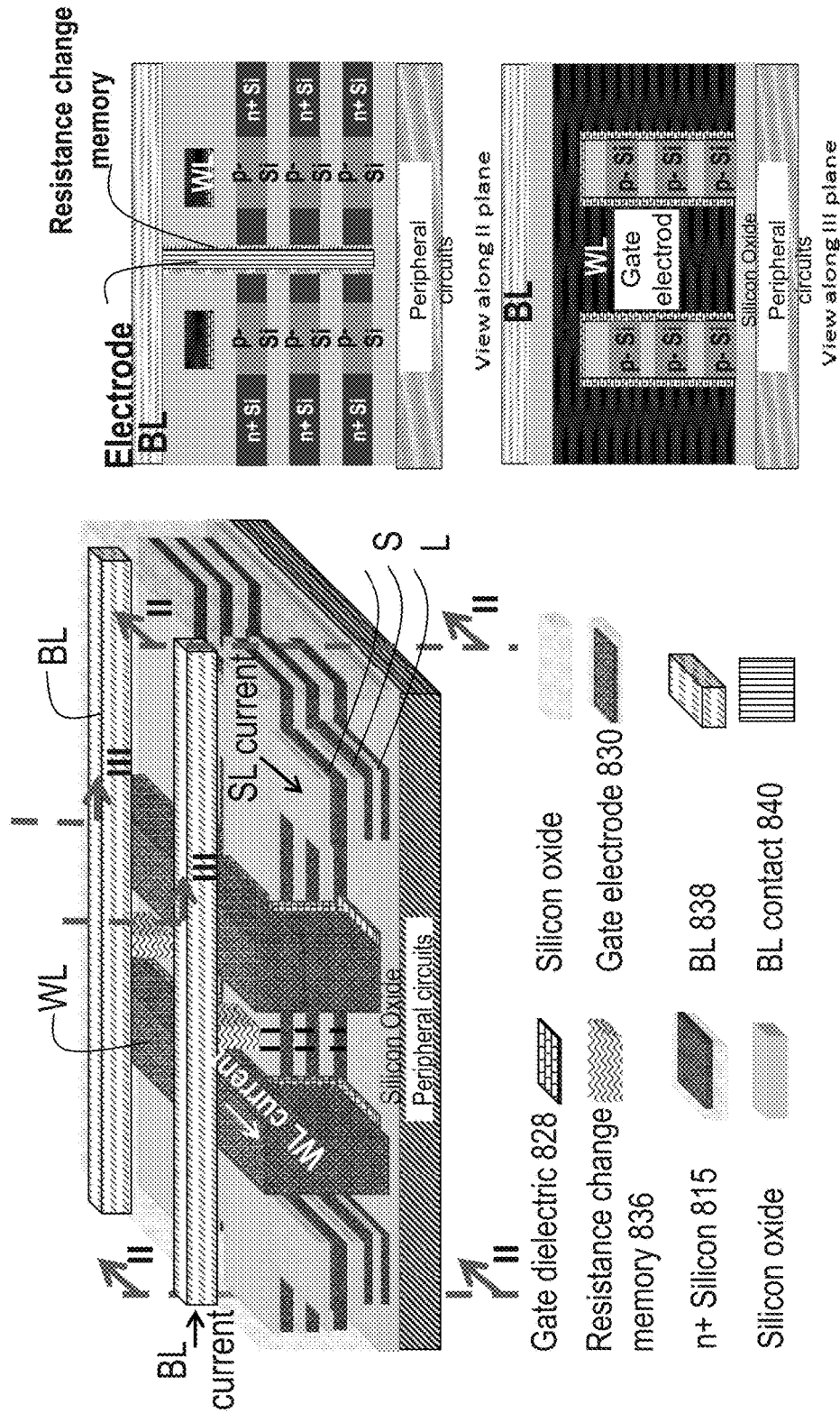

FIG. 8L shows cross-sectional views of the array for clarity.

A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

Another serious problem with designing semiconductor devices as the lithography minimum feature size scales down may be signal re-buffering using repeaters. With the increased resistivity of metal traces in the deep sub-micron regime, signals need to be re-buffered at rapidly decreasing intervals to maintain circuit performance and immunity to circuit noise. This phenomenon has been described at length in "Prashant Saxena et al., Repeater Scaling and Its Impact on CAD, IEEE Transactions On Computer-Aided Design of Integrated Circuits and Systems, Vol. 23, No. 4, April 2004." The current invention offers a new way to minimize the routing impact of such re-buffering. Long distance signals are frequently routed on high metal layers to give them special treatment such as, for example, wire size or isolation from crosstalk. When signals present on high metal layers need re-buffering, an embodiment of the invention may be to use the active layer or strata above to insert repeaters, rather than drop the signal all the way to the diffusion layer of its current layer or strata. This approach may reduce the routing blockages created by the large number of vias formed when signals repeatedly need to move between high metal layers and the diffusion below, and suggests to selectively replace them with fewer vias to the active layer above.

FIG. 17D of incorporated reference U.S. Pat. No. 8,273,610 illustrates an alternative circuit function that may fit well in the "Foundation." In many IC designs it may be desired to integrate a probe auxiliary system that may make it very easy to probe the device in the debugging phase, and to support production testing. Probe circuits have been used in the prior art sharing the same transistor layer as the primary circuit. FIG. 17D illustrates a probe circuit constructed in the Foundation underneath the active circuits in the primary layer. FIG. 17D illustrates that the connections are made to the sequential active circuit elements 17D02. Those connections may be routed to the Foundation through interconnect lines 17D06 where high impedance probe circuits 17D08 may be used to sense the sequential element output. A selector circuit 17D12 may allow one or more of those sequential outputs to be routed out through one or more buffers 17D16 which may be controlled by signals from the Primary circuit to supply the drive of the sequential output signal to the probe output signal 17D14 for debugging or testing. Persons of ordinary skill in the art will appreciate that other configurations are possible like, for example, having multiple groups of probe circuits 17D08, multiple probe output signals 17D14, and controlling buffers 17D16 with signals not originating in the primary circuit.

Persons of ordinary skill in the art will appreciate that when multiple layers of doped or undoped single crystal silicon and an insulator, such as, for example, silicon dioxide, are formed as described above (e.g. additional Si/SiO₂ layers 424 and 426 and first Si/SiO₂ layer 342), that there are many other circuit elements which may be formed, such as, for example, capacitors and inductors, by subsequent processing. Moreover, it will also be appreciated by persons of ordinary skill in the art that the thickness and doping of the single crystal silicon layer wherein the circuit elements, such as, for example, transistors, are formed, may provide a fully depleted device structure, a partially depleted device structure, or a substantially bulk device structure substrate for each layer of a 3D IC or the single layer of a 2D IC.

Figure 10:
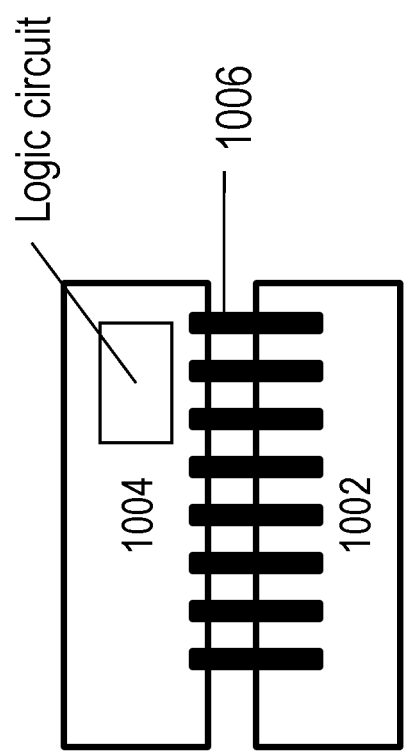
FIG. 10 illustrates 3D stacked peripheral transistors constructed above a memory layer.

FIG. 10 (incorporation of FIG. 64 of parent U.S. Pat. No. 8,581,349 (Ser. No. 13/099,010), of as filed parent) describes an embodiment of this invention, wherein a memory array 1002 may be constructed on a piece of silicon and peripheral transistors 1004 are stacked atop the memory array 1002. The peripheral transistors 1004 may he constructed well-aligned with the underlying memory array 1002 using any of the schemes described in Section 1 and Section 2 (of parent U.S. Pat. No. 8,581,349( Ser. No. 13/099,010)), For example, the peripheral transistors may be junction-less transistors, recessed channel transistors or they could he formed with one of the repeating layout schemes described in Section 2 (of parent U.S. Pat. No. 8,581,349

(Ser. No. 13/099,010)). Through-silicon connections 1006 could connect the memory array 1002 to the peripheral transistors 1004. The memory array may consist of DRAM memory, SRAM memory, flash memory, some type of resistive memory or in general, could be any memory type that is commercially available, Various layer transfer schemes described in Section 1.3.4 (of parent U.S. Pat. No. 8,581,349 (Ser. No. 13/099,010)) can be utilized for constructing single-crystal silicon layers for memory architectures described in Section 3, Section 4, Section 5 and Section 6 (of parent U.S. Pat. No. 8,581,349 (Ser. No. 13/099,010).

FIG. 11A-B (incorporation of FIGS. 41A-41B of parent U.S. Pat. No. 8,581,349 (Ser. No. 13/099,010), [00088-00089] of as filed parent) show it is not the only option for the architecture, as depicted in, for example, FIG. 28-FIG. 40A-H, and FIGS. 70 -71, (of parent U.S. Pat. No. 8,581,349 (Ser. No. 13/099,010) to have the peripheral transistors below the memory layers, Peripheral transistors could also be constructed above the memory layers, as shown in FIG. 11B. This periphery layer would utilize technologies described in Section 1 and Section 2, (of parent U.S. Pat No. 8,581,349 (Ser. No. 13/099,010) and could utilize transistors including, such as, junction-less transistors or recessed channel transistors.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

What is claimed is:

1. A 3D semiconductor device, comprising:
   a first layer comprising first transistors each comprising a single crystal silicon channel;
   a second layer comprising second transistors each comprising a single crystal silicon channel, said second layer overlaying said first transistors,
      wherein at least one of said second transistors is at least partially self-aligned to at least one of said first transistors; and
   a third layer comprising third transistors each comprising a single crystal silicon channel, said third layer overlaying said second transistors,
      wherein a plurality of said third transistors form a logic circuit, and
      wherein said logic circuit is aligned to said second transistors with less than 200 nm alignment error; and
      wherein said first layer thickness is less than one micron.

2. The 3D semiconductor device according to claim 1, wherein said second layer thickness is less than one micron.

3. The 3D semiconductor device according to claim 1, wherein said first layer comprises a floating body memory cell.

4. The 3D semiconductor device according to claim 1, further comprising:
   wherein said first layer comprises independently addressable double-gate transistors.

5. The 3D semiconductor device according to claim 1, a memory array,
   wherein said memory array comprises said first layer and said second layer, and
   wherein said memory array comprises source lines comprising single crystal silicon.

6. The 3D semiconductor device according to claim 1, wherein said 3D semiconductor device comprises an electrically modifiable resistive element.

7. The 3D semiconductor device according to claim 1, wherein at least one of said first transistors are directly connected to at least one of said second transistors.

8. A 3D semiconductor device, comprising:
   a first layer comprising first transistors each comprising a single crystal silicon channel;
   a second layer comprising second transistors each comprising a single crystal silicon channel, said second layer overlaying said first transistors,
      wherein at least one of said second transistors is at least partially self-aligned to at least one of said first transistors; and
   a third layer comprising third transistors each comprising a single crystal silicon channel, said third layer overlaying said second transistors,
      wherein a plurality of said third transistors form a logic circuit, and
      wherein said logic circuit is aligned to said second transistors with less than 200 nm alignment error.

9. The 3D semiconductor device according to claim 8, wherein said second layer thickness is less than one micron.

10. The 3D semiconductor device according to claim 8, wherein said first layer comprises a floating body memory cell.

11. The 3D semiconductor device according to claim 8, further comprising:
   wherein said first layer comprises independently addressable double-gate transistors.

12. The 3D semiconductor device according to claim 8, wherein said first layer thickness is less than one micron.

13. The 3D semiconductor device according to claim 8, wherein said 3D semiconductor device comprises an electrically modifiable resistive element.

14. The 3D semiconductor device according to claim 8, wherein at least one of said first transistors are directly connected to at least one of said second transistors.

15. A 3D semiconductor device, comprising:
   a first layer comprising first transistors each comprising a single crystal silicon channel;
   a second layer comprising second transistors each comprising a single crystal silicon channel, said second layer overlaying said first transistors,
      wherein at least one of said second transistors is at least partially self-aligned to at least one of said first transistors; and
   a third layer comprising third transistors each comprising a single crystal silicon channel, said third structure overlaying said second transistors,
      wherein a plurality of said third transistors form a logic circuit, and
      wherein said logic circuit is aligned to said second transistors with less than 200 nm alignment error; and
   a memory control line, said memory control line is embedded in said second structure and comprises single crystal silicon.

16. The 3D semiconductor device according to claim 15, wherein said second layer thickness is less than one micron.

17. The 3D semiconductor device according to claim 15, wherein said first layer comprises a floating body memory cell.

18. The 3D semiconductor device according to claim 15, further comprising:
   wherein said first layer comprises independently addressable double-gate transistors.

19. The 3D semiconductor device according to claim 15, wherein said 3D semiconductor device comprises an electrically modifiable resistive element.

20. The 3D semiconductor device according to claim 15, wherein at least one of said first transistors are directly connected to at least one of said second transistors.

* * * * *